(12) United States Patent
Shi et al.

(10) Patent No.: US 12,127,455 B2
(45) Date of Patent: Oct. 22, 2024

(54) DISPLAY SUBSTRATE, DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Ling Shi, Beijing (CN); Yipeng Chen, Beijing (CN); Xuewei Tian, Beijing (CN); Ke Liu, Beijing (CN); Dan Guo, Beijing (CN); Zhenhua Zhang, Beijing (CN)

(73) Assignees: Chengdu BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/354,028

(22) Filed: Jul. 18, 2023

(65) Prior Publication Data

US 2023/0363222 A1 Nov. 9, 2023

Related U.S. Application Data

(63) Continuation of application No. 17/612,274, filed as application No. PCT/CN2021/075839 on Feb. 7, 2021, now Pat. No. 11,770,953.

(51) Int. Cl.
*H10K 59/131* (2023.01)
*G09G 3/3241* (2016.01)
(Continued)

(52) U.S. Cl.
CPC ......... *H10K 59/131* (2023.02); *G09G 3/3241* (2013.01); *H10K 59/1216* (2023.02);
(Continued)

(58) Field of Classification Search
None
See application file for complete search history.

(56) References Cited

U.S. PATENT DOCUMENTS 9,419,162 B2 8/2016 Lin
11,626,427 B2 4/2023 Wang et al.
(Continued)

FOREIGN PATENT DOCUMENTS

CN 105336752 A 2/2016
CN 110824797 A 2/2020
(Continued)

OTHER PUBLICATIONS

Extended European search report for European patent application No. 21923884.7, dated Oct. 30, 2023, 11 pages.
(Continued)

*Primary Examiner* — Nicholas J Lee
(74) *Attorney, Agent, or Firm* — Westman, Champlin & Koehler, P.A.

(57) ABSTRACT

A display substrate is provided, including: a base substrate and a plurality of sub-pixels disposed on the base substrate. Each sub-pixel includes a pixel driving circuit, and the pixel driving circuit includes a writing transistor, a compensation transistor, a first reset transistor, and a storage capacitor. The display substrate includes a semiconductor layer, a first conductive layer and a second conductive layer disposed in sequence on the base substrate. Gates of the writing transistor, the compensation transistor and the first reset transistor are in the first conductive layer and are implemented as an integral structure. Active layers of the writing transistor, the compensation transistor and the first reset transistor are in the semiconductor layer. A first storage capacitor electrode of the storage capacitor is in the first conductive
(Continued)

layer, and a second storage capacitor electrode of the storage capacitor is in the second conductive layer.

16 Claims, 35 Drawing Sheets

(51) Int. Cl.
    *H01L 27/12*     (2006.01)
    *H10K 59/121*     (2023.01)
    *H10K 59/122*     (2023.01)
    *H10K 59/35*     (2023.01)
    *H10K 59/65*     (2023.01)

(52) U.S. Cl.
    CPC ........... *H10K 59/122* (2023.02); *H10K 59/65* (2023.02); *G09G 2300/0465* (2013.01); *G09G 2300/0819* (2013.01); *G09G 2300/0842* (2013.01); *G09G 2360/14* (2013.01); *H01L 27/124* (2013.01); *H10K 59/1213* (2023.02); *H10K 59/35* (2023.02)

(56) References Cited

U.S. PATENT DOCUMENTS

| | | | |
|---|---|---|---|
| 2002/0074551 | A1 | 6/2002 | Kimura |
| 2015/0371075 | A1 | 12/2015 | Lin |
| 2016/0141350 | A1* | 5/2016 | Kim ..................... H10K 59/131 257/40 |
| 2016/0155755 | A1 | 6/2016 | Liu et al. |
| 2016/0322595 | A1 | 11/2016 | Choi et al. |
| 2017/0011685 | A1* | 1/2017 | Jeon ..................... H10K 59/126 |
| 2020/0258947 | A1 | 8/2020 | Chung et al. |
| 2020/0312927 | A1* | 10/2020 | Bae ..................... H10K 59/126 |
| 2022/0123025 | A1 | 4/2022 | Wang et al. |
| 2022/0310742 | A1 | 9/2022 | Yi et al. |

FOREIGN PATENT DOCUMENTS

| | | |
|---|---|---|
| CN | 111490069 A | 8/2020 |
| CN | 112259588 A | 1/2021 |
| CN | 112259589 A | 1/2021 |
| CN | 112271205 A | 1/2021 |

OTHER PUBLICATIONS

U.S. Patent Office issued prosecution for U.S. Appl. No. 17/612,274, filed Nov. 18, 2021, including: Notice of Allowance and Fees Due (PTOL-85) issued May 5, 2023, 8 pages; Non-Final Office Action issued Feb. 2, 2023, 14 pages; 22 pages total.

Extended European search report for European patent application No. 21923816.9, dated Aug. 31, 2023, 8 pages.

\* cited by examiner

DISPLAY SUBSTRATE, DISPLAY PANEL AND DISPLAY APPARATUS

CROSS REFERENCE TO RELATED APPLICATION(S)

This application is a continuation application of U.S. patent application Ser. No. 17/612,274, filed Nov. 18, 2021, which in turn is a Section 371 National Stage Application of International Application No. PCT/CN2021/075839, filed on Feb. 7, 2021, entitled "DISPLAY SUBSTRATE, DISPLAY PANEL AND DISPLAY APPARATUS", the contents of which are incorporated herein by reference in their entireties.

TECHNICAL FIELD

The present disclosure relates to a field of display technologies, and in particular to a display substrate, a display panel and a display apparatus.

BACKGROUND

With the increase of users' demands for diversified use of a display apparatus and the emergence of the design requirement for high screen occupation ratio of the display apparatus, an "under-screen camera" solution has emerged. In the "under-screen camera" solution, an imaging module such as a camera is embedded in a display region to reduce a size of a bezel region of the display apparatus, thereby increasing the screen occupation ratio. At present, in the "under-screen camera" solution, on a basis of increasing the screen occupation ratio of the display apparatus, how to ensure both the light transmittance and the display effect at a position corresponding to the imaging module in the display substrate becomes an important topic which the research and development personnel focus on.

The above-mentioned information disclosed in this section is only used to understand the background of the technical concept of the present disclosure, and the above-mentioned information may include information that does not constitute the related art.

SUMMARY

In an aspect, a display substrate is provided. The display substrate includes a first display region and a second display region. The display substrate includes: a base substrate; a plurality of sub-pixels arranged on the base substrate and located in the first display region, wherein the sub-pixel located in the first display region includes a first pixel driving circuit and a first light-emitting device, and the first pixel driving circuit is electrically connected to the first light-emitting device and configured to drive the first light-emitting device to emit light; and a plurality of sub-pixels arranged on the base substrate and located in the second display region, wherein the sub-pixel located in the second display region includes a second pixel driving circuit and a second light-emitting device, and the second pixel driving circuit is electrically connected to the second light-emitting device and configured to drive the second light-emitting device to emit light. A light transmittance of the first display region is greater than a light transmittance of the second display region; and the first pixel driving circuit includes a storage capacitor and a plurality of transistors, and the storage capacitor and the plurality of transistors included in the first pixel driving circuit are located in the first display region.

According to some exemplary embodiments, the display substrate further includes a plurality of transparent conductive wires arranged on the base substrate and located in the first display region. The first display region includes a light-transmitting region between adjacent sub-pixels, and the plurality of transparent conductive wires are located in the light-transmitting region and configured to electrically connect first pixel driving circuits of sub-pixels in a same row among the plurality of sub-pixels in the first display region, and/or, configured to electrically connect first pixel driving circuits of sub-pixels in a same column among the plurality of sub-pixels in the first display region.

According to some exemplary embodiments, an orthographic projection of an occupied region of a first pixel driving circuit of each sub-pixel in the first display region on the base substrate at least partially overlaps with an orthographic projection of a first light-emitting device for the first pixel driving circuit on the base substrate.

According to some exemplary embodiments, an area of an orthographic projection of an occupied region of a first pixel driving circuit of a sub-pixel in the first display region on the base substrate is less than an area of an orthographic projection of an occupied area of a second pixel driving circuit of a sub-pixel of a same color in the second display region on the base substrate.

According to some exemplary embodiments, the plurality of sub-pixels in the first display region include at least a first sub-pixel, a second sub-pixel and a third sub-pixel, and the first sub-pixel, the second sub-pixel and the third sub-pixel have different colors from each other. More than 80% of an area of an orthographic projection of an occupied region of a first pixel driving circuit of the first sub-pixel in the first display region on the base substrate is covered by an orthographic projection of a first light-emitting device driven by the first pixel driving circuit of the first sub-pixel on the base substrate; and/or, more than 90% of an area of an orthographic projection of an occupied region of a first pixel driving circuit of the second sub-pixel in the first display region on the base substrate is covered by an orthographic projection of a first light-emitting device driven by the first pixel driving circuit of the second sub-pixel on the base substrate; and/or, more than 60% of an area of an orthographic projection of an occupied region of a first pixel driving circuit of the third sub-pixel in the first display region on the base substrate is covered by an orthographic projection of a first light-emitting device driven by the first pixel driving circuit of the third sub-pixel on the base substrate.

According to some exemplary embodiments, the display substrate further includes a plurality of signal lines arranged on the base substrate, the plurality of signal lines include at least a scan signal line for transmitting a scan signal, and the scan signal line extends in a first direction. The plurality of transparent conductive wires include a first conductive wire and a second conductive wire. The first conductive wire and the second conductive wire are respectively located on both sides of the scan signal line in the first direction, so as to electrically connect scan signal lines for respective sub-pixels in a same row together.

According to some exemplary embodiments, the display substrate further includes a plurality of signal lines arranged on the base substrate, the plurality of signal lines include at least a reset signal line for transmitting a reset control signal, and the reset signal line extends in a first direction. The plurality of transparent conductive wires further include a third conductive wire and a fourth conductive wire. The third conductive wire and the fourth conductive wire are respectively located on both sides of the reset signal line in the first direction, so as to electrically connect reset signal lines for respective sub-pixels in a same row together.

According to some exemplary embodiments, the display substrate further includes a plurality of signal lines arranged on the base substrate, the plurality of signal lines include at least a light-emitting control line for transmitting a light-emitting control signal, and the light-emitting control line extends in a first direction. The plurality of transparent conductive wires further include a fifth conductive wire and a sixth conductive wire. The fifth conductive wire and the sixth conductive wire are respectively located on both sides of the light-emitting control line in the first direction, so as to electrically connect light-emitting control lines for respective sub-pixels in a same row together.

According to some exemplary embodiments, the display substrate further includes a plurality of signal lines arranged on the base substrate, the plurality of signal lines include at least an initialization voltage line for transmitting an initialization voltage, and the initialization voltage line extends in a first direction. The plurality of transparent conductive wires further include a seventh conductive wire and an eighth conductive wire. The seventh conductive wire and the eighth conductive wire are respectively located on both sides of the initialization voltage line in the first direction, so as to electrically connect initialization voltage lines for respective sub-pixels in a same row together.

According to some exemplary embodiments, the display substrate further includes a plurality of signal lines arranged on the base substrate, and the plurality of signal lines further include: a data signal line for transmitting a data signal and a driving voltage line for transmitting a driving voltage, wherein the data signal line and the driving voltage line extend in a second direction. The display substrate includes a transparent conductive layer arranged on the base substrate, and the transparent conductive layer includes a transparent conductive material. At least one of the data signal line or the driving voltage line is located in the transparent conductive layer.

According to some exemplary embodiments, the display substrate includes at least two transparent conductive layers arranged on the base substrate, and the transparent conductive layer includes a transparent conductive material. At least one of the data signal line or the driving voltage line, and at least one of the plurality of transparent conductive wires are located in one of the at least two transparent conductive layers. And/or at least one of the plurality of transparent conductive wires is located in another transparent conductive layer of the at least two transparent conductive layers.

According to some exemplary embodiments, the display substrate includes: a semiconductor layer arranged on the base substrate; a first conductive layer arranged on a side of the semiconductor layer away from the base substrate; a second conductive layer arranged on a side of the first conductive layer away from the base substrate; a third conductive layer arranged on a side of the second conductive layer away from the base substrate; and a fourth conductive layer arranged on a side of the third conductive layer away from the base substrate. The first pixel driving circuit includes at least one storage capacitor and at least two transistors, wherein the transistors include an active layer, a gate, a source and a drain, and the storage capacitor includes a first storage capacitor electrode and a second storage capacitor electrode. The display substrate further includes a plurality of signal lines arranged on the base substrate, and the plurality of signal lines include a scan signal line for transmitting a scan signal, a reset signal line for transmitting a reset control signal, and a light-emitting control line for transmitting a light-emitting control signal, and an initialization voltage line for transmitting an initialization voltage. The scan signal line, the reset signal line, the light-emitting control line, and the initialization voltage line extend in a first direction. An active layer of each transistor is located in the semiconductor layer, and a gate of each transistor, the first storage capacitor electrode, the scan signal line, the reset signal line, and the light-emitting control line are located in the first conductive layer, and the second storage capacitor electrode and the initialization voltage line are located in the second conductive layer.

According to some exemplary embodiments, the display substrate includes at least one transparent conductive layer arranged on the base substrate, and the transparent conductive layer includes a transparent conductive material. The transparent conductive layer is located between the third conductive layer and the fourth conductive layer.

According to some exemplary embodiments, the plurality of signal lines further include a driving voltage line for transmitting a driving voltage, wherein the driving voltage line extends in a second direction. The driving voltage line is disconnected at the first pixel driving circuit, so that the driving voltage line includes a first driving voltage sub-line and a second driving voltage sub-line, and the first driving voltage sub-line and the second driving voltage sub-line are spaced apart in the second direction. The display substrate further includes a fourth connection portion located in the fourth conductive layer, one end of the fourth connection portion is electrically connected to the first driving voltage sub-line through a via hole, and the other end of the fourth connection portion is electrically connected to the second driving voltage sub-line through a via hole.

According to some exemplary embodiments, the display substrate further includes: a fifth conductive layer arranged on a side of the fourth conductive layer away from the base substrate; and a sixth conductive layer arranged on a side of the fifth conductive layer away from the base substrate. The first light-emitting device includes a first electrode, a second electrode, and a light-emitting material layer sandwiched between the first electrode and the second electrode. The first display region includes a light-transmitting region between adjacent sub-pixels. The first electrode is located in the fifth conductive layer, and the second electrode is located in the sixth conductive layer. The sixth conductive layer includes a plurality of cathode openings, the cathode opening is located between adjacent second electrodes, and an orthographic projection of the cathode opening on the base substrate falls within an orthographic projection of the light-transmitting region on the base substrate.

According to some exemplary embodiments, an orthographic projection of an occupied region of a first pixel driving circuit of each sub-pixel in the first display region on the base substrate has a first size in a first direction and a second size in a second direction, wherein a ratio of the first size to the second size is within a range of 0.8 to 1.2.

According to some exemplary embodiments, the display substrate further includes a light shielding layer arranged at least in the first display region, and the light shielding layer is located between the base substrate and the semiconductor layer. An orthographic projection of the light shielding layer on the base substrate covers an orthographic projection of an occupied region of a first pixel driving circuit of each sub-pixel in the first display region on the base substrate.

According to some exemplary embodiments, the plurality of signal lines further include a reference voltage line for transmitting a reference voltage and a driving voltage line for transmitting a driving voltage, and one of the driving voltage line, the initialization voltage line and the reference voltage line is electrically connected to the light shielding layer.

According to some exemplary embodiments, more than 50% of an area of an orthographic projection of an occupied region of a first pixel driving circuit of each sub-pixel in the first display region on the base substrate is covered by an orthographic projection of a first light-emitting device driven by the first pixel driving circuit on the base substrate.

According to some exemplary embodiments, the first light-emitting device includes a first electrode, a second electrode, and a light-emitting material layer sandwiched between the first electrode and the second electrode, and an orthographic projection of the first light-emitting device on the base substrate includes an orthographic projection of the first electrode on the base substrate.

According to some exemplary embodiments, the first pixel driving circuit includes at least one storage capacitor and at least seven transistors. An orthographic projection of a first electrode of a sub-pixel in the first display region on the base substrate covers an orthographic projection of the at least one storage capacitor of the first pixel driving circuit of the sub-pixel on the base substrate.

According to some exemplary embodiments, the orthographic projection of the first electrode of the sub-pixel located in the first display region on the base substrate covers orthographic projections of at least four transistors of the first pixel driving circuit of the sub-pixel on the base substrate.

According to some exemplary embodiments, the at least seven transistors include a first transistor, wherein the first transistor includes an active layer, a gate, a source, and a drain. The storage capacitor includes a first storage capacitor electrode and a second storage capacitor electrode. The gate of the first transistor is electrically connected to the reset signal line, the source of the first transistor is electrically connected to the initialization voltage line, and the drain of the first transistor is electrically connected to the first storage capacitor electrode. An orthographic projection of a first electrode of the first sub-pixel in the first display region on the base substrate and an orthographic projection of a first transistor of a first pixel driving circuit of the first sub-pixel on the base substrate partially overlap; and/or, an orthographic projection of a first electrode of the second sub-pixel located in the first display region on the base substrate and an orthographic projection of a first transistor of a first pixel driving circuit of the second sub-pixel on the base substrate partially overlap.

According to some exemplary embodiments, the at least seven transistors include a second transistor, wherein the second transistor includes an active layer, a gate, a source, and a drain. The gate of the second transistor is electrically connected to the scan signal line, the drain of the second transistor is electrically connected to the drain of the first transistor. The orthographic projection of the first electrode of the first sub-pixel in the first display region on the base substrate covers an orthographic projection of a second transistor of the first pixel driving circuit of the first sub-pixel on the base substrate; and/or, the orthographic projection of the first electrode of the second sub-pixel in the first display region on the base substrate covers an orthographic projection of a second transistor of the first pixel driving circuit of the second sub-pixel on the base substrate; and/or, an orthographic projection of a first electrode of the third sub-pixel in the first display region on the base substrate covers an orthographic projection of a second transistor of a first pixel driving circuit of the third sub-pixel on the base substrate.

According to some exemplary embodiments, the at least seven transistors include a third transistor, wherein the third transistor includes an active layer, a gate, a source, and a drain. The gate of the third transistor is shared with the first storage capacitor electrode, and the drain of the third transistor is electrically connected to the source of the second transistor. The orthographic projection of the first electrode of the first sub-pixel in the first display region on the base substrate covers an orthographic projection of a third transistor of the first pixel driving circuit of the first sub-pixel on the base substrate; and/or, the orthographic projection of the first electrode of the second sub-pixel in the first display region on the base substrate covers an orthographic projection of a third transistor of the first pixel driving circuit of the second sub-pixel on the base substrate; and/or, the orthographic projection of the first electrode of the third sub-pixel in the first display region on the base substrate covers an orthographic projection of a third transistor of the first pixel driving circuit of the third sub-pixel on the base substrate.

According to some exemplary embodiments, the at least seven transistors include a fourth transistor, wherein the fourth transistor includes an active layer, a gate, a source, and a drain. The gate of the fourth transistor is electrically connected to the scan signal line, the source of the fourth transistor is electrically connected to the data signal line, and the drain of the fourth transistor is electrically connected to the source of the third transistor. The orthographic projection of the first electrode of the first sub-pixel in the first display region on the base substrate covers an orthographic projection of a fourth transistor of the first pixel driving circuit of the first sub-pixel on the base substrate; and/or, the orthographic projection of the first electrode of the second sub-pixel in the first display region on the base substrate covers an orthographic projection of a fourth transistor of the first pixel driving circuit of the second sub-pixel on the base substrate; and/or, the orthographic projection of the first electrode of the third sub-pixel in the first display region on the base substrate covers an orthographic projection of a fourth transistor of the first pixel driving circuit of the third sub-pixel on the base substrate.

According to some exemplary embodiments, the at least seven transistors include a fifth transistor, wherein the fifth transistor includes an active layer, a gate, a source, and a drain. The gate of the fifth transistor is electrically connected to the light-emitting control line, the source of the fifth transistor is electrically connected to the driving voltage line, and the drain of the fifth transistor is electrically connected to the source of the third transistor. The orthographic projection of the first electrode of the first sub-pixel in the first display region on the base substrate partially overlaps with an orthographic projection of a fifth transistor of the first pixel driving circuit of the first sub-pixel on the base substrate; and/or, the orthographic projection of the first electrode of the second sub-pixel in the first display region on the base substrate covers an orthographic projection of a fifth transistor of the first pixel driving circuit of the second sub-pixel on the base substrate.

According to some exemplary embodiments, the at least seven transistors include a sixth transistor, wherein the sixth transistor includes an active layer, a gate, a source, and a drain. The gate of the sixth transistor is electrically connected to the light-emitting control line, and the source of the sixth transistor is electrically connected to the drain of the third transistor, and the drain of the sixth transistor is electrically connected to the first electrode. The orthographic projection of the first electrode of the first sub-pixel in the first display region on the base substrate covers an orthographic projection of a sixth transistor of the first pixel driving circuit of the first sub-pixel on the base substrate; and/or, the orthographic projection of the first electrode of the second sub-pixel in the first display region on the base substrate covers an orthographic projection of a sixth transistor of the first pixel driving circuit of the second sub-pixel on the base substrate; and/or, the orthographic projection of the first electrode of the third sub-pixel in the first display region on the base substrate covers an orthographic projection of a sixth transistor of the first pixel driving circuit of the third sub-pixel on the base substrate.

According to some exemplary embodiments, the at least seven transistors include a seventh transistor, wherein the seventh transistor includes an active layer, a gate, a source, and a drain. The gate of the seventh transistor is electrically connected to the scan signal line, the source of the seventh transistor is electrically connected to the first electrode, and the drain of the seventh transistor is electrically connected to the initialization voltage line. The orthographic projection of the first electrode of the first sub-pixel in the first display region on the base substrate covers an orthographic projection of a seventh transistor of the first pixel driving circuit of the first sub-pixel on the base substrate; and/or, the orthographic projection of the first electrode of the second sub-pixel in the first display region on the base substrate covers an orthographic projection of a seventh transistor of the first pixel driving circuit of the second sub-pixel on the base substrate; and/or, the orthographic projection of the first electrode of the third sub-pixel in the first display region on the base substrate at least partially overlaps with an orthographic projection of a seventh transistor of the first pixel driving circuit of the third sub-pixel on the base substrate.

According to some exemplary embodiments, one end of the scan signal line is electrically connected to the first conductive wire through a first via hole, and the other end of the scan signal line is electrically connected to the second conductive wire through a second via hole; one end of the reset signal line is electrically connected to the third conductive wire through a third via hole, and the other end of the reset signal line is electrically connected to the fourth conductive wire through a fourth via hole; one end of the light-emitting control line is electrically connected to the fifth conductive wire through a fifth via hole, and the other end of the light-emitting control line is electrically connected to the sixth conductive wire through a sixth via hole; one end of the initialization voltage line is electrically connected to the seventh conductive wire through a seventh via hole, and the other end of the initialization voltage line is electrically connected to the eighth conductive wire through an eighth via hole.

According to some exemplary embodiments, one end of the fourth connection portion is electrically connected to the source of the fifth transistor through a ninth via hole, and the first electrode is electrically connected to the sixth transistor through a tenth via hole. Centers of every two adjacent via holes in the first via hole, the second via hole, the third via hole, the fourth via hole, the fifth via hole, the sixth via hole, the seventh via hole, the eighth via hole, the ninth via hole, and the tenth via hole are sequentially connected to enclose and form a region, wherein the region is an occupied region of a first pixel driving circuit of each sub-pixel in the first display region.

According to some exemplary embodiments, an orthographic projection of the second storage capacitor electrode on the base substrate is in an "L" shape.

In another aspect, a display panel including the display substrate as described above is provided.

In yet another aspect, a display apparatus including the display substrate or the display panel as described above is provided.

According to some exemplary embodiments, the display apparatus further includes at least one image sensor. An orthographic projection of the at least one image sensor on the base substrate falls within an orthographic projection of the first display region on the base substrate.

BRIEF DESCRIPTION OF THE DRAWINGS

By describing exemplary embodiments of the present disclosure in detail with reference to the accompanying drawings, the features and advantages of the present disclosure will become more apparent.

DETAILED DESCRIPTION OF EMBODIMENTS

Figure 1:
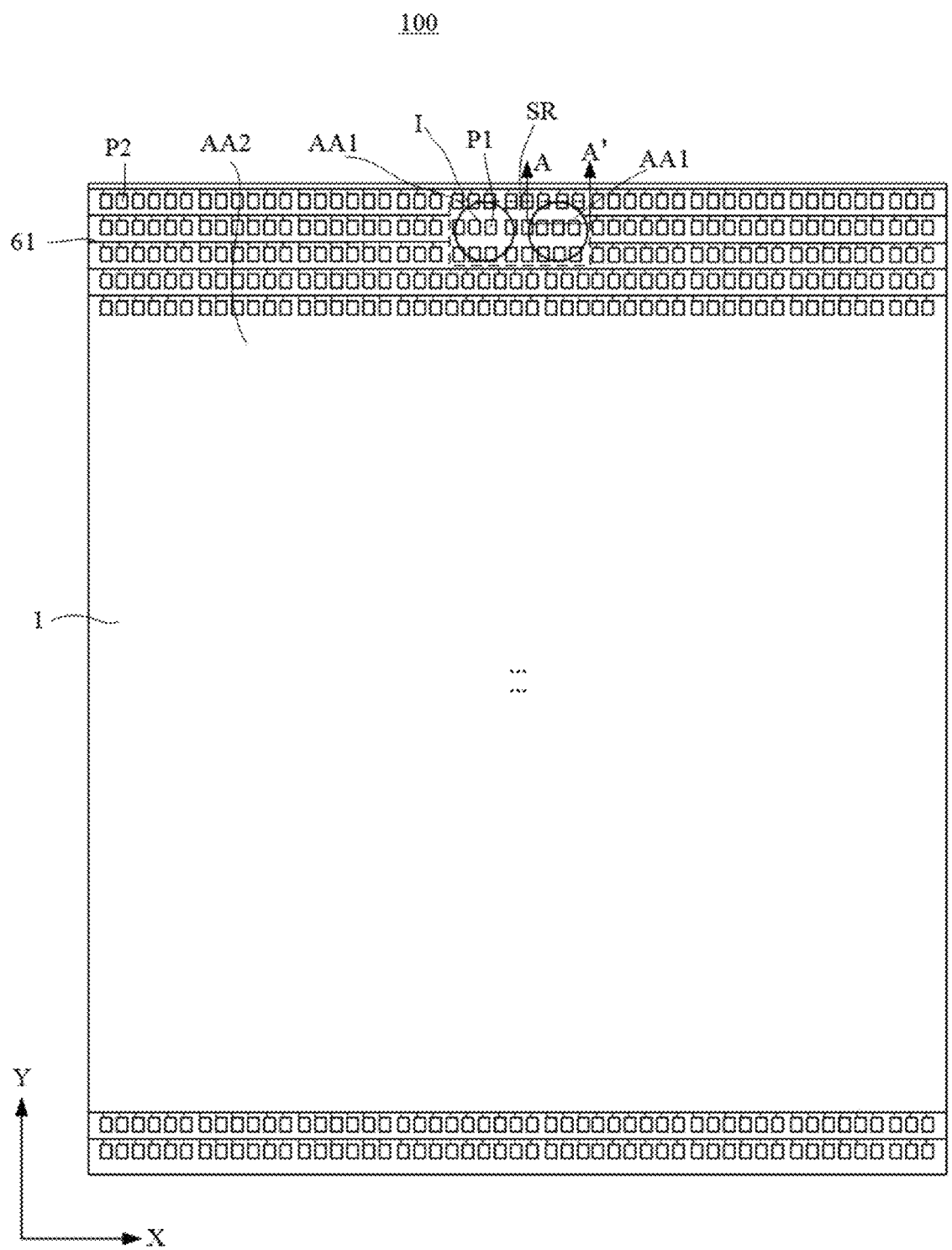
FIG. 1 shows a schematic plan view of a display apparatus according to some exemplary embodiments of the present disclosure, and schematically shows a planar structure of a display substrate included in the display apparatus.

In order to make the objectives, technical solutions, and advantages of the embodiments of the present disclosure more clear, the technical solutions of the embodiments of the present disclosure will be described clearly and completely below with reference to the drawings. The embodiments described hereinafter make up a subset of the embodiments of the present disclosure, but not all of the embodiments. All other embodiments obtained by those of ordinary skilled in the art based on the described embodiments of the present disclosure without carrying out any inventive effort shall fall within the protection scope of the present disclosure.

It should be noted that, in the drawings, for clarity and/or description purposes, a size and relative size of an element may be enlarged. As such, a size and relative size of each element need not be limited to those shown in the drawings. In the specification and drawings, a same or similar reference sign indicates a same or similar component.

When an element is described as being "on", "connected to" or "coupled to" another element, the element may be directly on the another element, directly connected to the another element or directly coupled to the another element, or there may be an intermediate element. However, when an element is described as being "directly on", "directly connected to" or "directly coupled to" another element, there is no intermediate element. Other terms and/or expressions used to describe the relationship between elements should be interpreted in a similar manner, for example, "between" and "directly between", "adjacent" and "directly adjacent", or "on" and "directly on", etc. In addition, the term "connected" may refer to a physical connection, an electrical connection, a communication connection, and/or a fluid connection. In addition, the X axis, the Y axis, and the Z axis are not limited to the three axes of the Cartesian coordinates, and may be interpreted in a broader meaning. For example, the X axis, the Y axis, and the Z axis may be perpendicular to each other, or may represent different directions that are not perpendicular to each other. For the purpose of the present disclosure, "at least one of X, Y, or Z" and "at least one selected from a group consisting of X, Y, or Z" may be interpreted as only X, only Y, only Z, or any combination of two or more of X, Y, or Z such as XYZ, XYY, YZ, and ZZ. The term "and/or" as used in the present disclosure includes any or all combinations of one or more related listed items.

It should be noted that although terms "first", "second" and the like may be used to describe various components, members, elements, regions, layers and/or portions here, however, these components, members, elements, regions, layers and/or portions should not be limited by these terms. These terms are used to distinguish one component, member, element, region, layer and/or portion from another component, member, element, region, layer and/or portion. Thus, for example, without departing from the teachings of the present disclosure, a first component, member, element, region, layer and/or portion may be named as a second component, member, element, region, layer and/or portion.

For ease of description, spatial relationship terms, for example, "upper", "lower", "left", "right", etc. may be used here to describe a relationship between one element or feature and another element or feature as shown in a figure. It should be understood that, in addition to an orientation shown in the figure, the spatial relationship terms are intended to cover other different orientations of an apparatus in use or in operation. For example, if the apparatus in the figure is turned upside down, an element described as "below" or "under" another element or feature will be oriented "above" or "on" the another element or feature.

In the present disclosure, terms "about", "approximately", "substantially" and other similar terms are used as approximate terms rather than as terms of degree, and they are intended to explain an inherent deviation of a measured or calculated value that will be recognized by those of ordinary skilled in the art. Taking into account factors such as a process fluctuation, a measurement problem, and an error related to a measurement of a specific quantity (i.e., a limitation of a measurement system), "about" or "approximately" as used here includes the stated value and means that, for those of ordinary skilled in the art, the determined specific value is within an acceptable deviation range. For example, "about" can mean within one or more standard deviations, or within ±30%, ±20%, ±10% and ±5% of the stated value.

It should be noted that, in the present disclosure, the expression "a same layer" refers to a layer structure formed by using a same film forming process to form a film layer used for forming a specific pattern, and then using a same mask to pattern the film layer through a patterning process. According to different specific patterns, a patterning process may include multiple exposure, development, or etching processes, and the specific pattern formed in the layer structure may be continuous or discontinuous. The multiple elements, components, structures and/or portions located in "a same layer" are made of a same material, and are formed by a same patterning process. Generally, the multiple elements, components, structures and/or portions located in "a same layer" have approximately a same thickness.

Those skilled in the art should understand that, unless otherwise specified, the expressions "continuously extending", "integrated structure", "overall structure" or the like herein indicate that multiple elements, components, structures and/or portions are located in a same layer, and are generally formed by a same patterning process during a manufacturing process. There are no gaps or breaks between these elements, components, structures and/or portions, but a continuously extending structure.

In the present disclosure, the expression "repeating unit" refers to a combination of multiple sub-pixels, for example, a combination of multiple sub-pixels used to display one pixel point, and multiple "repeating units" are arranged repeatedly in an array on a base substrate. For example, a repeating unit may include at least one pixel, for example, two, three, four, or more sub-pixels. In addition, for ease of description, a repeating unit located in a first display region is referred to as a first repeating unit, and a repeating unit located in a second display region is referred to as a second repeating unit.

As used herein, the expression "pixel density" refers to a number of repeating units or sub-pixels per unit area. For example, PPI may be used to represent the pixel density, and the meaning of PPI is a number of pixels per unit area. Similarly, the expression "distribution density" refers to a number of components (for example, repeating units, sub-pixels, spacers, etc.) per unit area.

Figure 2:
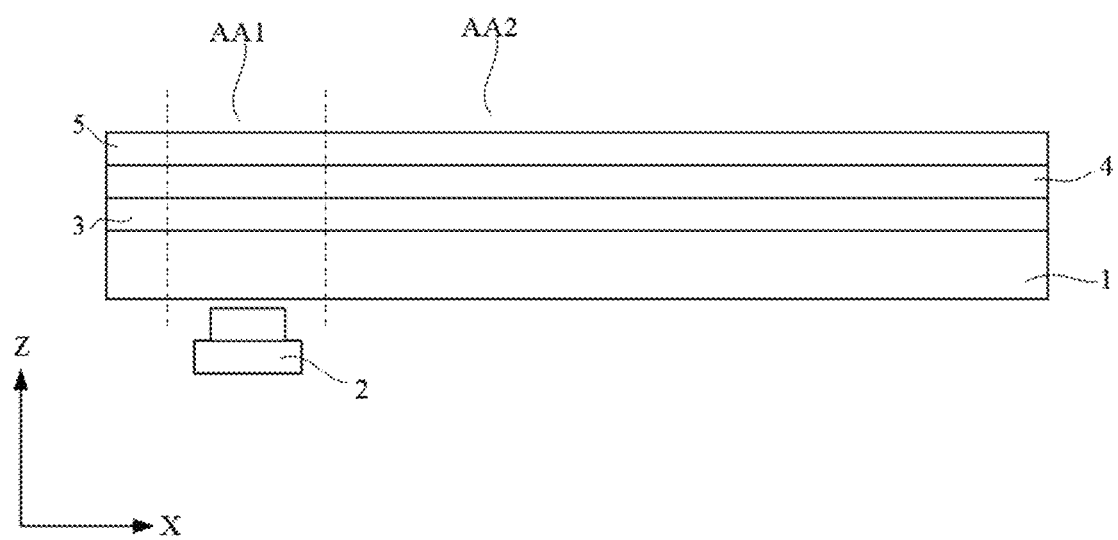
FIG. 2 shows a schematic cross-sectional view of a display apparatus taken along a line AA' in FIG. 1, according to some exemplary embodiments of the present disclosure.

FIG. 1 shows a schematic plan view of a display apparatus according to some exemplary embodiments of the present disclosure, and schematically shows a planar structure of a display substrate included in the display apparatus. FIG. 2 shows a schematic cross-sectional view of a display apparatus taken along a line AN in FIG. 1, according to some exemplary embodiments of the present disclosure.

For example, the display apparatus includes a display substrate. The display substrate may be an electroluminescent display substrate, such as an OLED display substrate. The display substrate may also be a quantum dot display substrate, such as a QDLED display substrate.

As shown in FIG. 1, the display apparatus according to the embodiments of the present disclosure includes a display substrate 100. The display substrate 100 includes a display region, and the display region may include, for example, a first display region AA1 and a second display region AA2. For example, the second display region AA2 at least partially surrounds (for example, completely surrounds) the first display region AA1.

As shown in FIG. 2, the display substrate 100 may include a base substrate 1. In the first display region AA1, a sensor 2 may be arranged on a back surface (shown as a lower side in FIG. 2, for example, a side opposite to a light exit direction during display) of the base substrate 1, and the first display region AA1 may meet an imaging requirement of the sensor 2 for light transmittance.

For example, a light transmittance of the first display region AA1 is greater than a light transmittance of the second display region AA2. The sensor 2 is, for example, an image sensor or an infrared sensor. The sensor 2 is used to receive light from a display side (shown as an upper side in FIG. 2, for example, in the light exit direction during display or a direction where the human eye is during display) of the display substrate 100, so that operations such as image capturing, distance sensing, and light intensity sensing may be performed. The light, for example, pass through the first display region AA1 and then illuminate the sensor, so as to be sensed by the sensor.

It should be noted that, in an illustrated exemplary embodiment, the second display region AA2 completely surrounds the first display region AA1, however, the embodiments of the present disclosure are not limited thereto. For example, in other embodiments, the first display region AA1 may be located at an upper edge of the display substrate. For example, three sides of the first display region AA1 are surrounded by the second display region AA2, and an upper side of the first display region AA1 is flush with an upper side of the display substrate. For another example, the first display region AA1 may be located at the upper edge of the display substrate and arranged along an entire width of the display substrate.

For example, a shape of the first display region AA1 may be a circle, an oval, a polygon, or a rectangle, and a shape of the second display region AA2 may be a circle, a ring, an oval, or a rectangle, but the embodiments of the present disclosure are not limited thereto. For another example, both the shape of the first display region AA1 and the shape of the second display region AA2 may be a rectangle, a rounded rectangle or other appropriate shapes.

The OLED display technology may be applied in the display substrate shown in FIGS. 1 to 2. Due to advantages of wide viewing angle, high contrast, fast response, low power consumption, foldability, flexibility, etc., OLED display substrates are more and more widely used in display products. With the development and in-depth application of the OLED display technology, the demand for displays with high screen occupation ratio is becoming stronger. In the display substrate shown in FIGS. 1 to 2, QDLED (Quantum dot light-emitting diode) technology can also be used. In the display substrate shown in FIGS. 1 and 2, an under-screen camera solution is applied. In this way, a notch region may be avoided, no holes need to be punched in the display screen, and the screen occupation ratio may be increased, which makes the visual experience better.

For example, the display substrate may include a base substrate 1 and various film layers arranged on the base substrate 1. For example, the display substrate may further include a driving circuit layer, a light-emitting device layer, and an encapsulation layer arranged on the base substrate 1. For example, the driving circuit layer 3, the light-emitting device layer 4, and the encapsulation layer 5 are schematically shown in FIG. 2. The driving circuit layer 3 includes a driving circuit structure, and the light-emitting device layer 4 includes a light-emitting device such as OLED. The driving circuit structure controls a light-emitting device of each sub-pixel to emit light, so as to realize a display function. The driving circuit structure includes a thin film transistor, a storage capacitor, and various signal lines. The various signal lines include a gate line, a data line, a VDD voltage line, a VSS voltage line, etc., so as to provide various signals such as a control signal, a data signal, and a power supply voltage signal for a pixel driving circuit in each sub-pixel.

For example, the first display region AA1 may correspond to an under-screen camera, that is, the first display region AA1 may be an under-screen imaging region. In the embodiments of the present disclosure, that the display substrate 100 includes two first display regions AA1 is taken as an example for description. Each first display region AA1 may has a circular shape, a substantially circular shape, an oval shape, a polygonal shape, or the like. Two first display regions AA1 are spaced apart, and a spacing region SR is provided between the two first display regions AA1.

For example, with reference to FIGS. 1 and 2, in the illustrated embodiments, two sensors 2 may be arranged to correspond to two sub-display regions respectively, so as to form a display apparatus with a dual-camera structure. However, the embodiments of the present disclosure are not limited thereto, and in other embodiments, fewer (for example, one) or more sub-display regions and sensors 2 may be arranged. In addition, a shape of the sub-display region may also be determined according to a shape of a hardware structure to be installed. For example, orthographic projections of respective sub-display regions on the base substrate may have one or more of following shapes: a circle, an oval, a rectangle, a rounded rectangle, a square, a rhombus, a trapezoid, a polygon, etc., and various combinations thereof.

In the embodiments of the present disclosure, a display region with a higher light transmittance than that of a normal display region is arranged in the display substrate, and a hardware structure such as a camera is installed in the display region. In this way, functions such as under-screen imaging may be realized, which may increase a screen occupation ratio and achieve a full-screen effect.

In the related art, a manner of reducing a pixel density of the first display region is generally used to cause a light transmittance of the display region provided with the sensor 2 (that is, the first display region AA1) to be greater than a light transmittance of a normal display region (that is, the second display region AA2), that is, cause PPI of the first display region to be less than PPI of the second display region, for example, the PPI of the first display region is generally set to be less than half of the PPI of the second display region. However, the manner of reducing PPI will reduce a display quality of the first display region. Different from the normal display region, a picture displayed in the first display region will be visually grainy. In addition, in the related art, a pixel driving circuit of a pixel in the first display region is generally arranged outside an under-screen imaging region. For example, a pixel driving circuit is arranged in the above-mentioned spacing region SR. In this case, there will be a black border in a display region between the two sensors 2 during display, which will adversely affect the overall display quality. In addition, when a pixel driving circuit is arranged outside the under-screen imaging region, the pixel driving circuit arranged outside must be electrically connected to a light-emitting element (such as OLED) of each pixel arranged in the under-screen imaging region via a conductive wire. Due to limitations of a distance between pixels, a width of a conductive wire, and a distance between conductive wires, the realization of high PPI of the under-screen imaging region will be limited, that is, the under-screen imaging region with high PPI cannot be realized.

The embodiments of the present disclosure provide at least a display substrate, a display panel, and a display apparatus. The display substrate includes a first display region and a second display region, and a light transmittance of the first display region is greater than a light transmittance of the second display region. The display substrate includes: a base substrate, and a plurality of sub-pixels arranged on the base substrate and located in the first display region, where the sub-pixel includes a first pixel driving circuit and a first light-emitting device, and the first pixel driving circuit is electrically connected to the first light-emitting device and used to drive the first light-emitting device to emit light. The first pixel driving circuit includes a storage capacitor and a plurality of transistors, and the storage capacitor and the plurality of transistors included in the first pixel driving circuit are located in the first display region. In the embodiments of the present disclosure, in the under-screen imaging region, a pixel driving circuit of each sub-pixel may be built into a corresponding sub-pixel, without being arranged outside the under-screen imaging region, which may avoid the above-mentioned various problems caused by arranging the external pixel driving circuit, so that a higher PPI of the under-screen imaging region may be realized, while ensuring that the light transmittance of the under-screen imaging region meets the requirements.

Figure 3:
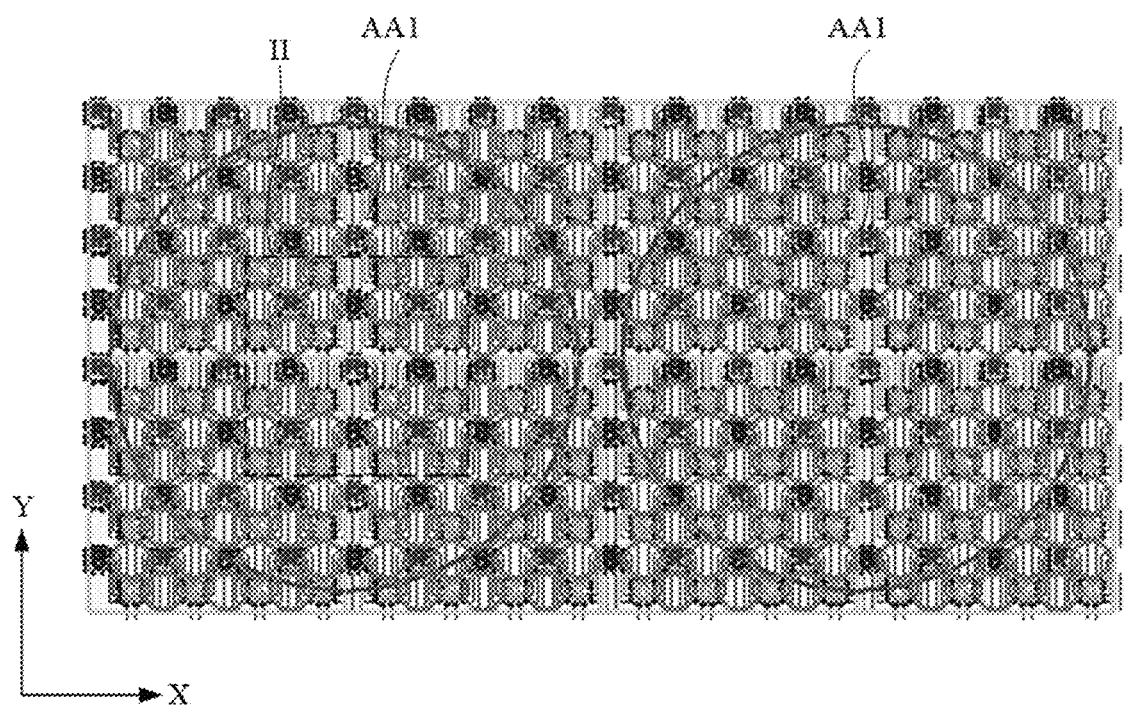
FIG. 3 shows a partial enlarged view of a display substrate at part I in FIG. 1, according to some exemplary embodiments of the present disclosure.
Figure 4:
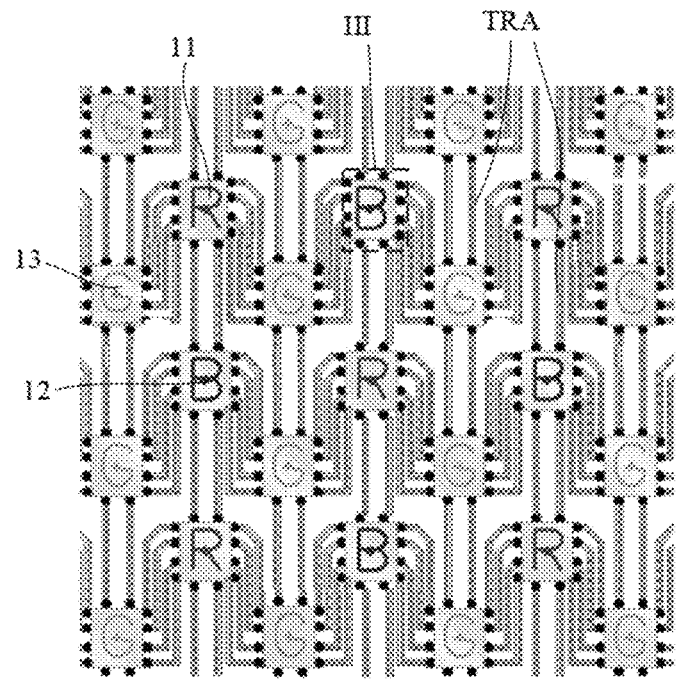
FIG. 4 shows a partial enlarged view of a display substrate at part II in FIG. 3, according to some exemplary embodiments of the present disclosure.
Figure 5:
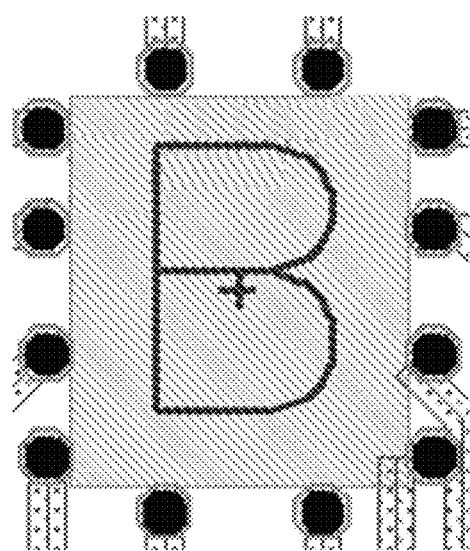
FIG. 5 shows a partial enlarged view of a display substrate at part III in FIG. 4, according to some exemplary embodiments of the present disclosure.

FIG. 3 shows a partial enlarged view of a display substrate at part I in FIG. 1, according to some exemplary embodiments of the present disclosure. FIG. 4 shows a partial enlarged view of a display substrate at part II in FIG. 3, according to some exemplary embodiments of the present disclosure. FIG. 5 shows a partial enlarged view of a display substrate at part III in FIG. 4, according to some exemplary embodiments of the present disclosure.

With reference to FIGS. 1 to 5, the display substrate may include the first display region AA1 and the second display region AA2, a light transmittance of the first display region AA1 is greater than a light transmittance of the second display region AA2. The first display region AA1 may correspond to the sensor 2, that is, an orthographic projection of the sensor 2 on the base substrate 1 falls within an orthographic projection of the first display region AA1 on the base substrate 1.

Figure 6A:
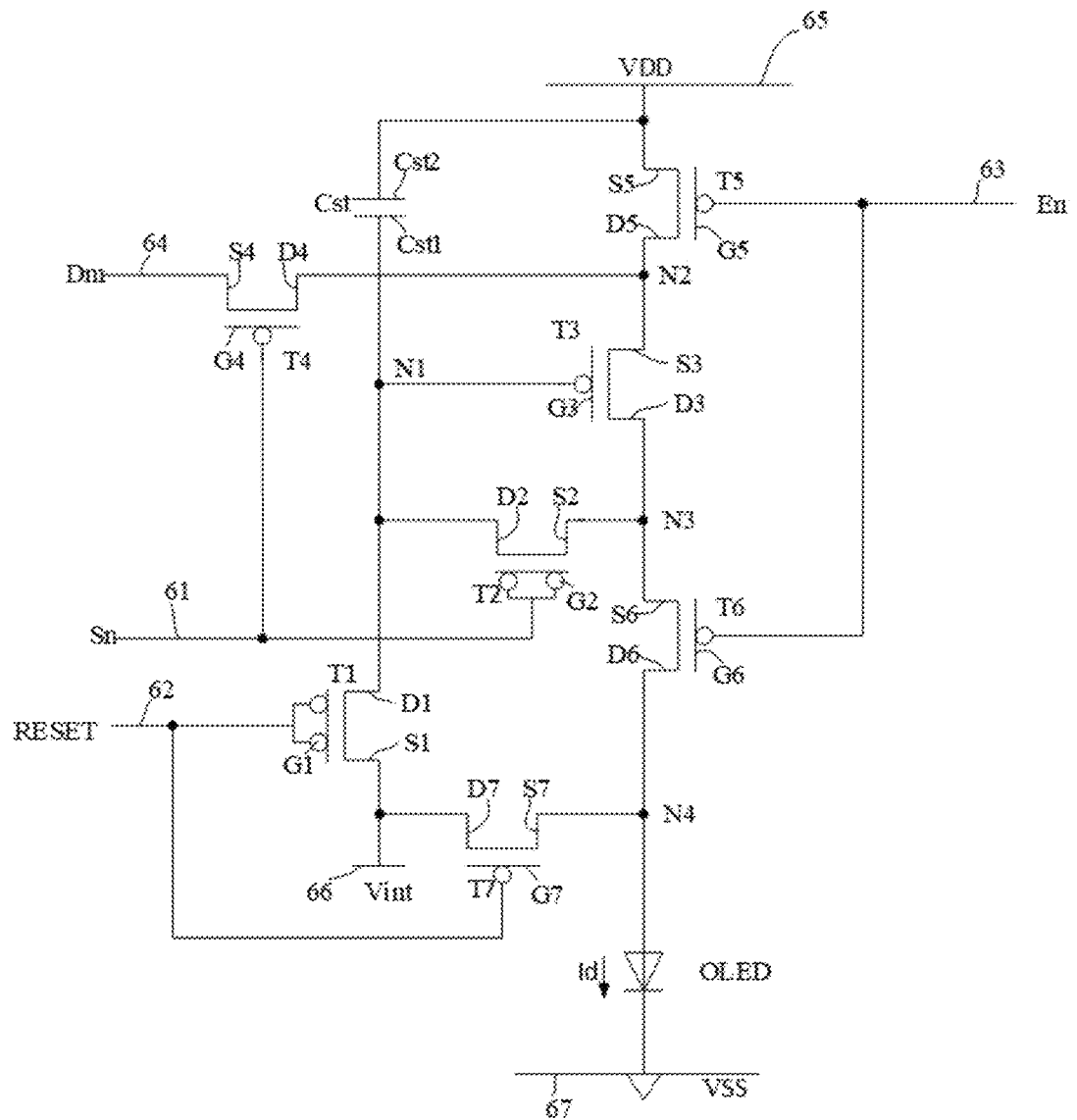
FIG. 6A shows an equivalent circuit diagram of a pixel driving circuit of a display substrate according to some exemplary embodiments of the present disclosure.

FIG. 6A shows an equivalent circuit diagram of a pixel driving circuit of a display substrate, according to some exemplary embodiments of the present disclosure. It should be noted that, in the embodiments of the present disclosure, an equivalent circuit diagram of a pixel driving circuit of a sub-pixel located in the first display region AA1 and an equivalent circuit diagram of a pixel driving circuit of a sub-pixel located in the second display region AA2 may be substantially the same, that is, the equivalent circuit diagram shown in FIG. 6A may be an equivalent circuit diagram of a pixel driving circuit of a sub-pixel in the first display region AA1 or the second display region AA2. However, the embodiments of the present disclosure are not limited thereto. In the embodiments of the present disclosure, the equivalent circuit diagram of the pixel driving circuit of the sub-pixel located in the first display region AA1 may be different from the equivalent circuit diagram of the pixel driving circuit of the sub-pixel located in the second display region AA2.

Figure 7:
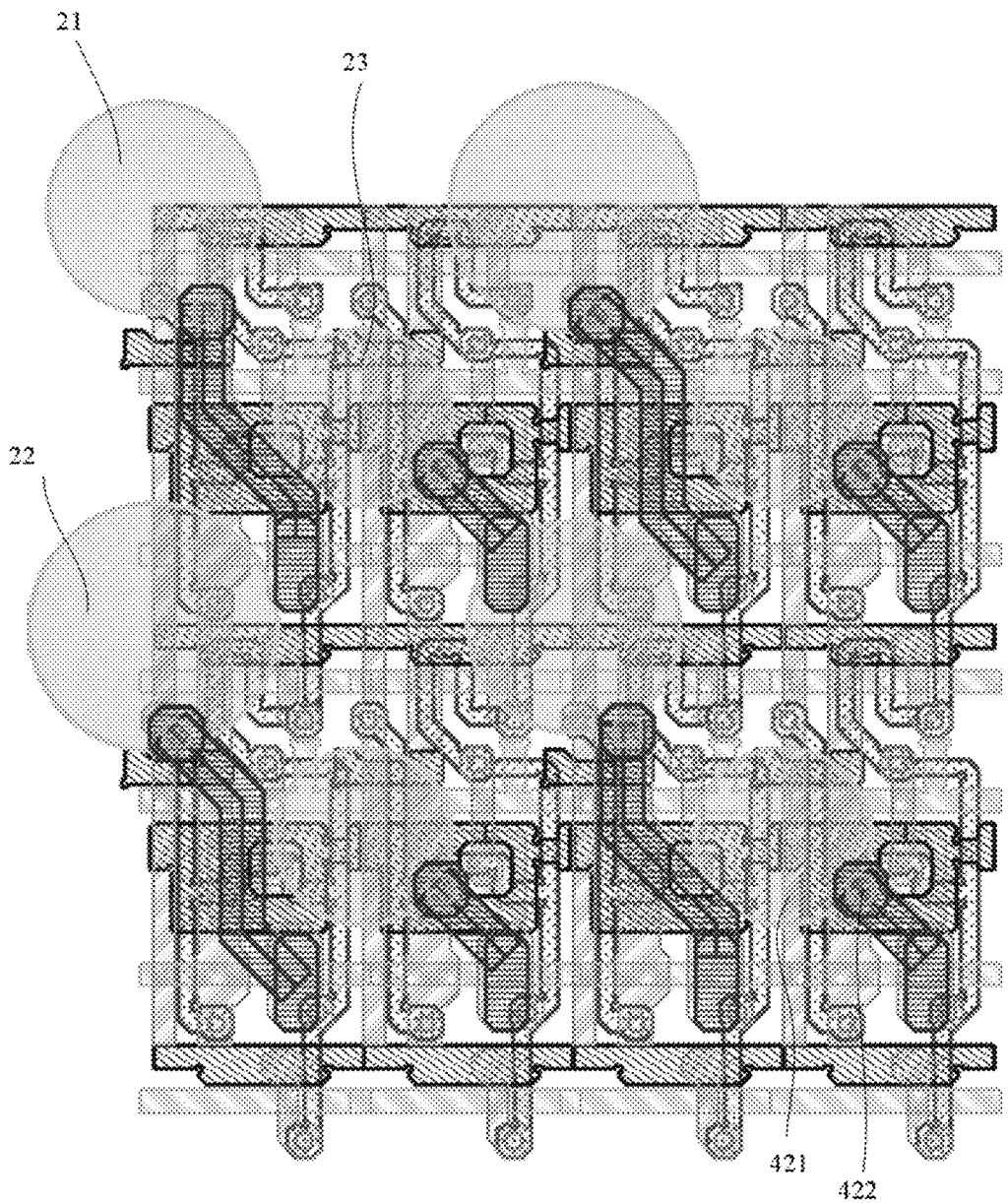
FIG. 7 shows a plan view of an exemplary embodiment of a sub-pixel, in a second display region, of a display substrate according to some exemplary embodiments of the present disclosure, and schematically shows a plan view of a repeating unit in the second display region.
Figure 8:
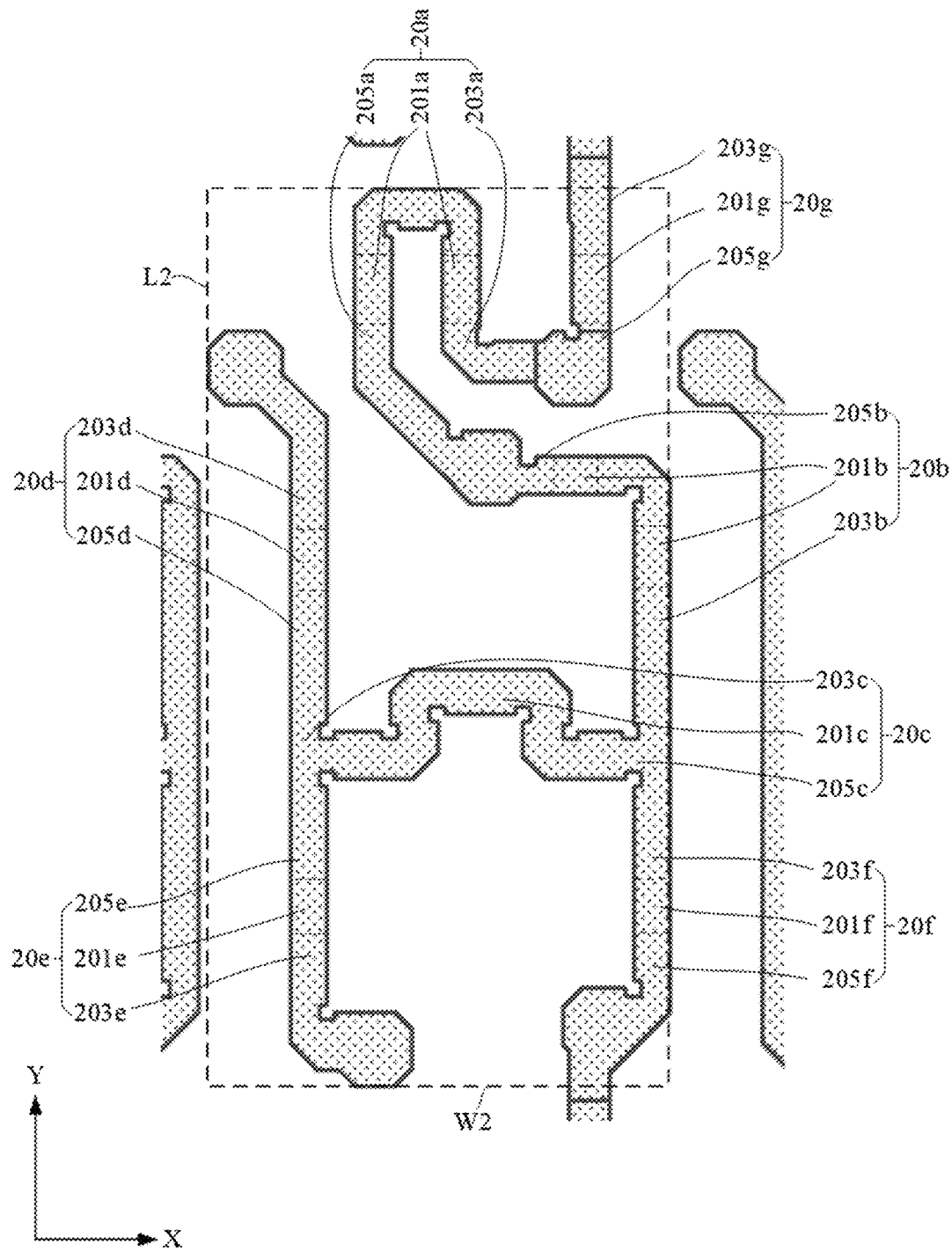
FIG. 8 shows a plan view of a semiconductor layer of an exemplary embodiment of a sub-pixel included in a repeating unit in FIG. 7.
Figure 9:
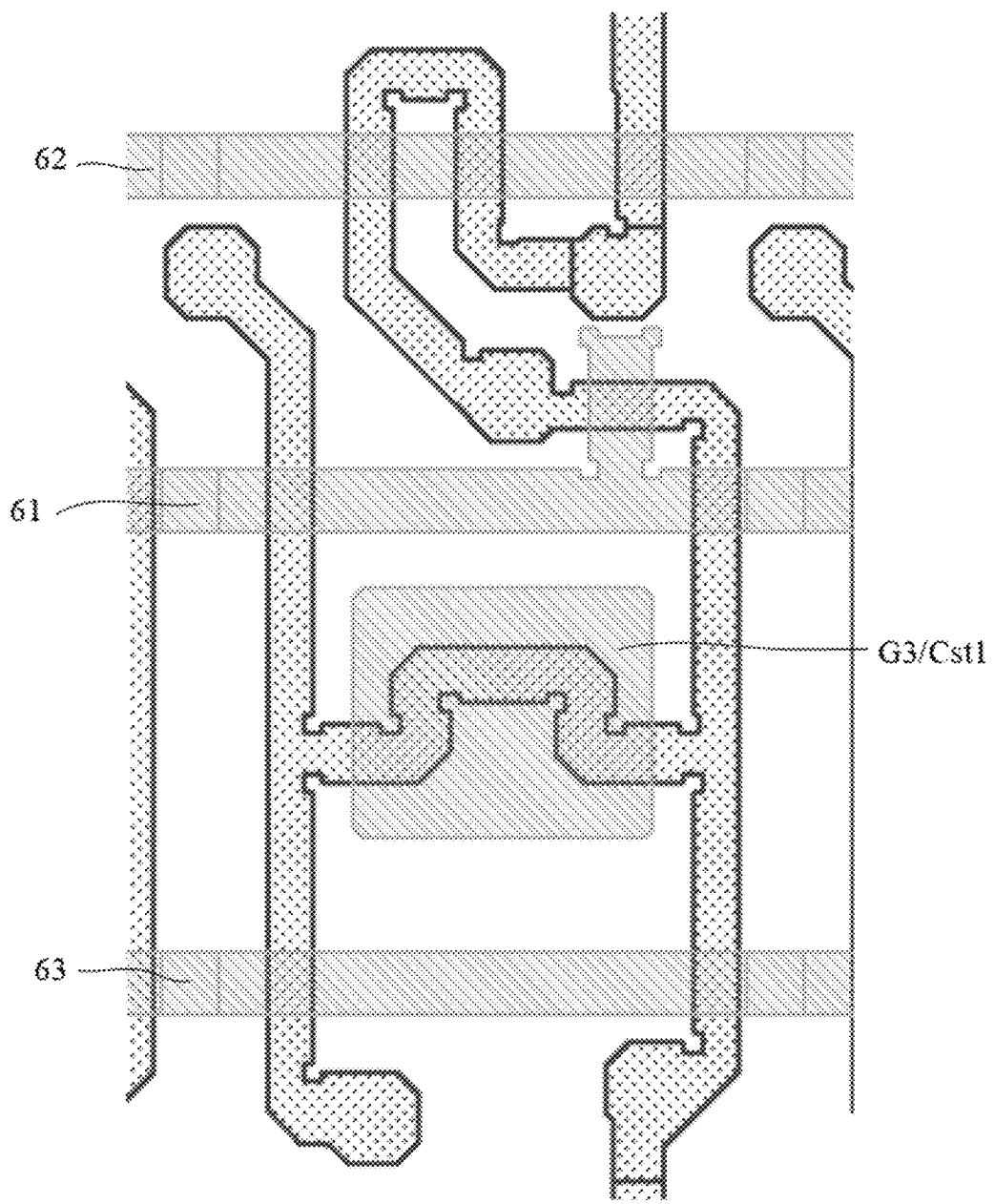
FIG. 9 shows a plan view of a combination of a semiconductor layer and a first conductive layer of an exemplary embodiment of a sub-pixel included in a repeating unit in FIG. 7.
Figure 10:
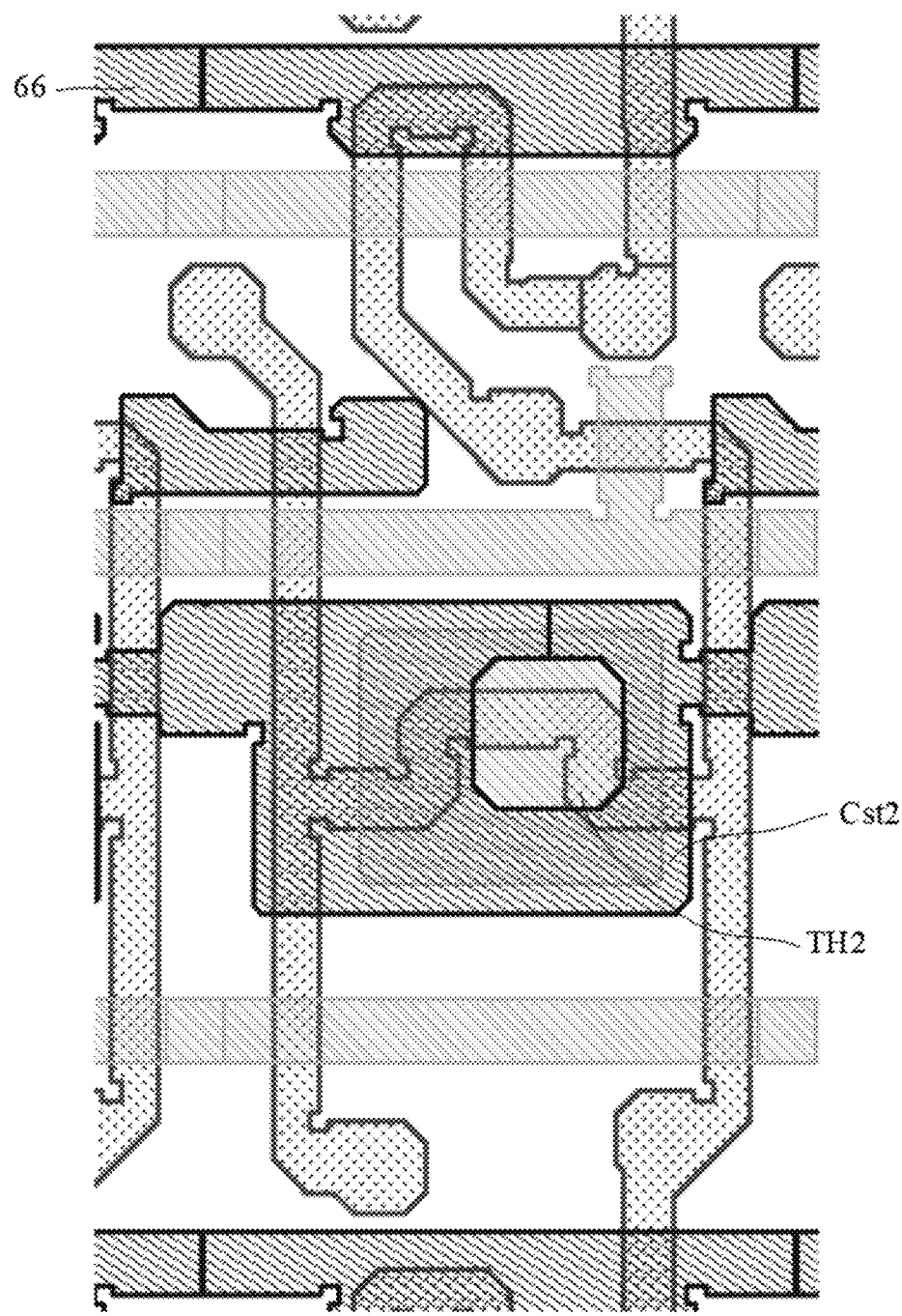
FIG. 10 shows a plan view of a combination of a semiconductor layer, a first conductive layer, and a second conductive layer of an exemplary embodiment of a sub-pixel included in a repeating unit in FIG. 7.
Figure 11:
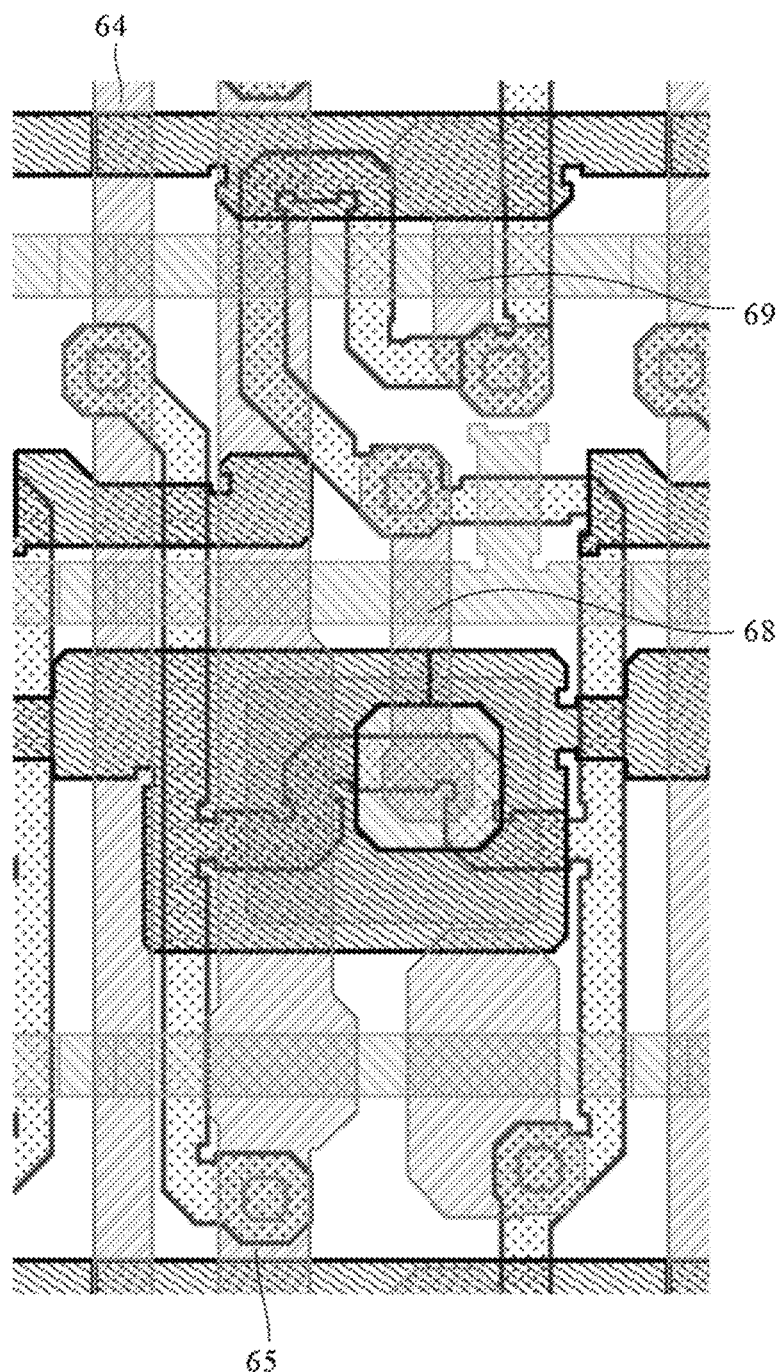
FIG. 11 shows a plan view of a combination of a semiconductor layer, a first conductive layer, a second conductive layer, and a third conductive layer of an exemplary embodiment of a sub-pixel included in a repeating unit in FIG. 7.
Figure 12A:
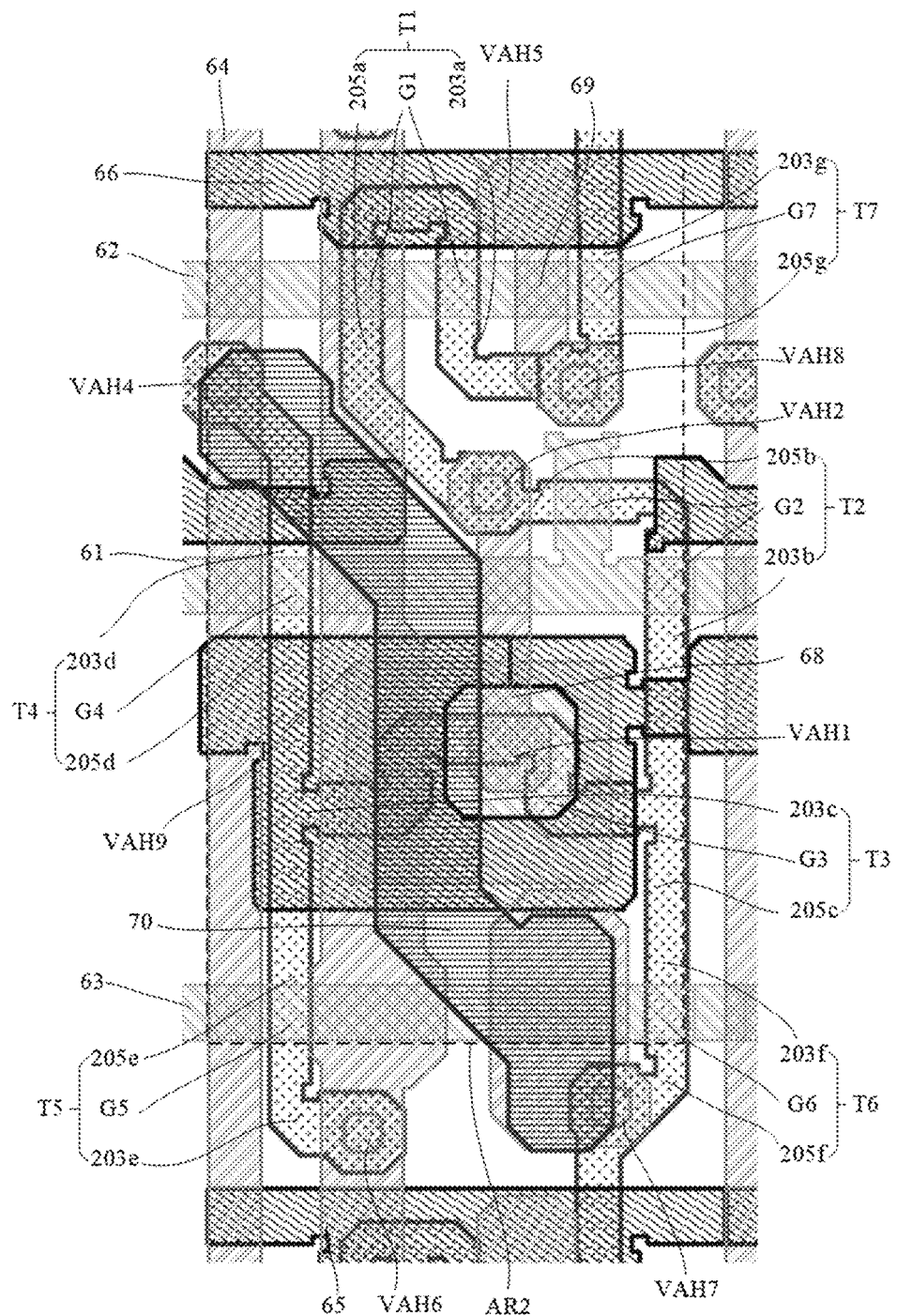
FIGS. 12A and 12B are plan views each showing a combination of a semiconductor layer, a first conductive layer, a second conductive layer, a third conductive layer, and a fourth conductive layer of an exemplary embodiment of a sub-pixel included in a repeating unit in FIG. 7.
Figure 12B:
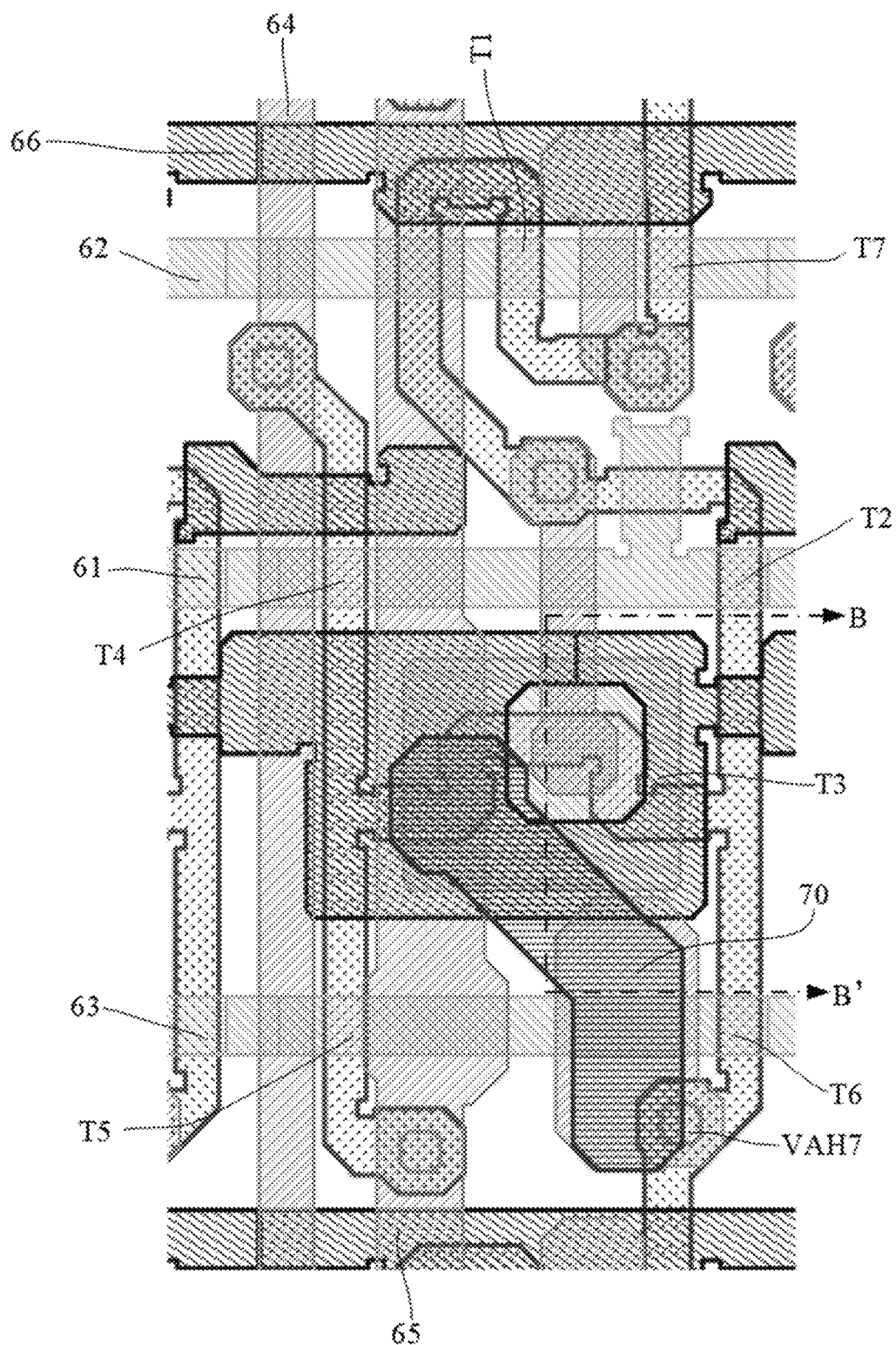
Figure 13:
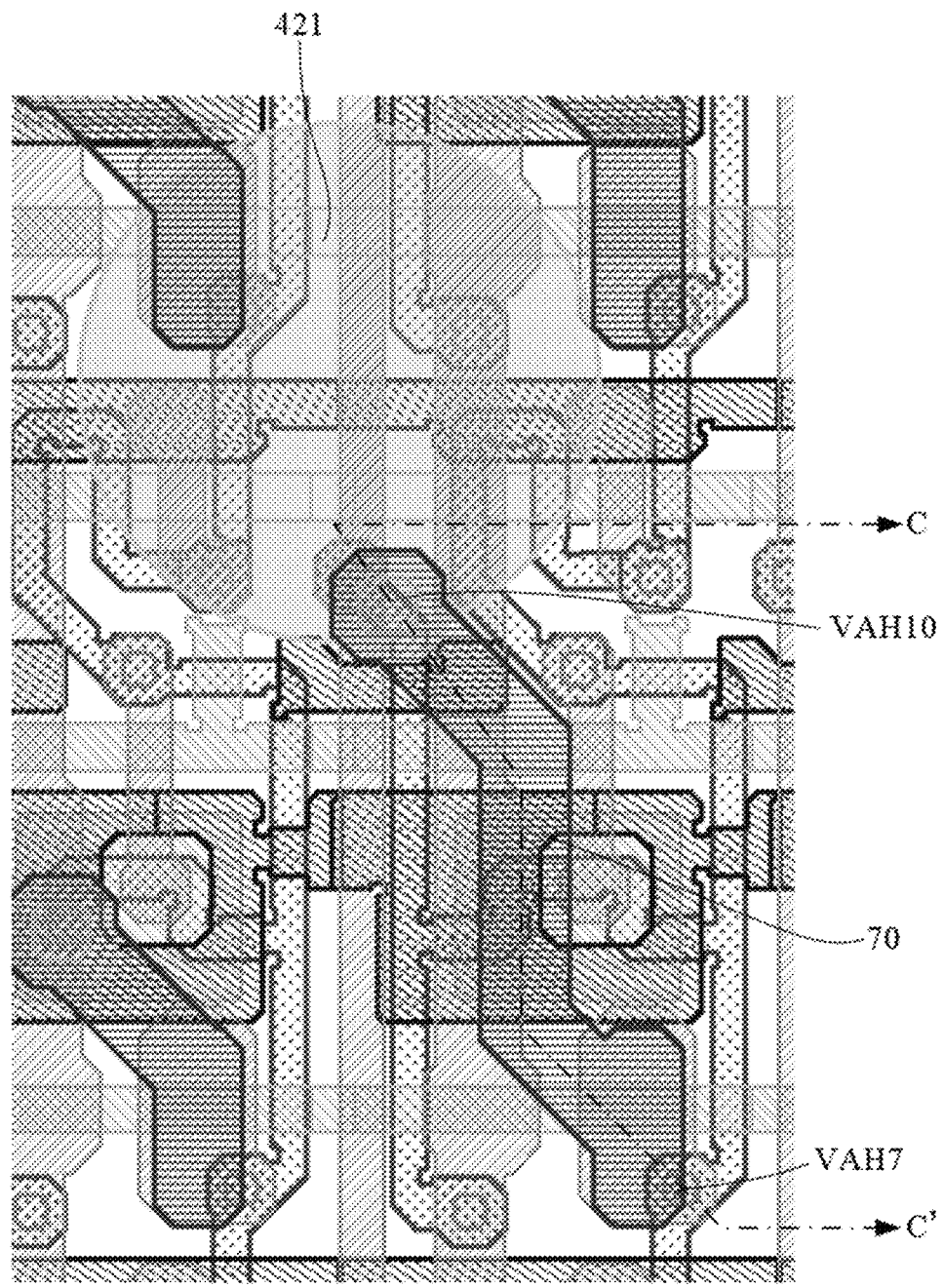
FIG. 13 shows a plan view of a combination of a semiconductor layer, a first conductive layer, a second conductive layer, a third conductive layer, a fourth conductive layer, and a fifth conductive layer of an exemplary embodiment of a sub-pixel included in a repeating unit in FIG. 7.
Figure 14A:
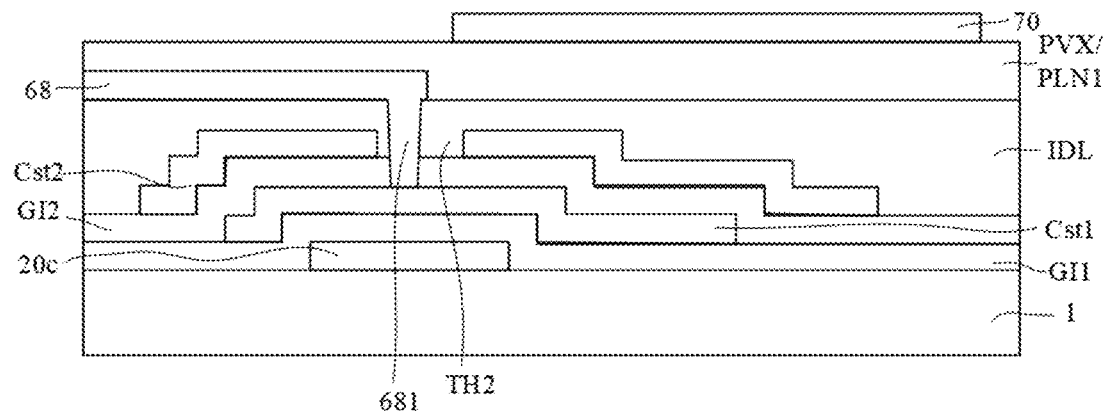
FIG. 14A shows a schematic diagram of a cross-sectional structure of a display substrate taken along a line BB' in FIG. 12B, according to some exemplary embodiments of the present disclosure.
Figure 14B:
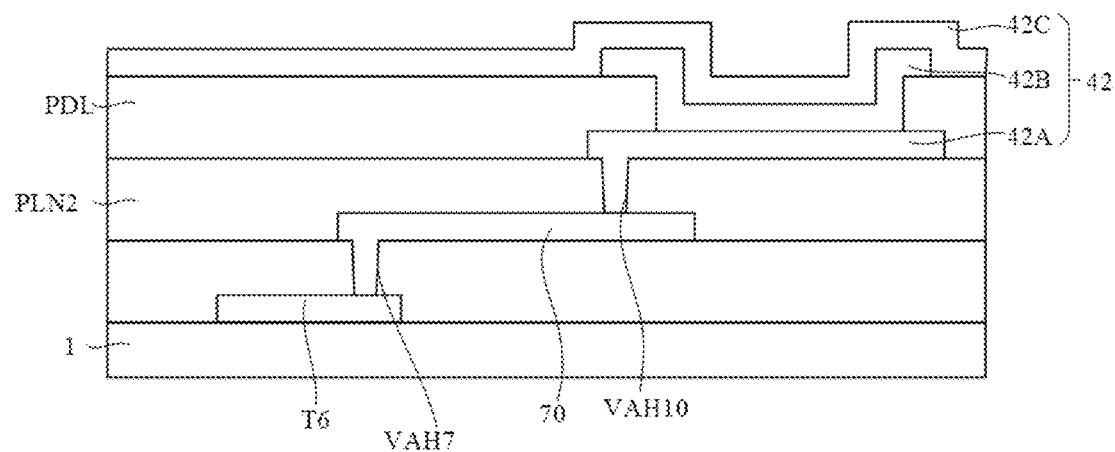
FIG. 14B shows a schematic diagram of a cross-sectional structure of a display substrate taken along a line CC' in FIG. 13, according to some exemplary embodiments of the present disclosure.

FIG. 7 shows a plan view of an exemplary embodiment of a sub-pixel in a second display region AA2 of a display substrate, according to some exemplary embodiments of the present disclosure, and schematically shows a plan view of a repeating unit in the second display region AA2. FIG. 8 shows a plan view of a semiconductor layer of an exemplary embodiment of a sub-pixel included in a repeating unit in FIG. 7. FIG. 9 shows a plan view of a combination of a semiconductor layer and a first conductive layer of an exemplary embodiment of a sub-pixel included in a repeating unit in FIG. 7. FIG. 10 shows a plan view of a combination of a semiconductor layer, a first conductive layer, and a second conductive layer of an exemplary embodiment of a sub-pixel included in a repeating unit in FIG. 7. FIG. 11 shows a plan view of a combination of a semiconductor layer, a first conductive layer, a second conductive layer and a third conductive layer of an exemplary embodiment of a sub-pixel included in a repeating unit in FIG. 7. FIGS. 12A and 12B are respectively plan views each showing a combination of a semiconductor layer, a first conductive layer, a second conductive layer, a third conductive layer and a fourth conductive layer of an exemplary embodiment of a sub-pixel included in a repeating unit in FIG. 7. FIG. 13 shows a plan view of a combination of a semiconductor layer, a first conductive layer, a second conductive layer, a third conductive layer, a fourth conductive layer, and a fifth conductive layer of an exemplary embodiment of a sub-pixel included in a repeating unit in FIG. 7. FIG. 14A shows a schematic diagram of a cross-sectional structure of a display substrate taken along a line BB' in FIG. 12B, according to some exemplary embodiments of the present disclosure. FIG. 14B shows a schematic diagram of a cross-sectional structure of a display substrate taken along a line CC' in FIG. 13, according to some exemplary embodiments of the present disclosure.

With reference to FIGS. 1 to 7, in the embodiments of the present disclosure, a plurality of pixels may be provided in the first display region AA1. The plurality of pixels may be arranged on the base substrate 1 in an array in a first direction X and a second direction Y. For example, each of the plurality of pixels may include a first sub-pixel 11, a second sub-pixel 12 and a third sub-pixel 13. For ease of understanding, the first sub-pixel 11, the second sub-pixel 12 and the third sub-pixel 13 may be respectively described as a red sub-pixel, a blue sub-pixel and a green sub-pixel, however, the embodiments of the present disclosure are not limited thereto.

A plurality of pixels may be provided in the second display region AA2. The plurality of pixels may be arranged on the base substrate 1 in an array in the first direction X and the second direction Y. For example, each of the plurality of pixels 20 may include a fourth sub-pixel 21, a fifth sub-pixel 22, and a sixth sub-pixel 23. For ease of understanding, the fourth sub-pixel 21, the fifth sub-pixel 22 and the sixth sub-pixel 23 may be respectively described as a red sub-pixel, a blue sub-pixel and a green sub-pixel, however, the embodiments of the present disclosure are not limited thereto.

In the embodiments of the present disclosure, a plurality of repeating units arranged in an array may be provided in the second display region AA2. For ease of description herein, a repeating unit located in the second display region AA2 is referred to as a second repeating unit P2. In some embodiments, a second repeating unit P2 may include at least one pixel. For example, in the embodiment shown in FIG. 7, a second repeating unit P2 includes two pixels. Accordingly, a second repeating unit P2 may include a plurality of sub-pixels, such as the above-mentioned fourth sub-pixel 21, fifth sub-pixel 22 and sixth sub-pixel 23.

In the embodiments of the present disclosure, a plurality of repeating units arranged in an array are provided in the first display region AA1. For ease of description herein, a repeating unit located in the first display region AA1 is referred to as a first repeating unit P1. In some embodiments, a first repeating unit P1 may include at least one pixel. For example, in some embodiments, a first repeating unit P1 includes two pixels. Accordingly, a first repeating unit P1 may include a plurality of sub-pixels, such as the above-mentioned first sub-pixel 11, second sub-pixel 12 and third sub-pixel 13.

It should be noted that, the embodiments of the present disclosure are described by taking red, green and blue as examples, however, the embodiments of the present disclosure are not limited thereto. That is, each repeating unit may include at least two different colors of sub-pixels, for example, a first color sub-pixel, a second color sub-pixel, and a third color sub-pixel, and the first color, the second color, and third color are different from each other. For example, in FIGS. 4 and 5, R, G, and B are marked in respective sub-pixels to represent the red sub-pixel, the green sub-pixel, and the blue sub-pixel, respectively. It should be noted that, this is only schematic, which should not be regarded as a limitation to the embodiments of the present disclosure. In some embodiments of the present disclosure, an arrangement of sub-pixels in each repeating unit may refer to a conventional pixel arrangement, such as GGRB, RGBG, RGB, etc., which is not limited in the embodiments of the present disclosure.

It should be understood that, in the embodiments of the present disclosure, each sub-pixel located in the first display region AA1 and the second display region AA2 may include a pixel driving circuit and a light-emitting device. For example, the light-emitting device may be an OLED light-emitting device, and the OLED light-emitting device includes an anode, an organic light-emitting layer and a cathode that are stacked. The pixel driving circuit may include a plurality of thin film transistors and at least one storage capacitor.

It should be noted that, although in the illustrated embodiment, the first direction X and the second direction Y are perpendicular to each other, however, the embodiments of the present disclosure are not limited thereto.

Hereinafter, taking the 7T1C pixel driving circuit as an example, a structure of a pixel driving circuit of each sub-pixel located in the first display region AA1 and the second display region AA2 will be described in detail. However, the embodiments of the present disclosure are not limited to the 7T1C pixel driving circuit, and structures of other known pixel driving circuits may be applied to the embodiments of the present disclosure, under the condition of no conflict.

It should be understood that, in the embodiments of the present disclosure, with reference to FIGS. 13 and 14B, the display substrate 100 further includes a pixel defining layer PDL on a side of a first electrode (such as an anode) away from the pixel driving circuit. The pixel defining layer PDL includes a plurality of openings, and each sub-pixel corresponds to at least one opening (for example, one opening) in the pixel-defining layer, and an actual light-emitting region or a display region of a sub-pixel is substantially equivalent to an opening in the pixel-defining layer corresponding to the sub-pixel. In some embodiments, an area of an opening in the pixel defining layer corresponding to each sub-pixel or an actual light-emitting region of each sub-pixel is less than an area of the first electrode (such as an anode), and a projection of the opening in the pixel defining layer or the actual light-emitting region on the base substrate completely falls within a projection of the first electrode on the base substrate. For ease of illustration, in the embodiments of the present disclosure, only an approximate position and an approximate shape of the first electrode (such as an anode) of the sub-pixel are illustrated, so as to indicate a distribution of each sub-pixel.

With reference to FIGS. 7, 13 and 14B, each sub-pixel located in the second display region AA2 may include a light-emitting device (such as an OLED). For ease of description, a light-emitting device located in the second display region AA2 is called a second light-emitting device 42. For example, the second light-emitting device 42 may include an anode 42A, a light-emitting material layer 42B, and a cathode 42C that are stacked. It should be noted that, for clarity, in the plan views, the anode of the second light-emitting device 42 is used to schematically illustrate the second light-emitting device 42, so as to schematically represent the sub-pixel located in the second display region AA2. For example, in the second display region AA2, the anode 42A of the second light-emitting device 42 may include an anode body portion 421 and an anode connection portion 422. An orthographic projection of the anode body portion 421 on the base substrate 1 may have a regular shape, such as a circle, an oval, a rectangle, a hexagon, an octagon, a rounded rectangle, and the like. The second display region AA2 is further provided with a pixel driving circuit (which will be described below) for driving the second light-emitting device 42, and the anode connection portion 422 is electrically connected to the pixel driving circuit for the second light-emitting device 42.

For example, referring to FIG. 7, the second repeating unit P2 may include a plurality of sub-pixels arranged in 4 rows and 4 columns. In the first row, a fourth sub-pixel 21 and a fifth sub-pixel 22 are arranged in the first column and the third column, respectively. In the second row, two sixth sub-pixels 23 are arranged in the second column and the fourth column, respectively. In the third row, a fifth sub-pixel 22 and a fourth sub-pixel 21 are arranged in the first column and the third column, respectively. In the fourth row, two sixth sub-pixels 23 are arranged in the second column and the fourth column, respectively.

It should be noted that, the arrangement of sub-pixels shown in FIG. 7 is only an exemplary arrangement of some embodiments of the present disclosure, and is not a limitation to the embodiments of the present disclosure. In other embodiments, the sub-pixels may be arranged in other ways.

For example, in some embodiments of the present disclosure, referring to FIG. 7, an area of an orthographic projection of an anode body portion 421 of a fourth sub-pixel 21 on the base substrate 1 is less than an area of an orthographic projection of an anode body portion 421 of a fifth sub-pixel 22 on the base substrate 1, and an area of an orthographic projection of an anode body portion 421 of a sixth sub-pixel 23 on the base substrate 1 is less than the area of the orthographic projection of the anode body portion 421 of the fourth sub-pixel 21 on the base substrate 1. That is, an actual light-emitting area of a green sub-pixel is the smallest, an actual light-emitting area of a blue sub-pixel is the largest, and an actual light-emitting area of a red sub-pixel is between the actual light-emitting areas of the green sub-pixel and the blue sub-pixel.

Referring to FIGS. 6A to 13, the pixel driving circuit may include a plurality of thin film transistors and a storage capacitor Cst. The pixel driving circuit is used to drive an organic light-emitting diode (i.e., OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The display substrate may further include a plurality of signal lines, for example, the plurality of signal lines include: a scan signal line 61 for transmitting a scan signal Sn, a reset signal line 62 for transmitting a reset control signal RESET (for example, the reset control signal RESET may be a scan signal of a previous row), a light-emitting control line 63 for transmitting a light-emitting control signal En, a data signal line 64 for transmitting a data signal Dm, a driving voltage line 65 for transmitting a VDD voltage (herein, it may also be referred to as a first voltage or a driving voltage), an initialization voltage line 66 for transmitting an initialization voltage Vint, and a reference voltage line 67 for transmitting a VSS voltage (herein, it may also be referred to as a second voltage or a reference voltage).

The storage capacitor Cst may include two capacitive plates Cst1 and Cst2. Herein, the capacitive plate Cst1 may be referred to as one end, a first end, or a first storage capacitor electrode of the storage capacitor Cst, and the capacitive plate Cst2 may be referred to as the other end, a second end, or a second storage capacitor electrode of the storage capacitor Cst.

The first transistor T1, the second transistor T2, the third transistor T3, the fourth transistor T4, the fifth transistor T5, the sixth transistor T6 and the seventh transistor T7 may be formed along an active layer as shown in FIG. 8. The active layer may have a curved or bent shape, and may include a first active layer 20a corresponding to the first transistor T1, a second active layer 20b corresponding to the second transistor T2, a third active layer 20c corresponding to the third transistor T3, a fourth active layer 20d corresponding to the fourth transistor T4, a fifth active layer 20e corresponding to the fifth transistor T5, a sixth active layer 20f corresponding to the sixth transistor T6, and a seventh active layer 20g corresponding to the seventh transistor T7.

The active layer may include, for example, polysilicon, and include, for example, a channel region, a source region, and a drain region. The channel region may not be doped, or a doping type thereof is different from doping types of the source region and the drain region, and therefore the channel region has a semiconductor characteristic. The source region and the drain region are respectively located on both sides of the channel region, and are doped with impurities, and therefore have electrical conductivity. The impurities may be changed according to whether the TFT is an N-type transistor or a P-type transistor.

The first transistor T1 includes the first active layer 20a and a first gate G1. The first active layer 20a includes a first channel region 201a, a first source region 203a, and a first drain region 205a. The gate G1 of the first transistor T1 is electrically connected to the reset signal line 62. A source S1 of the first transistor T1 is electrically connected to the initialization voltage line 66. A drain D1 of the first transistor T1 is electrically connected to the end Cst1 of the storage capacitor Cst, a drain D2 of the second transistor T2, and a gate G3 of the third transistor T3. As shown in FIG. 6A, the drain D1 of the first transistor T1, the end Cst1 of the storage capacitor Cst1, the drain D2 of the second transistor T2, and the gate G3 of the third transistor T3 are electrically connected at a node N1. The first transistor T1 is turned on according to the reset control signal RESET transmitted via the reset signal line 62, so as to transmit the initialization voltage Vint to the gate G3 of the third transistor T3, so that an initialization operation is performed to initialize a voltage of the gate G3 of the third transistor T3. That is, the first transistor T1 is also referred to as an initialization transistor.

The second transistor T2 includes the second active layer 20b and a second gate G2. The second active layer 20b includes a second channel region 201b, a second source region 203b, and a second drain region 205b. The gate G2 of the second transistor T2 is electrically connected to the scan signal line 61, a source S2 of the second transistor T2 is electrically connected to a node N3, and the drain D2 of the second transistor T2 is electrically connected to the node N1. The second transistor T2 is turned on according to the scan signal Sn transmitted via the scan signal line 61, so as to electrically connect the gate G3 and a drain D3 of the third transistor T3 to each other, thereby implementing a diode connection of the third transistor T3. The third transistor T3 includes the third active layer 20c and a third gate G3. The third active layer 20c includes a third source region 203c, a third drain region 205c, and a third channel region 201c connecting the third source region 203c and the third drain region 205c. The third source region 203c and the third drain region 205c extend in two opposite directions relative to the third channel region 201c. The third source region 203c of the third transistor T3 is connected to a fourth drain region 205d and a fifth drain region 205e. The third drain region 205c is connected to the second source region 203b and a sixth source region 203f. The gate G3 of the third transistor T3 is electrically connected to the node N1 through via holes VAH1 and VAH2, and a first connection portion 68. The gate G3 of the third transistor T3 is electrically connected to the node N1, a source S3 of the third transistor T3 is electrically connected to the node N2, and the drain D3 of the third transistor T3 is electrically connected to the node N3. The third transistor T3 receives the data signal Dm according to a switching operation of the fourth transistor T4, so as to provide a driving current Id to the OLED. The third transistor T3 is also referred to as a driving transistor.

The fourth transistor T4 includes the fourth active layer 20d and a fourth gate G4. The fourth active layer 20d includes a fourth channel region 201d, a fourth source region 203d, and a fourth drain region 205d. The fourth transistor T4 serves as a switching device for selecting a target light-emitting sub-pixel. The fourth gate G4 is connected to the scan signal line 61, the fourth source region 203d is connected to the data signal line 64 through a via hole VAH4, and the fourth drain region 205d is connected to the first transistor T1 and the fifth transistor T5, that is, electrically connected to the node N2. The fourth transistor T4 is turned on according to the scan signal Sn transmitted via the scan signal line 61, so as to perform a switching operation to transmit the data signal Dm to the source S3 of the third transistor T3.

The fifth transistor T5 includes the fifth active layer 20e and a fifth gate G5. The fifth active layer 20e includes a fifth channel region 201e, a fifth source region 203e, and a fifth drain region 205e. The fifth source region 203e may be connected to the driving voltage line 65 through a via hole VAH6. The gate G5 of the fifth transistor T5 is electrically connected to the light-emitting control line 63, and a source S5 of the fifth transistor T5 is electrically connected to the driving voltage line 65. A drain D5 of the fifth transistor T5 is electrically connected to the node N2.

The sixth transistor T6 includes the sixth active layer 20f and a sixth gate G6, and the sixth active layer 20f includes a sixth channel region 201f, a sixth source region 203f, and a sixth drain region 205f. The sixth drain region 205f may be connected to an anode of the OLED through a via hole VAH7. The gate G6 of the sixth transistor T6 is electrically connected to the light-emitting control line 63, a source S6 of the sixth transistor T6 is electrically connected to the node N3, and a drain D6 of the sixth transistor T6 is electrically connected to a node N4, that is, electrically connected to the anode of the OLED. The fifth transistor T5 and the sixth transistor T6 are concurrently (for example, simultaneously) turned on according to the light-emitting control signal En transmitted via the light-emitting control line 63, so as to transmit the driving voltage VDD to the OLED, thereby allowing the driving current Id to flow into the OLED.

The seventh transistor T7 includes the seventh active layer 20g and a seventh gate G7. The seventh active layer 20g includes a seventh source region 203g, a seventh drain region 205g, and a seventh channel region 201g. The seventh drain region 205g is connected to the first source region 203a of the first transistor T1. The seventh drain region 205g may be electrically connected to the initialization voltage line 66 through a via hole VAH8, a second connection portion 69, and a via hole VAH5. The gate G7 of the seventh transistor T7 is electrically connected to the reset signal line 62, a source S7 of the seventh transistor T7 is electrically connected to the node N4, and a drain D7 of the seventh transistor T7 is electrically connected to the initialization voltage line 66.

The end Cst1 (hereinafter referred to as the first storage capacitor electrode) of the storage capacitor Cst is electrically connected to the node N1, and the other end Cst2 (hereinafter referred to as the second storage capacitor electrode) of the storage capacitor Cst is electrically connected to the driving voltage line 65.

The anode of the OLED is electrically connected to the node N4, and a cathode of the OLED is electrically connected to the reference voltage line 67 to receive a reference voltage VSS. Accordingly, the OLED receives the driving current Id from the third transistor T3 to emit light, thereby displaying an image.

It should be noted that, in FIG. 6A, each of the thin film transistors T1, T2, T3, T4, T5, T6, and T7 is a p-channel field effect transistor, however, the embodiments of the present disclosure are not limited thereto, and at least some of the thin film transistors T1, T2, T3, T4, T5, T6, and T7 may be n-channel field effect transistors.

In operation, in an initialization phase, the reset control signal RESET being at a low level is provided via the reset signal line 62. Subsequently, the first transistor T1 is turned on based on the reset control signal RESET being at a low level, and the initialization voltage Vint from the initialization voltage line 66 is transmitted to the gate G3 of the third transistor T3 via the first transistor T1. Therefore, the third transistor T3 is initialized due to the initialization voltage Vint.

In a data programming phase, the scan signal Sn being at a low level is provided via the scan signal line 61. Subsequently, the fourth transistor T4 and the second transistor T2 are turned on based on the scan signal Sn being at a low level. Therefore, the third transistor T3 is in a diode-connected state as the second transistor T2 is turned on, and the third transistor T3 is positive biased.

Subsequently, a compensation voltage (Dm+Vth) (for example, Vth is a negative value), which is obtained by subtracting a threshold voltage Vth of the third transistor T3 from the data signal Dm provided via the data signal line 64, is applied to the gate G3 of the third transistor T3. Subsequently, the driving voltage VDD and the compensation voltage (Dm+Vth) are applied to the two ends of the storage capacitor Cst, so that electric charges corresponding to a voltage difference between corresponding ends are stored in the storage capacitor Cst.

In a light-emitting phase, the light-emitting control signal En from the light-emitting control line 63 changes from being at a high level to being at a low level. Subsequently, in the light-emitting phase, the fifth transistor T5 and the sixth transistor T6 are turned on based on the light-emitting control signal En being at a low level.

Subsequently, a driving current is generated based on a difference between a voltage at the gate G3 of the third transistor T3 and the driving voltage VDD. The driving current Id corresponding to a difference between the driving current and a bypass current is provided to the OLED via the sixth transistor T6.

In the light-emitting phase, based on a current-voltage relationship of the third transistor T3, a gate-source voltage of the third transistor T3 is maintained at ((Dm+Vth)−VDD) due to the storage capacitor Cst. The driving current Id is proportional to $(Dm-VDD)^2$. Therefore, the driving current Id may not be affected by variation of the threshold voltage Vth of the third transistor T3.

Referring to FIGS. 7 to 14B, the display substrate includes a base substrate 1 and a plurality of film layers arranged on the base substrate 1. In some embodiments, the plurality of film layers include at least a semiconductor layer 20, a first conductive layer 21, a second conductive layer 22, a third conductive layer 23, and a fourth conductive layer 24. The semiconductor layer 20, the first conductive layer 21, the second conductive layer 22, and the third conductive layer 23 are arranged away from the base substrate 1 sequentially. The plurality of film layers further include at least a plurality of insulating film layers. For example, the plurality of insulating film layers may include a first gate insulating layer GI1, a second gate insulating layer GI2, an interlayer insulating layer IDL, and a passivation layer PVX. The first gate insulating layer GI1 may be arranged between the semiconductor layer 20 and the first conductive layer 21, the second gate insulating layer GI2 may be arranged between the first conductive layer 21 and the second conductive layer 22, and the interlayer insulating layer IDL may be arranged between the second conductive layer 22 and the third conductive layer 23, and the passivation layer PVX may be arranged between the third conductive layer 23 and the fourth conductive layer 24.

For example, the semiconductor layer 20 may be made of a semiconductor material such as low-temperature polysilicon, and a film thickness thereof may be within a range of 400 angstroms to 800 angstroms, such as 500 angstroms. The first conductive layer 21 and the second conductive layer 22 may be made of a conductive material used to form a gate of a thin film transistor, for example, the conductive material may be Mo, and a film thickness of the first conductive layer 21 and the second conductive layer 22 may be within a range of 2000 angstroms to 4000 angstroms, such as 3000 angstroms. The third conductive layer 23 and the fourth conductive layer 24 may be made of a conductive material used to form a source and drain of a thin film transistor, for example, the conductive material may include Ti, Al, etc. The third conductive layer 23 may have a stack structure formed of Ti/Al/Ti, a film thickness of the third conductive layer 23 may range from 6000 angstroms to 9000 angstroms. For example, in a case that the third conductive layer 23 or the fourth conductive layer 24 has a stack structure formed of Ti/Al/Ti, thicknesses of respective layers of Ti/Al/Ti may be about 500 angstroms, 6000 angstroms, and 500 angstroms. For example, the first gate insulating layer GI1 and the second gate insulating layer GI2 may be made of silicon oxide, silicon nitride or silicon oxynitride, and each layer may have a thickness ranging from about 1000 angstroms to 2000 angstroms. For example, the interlayer insulating layer IDL and the passivation layer PVX may be made of silicon oxide, silicon nitride or silicon oxynitride, with a thickness ranging from about 3000 angstroms to 6000 angstroms.

The display substrate includes the scan signal line 61, the reset signal line 62, the light-emitting control line 63 and the initialization voltage line 66 arranged in a row direction to respectively apply the scan signal Sn, the reset control signal RESET, the light-emitting control signal En, and the initialization voltage Vint to each sub-pixel. The display substrate may further include the data signal line 64 and the driving voltage line 65 intersecting the scan signal line 61, the reset signal line 62, the light-emitting control line 63 and the initialization voltage line 66, so as to respectively apply the data signal Dm and the driving voltage VDD to each sub-pixel.

As shown in FIG. 9, each of the scan signal line 61, the reset signal line 62, and the light-emitting control line 63 is located in the first conductive layer 21. Each of the gates G1 to G7 of the transistors described above is also located in the first conductive layer 21. For example, parts of the reset signal line 62 overlapping the semiconductor layer 20 respectively form the gate G1 of the first transistor T1 and the gate G7 of the seventh transistor T7, parts of the scan signal line 61 overlapping the semiconductor layer 20 respectively form the gate G2 of the second transistor T2 and the gate G4 of the fourth transistor T4, and parts of the light-emitting control line 63 overlapping the semiconductor layer 20 respectively form the gate G6 of the sixth transistor T6 and the gate G5 of the fifth transistor T5.

With reference to FIG. 9, the display substrate may further include a plurality of first storage capacitor electrodes Cst1. The plurality of first storage capacitor electrodes Cst1 are also located in the first conductive layer 21. A part of the first storage capacitor electrode Cst1 overlapping the semiconductor layer 20 forms the third gate G3 of the third transistor T3. The first storage capacitor electrode Cst1 also forms an end of the storage capacitor Cst. That is, the first storage capacitor electrode Cst1 simultaneously serves as the gate G3 of the third transistor T3 and an electrode of the storage capacitor Cst.

For example, an orthographic projection of the first storage capacitor electrode Cst1 on the base substrate 1 may have a substantially rectangular shape. The "substantially rectangular shape" may include a shape such as a rectangle, a rectangle with at least one corner rounded, and a rectangle with at least one corner chamfered.

As shown in FIG. 10, the initialization voltage line 66 is located in the second conductive layer 22. The display substrate may further include a plurality of second storage capacitor electrodes Cst2. The plurality of second storage capacitor electrodes Cst2 are also located in the second conductive layer 22. The plurality of second storage capacitor electrodes Cst2 are arranged corresponding to the plurality of first storage capacitor electrodes Cst1, respectively. That is, an orthographic projection of the plurality of second storage capacitor electrodes Cst2 on the base substrate 1 and an orthographic projection of the corresponding first storage capacitor electrodes Cst1 on the base substrate 1 at least partially overlap. The second storage capacitor electrode Cst2 forms the other end of the storage capacitor Cst. That is, the first storage capacitor electrode Cst1 and the second storage capacitor electrode Cst2 are oppositely arranged, the orthographic projections of the two on the base substrate 1 at least partially overlap each other, and the second gate insulating layer GI2 is arranged between the two. For example, the first storage capacitor electrode Cst1 may be electrically connected to the node N1 through the via holes VAH1 and VAH2, and the first connection portion 68, and the second storage capacitor electrode Cst2 may be electrically connected to the driving voltage line 65 through a via hole VAH9, that is, the first storage capacitor electrode Cst1 and the second storage capacitor electrode Cst2 are connected to different voltage signals. In this way, a part where the first storage capacitor electrode Cst1 and the second storage capacitor electrode Cst2 overlap each other may form the storage capacitor Cst.

With reference to FIGS. 10, 12A-12B, and 14A, the second storage capacitor electrode Cst2 may include a through hole TH2, so that the first storage capacitor electrode Cst1 under the second storage capacitor electrode Cst2 is connected with a component located in the third conductive layer 23. For example, a part of the first connection portion 68 is formed in the via hole VAH1 to form a conductive plug 681. The conductive plug 681 extends through the through hole TH2 to be electrically connected with the first storage capacitor electrode Cst1. In this way, an end of the first connection portion 68 is electrically connected with an end Cst1 of the storage capacitor.

For example, an orthographic projection of the through hole TH2 on the base substrate 1 may have a substantially rectangular shape. The "substantially rectangular shape" may include a shape such as a rectangle or a square, a rectangle or square with at least one corner rounded, and a rectangle or square with at least one corner chamfered.

Referring FIG. 11, the data signal line 64 and the driving voltage line 65 are located in the third conductive layer 23. In addition, the first connection portion 68 and the second connection portion 69 are also located in the third conductive layer 23.

Referring to FIGS. 12A, 12B and 13, a third connection portion 70 is located in the fourth conductive layer 24. One end of the third connection portion 70 is electrically connected to the sixth transistor T6, and the other end of the third connection portion 70 is electrically connected to the anode of the OLED.

Referring to FIGS. 13 and 14B, the display substrate 100 may further include an insulating layer disposed between the fourth conductive layer 24 and the fifth conductive layer 25, such as a passivation layer PVX. A via hole VAH10 may pass through the passivation layer PVX. The anode 42A of the second light-emitting device 42 is located in the fifth conductive layer 25. A part of the anode connection portion 422 is formed in the via hole VAH10, and this part extends downward to be electrically connected with a part of the third connection portion 10.

One end of the third connection portion 70 is electrically connected with the sixth transistor T6 through the via hole VAH7, and the other end of the third connection portion 70 is electrically connected to the anode connection portion 422 through the via hole VAH10. In order to meet the requirements of a preset PPI, each sub-pixel on the display substrate needs to be arranged in a prescribed manner. In this way, extension lengths of third connection portions 70 in respective sub-pixels may be the same or different from each other.

For example, referring to FIGS. 7, 12A, and 12B, FIG. 12A shows a plan view of a pixel driving circuit of a fourth sub-pixel or a fifth sub-pixel, and FIG. 12B shows a plan view of a pixel driving circuit of a sixth sub-pixel. An extension length of a third connection portion 70 in the sixth sub-pixel 23 may be less than an extension length of a third connection portion 70 in the fourth sub-pixel 21 or the fifth sub-pixel 22.

Figure 6B:
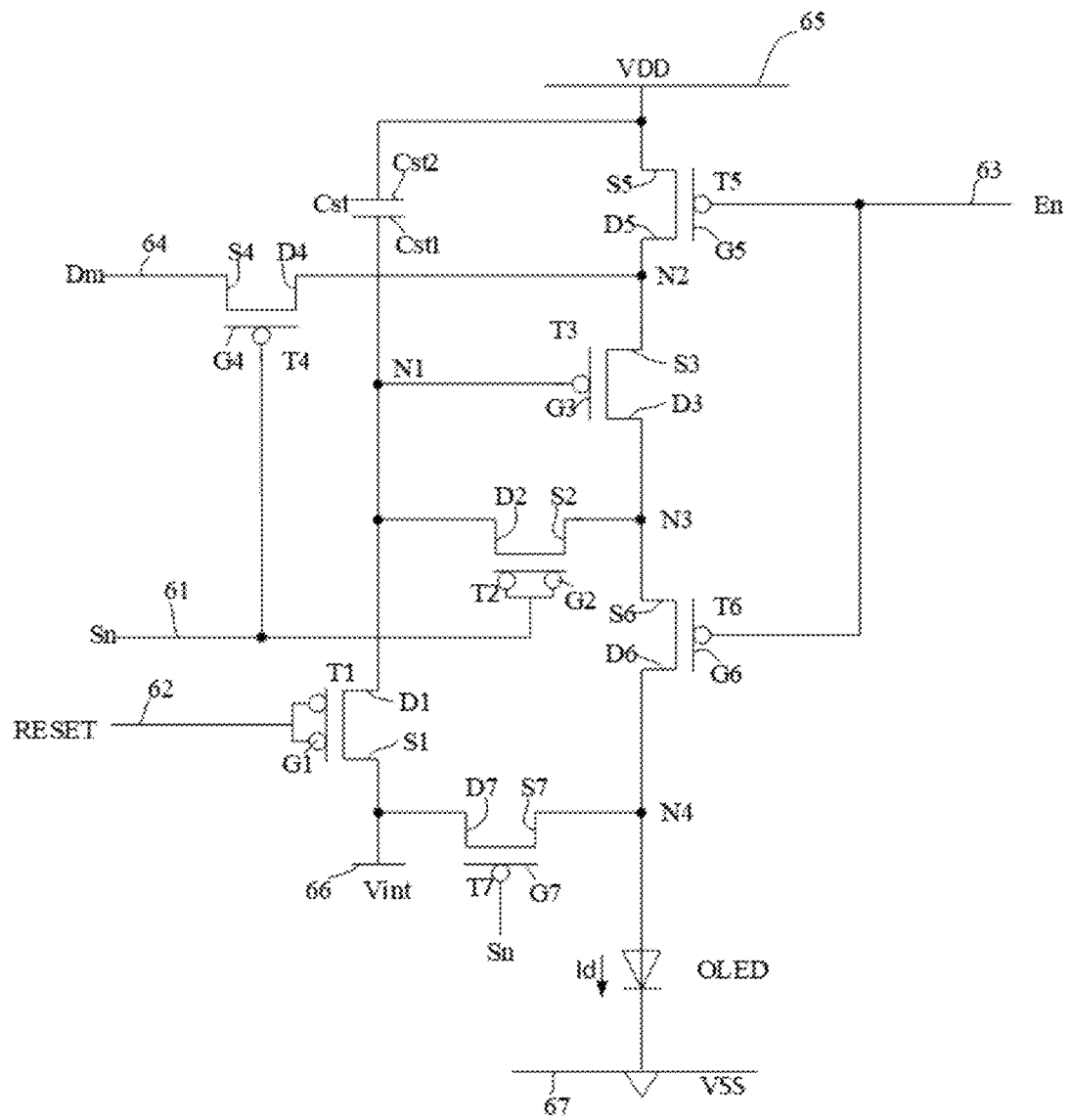
FIG. 6B shows an equivalent circuit diagram of a pixel driving circuit of a sub-pixel, in a first display region, of a display substrate according to some exemplary embodiments of the present disclosure.
Figure 15A:
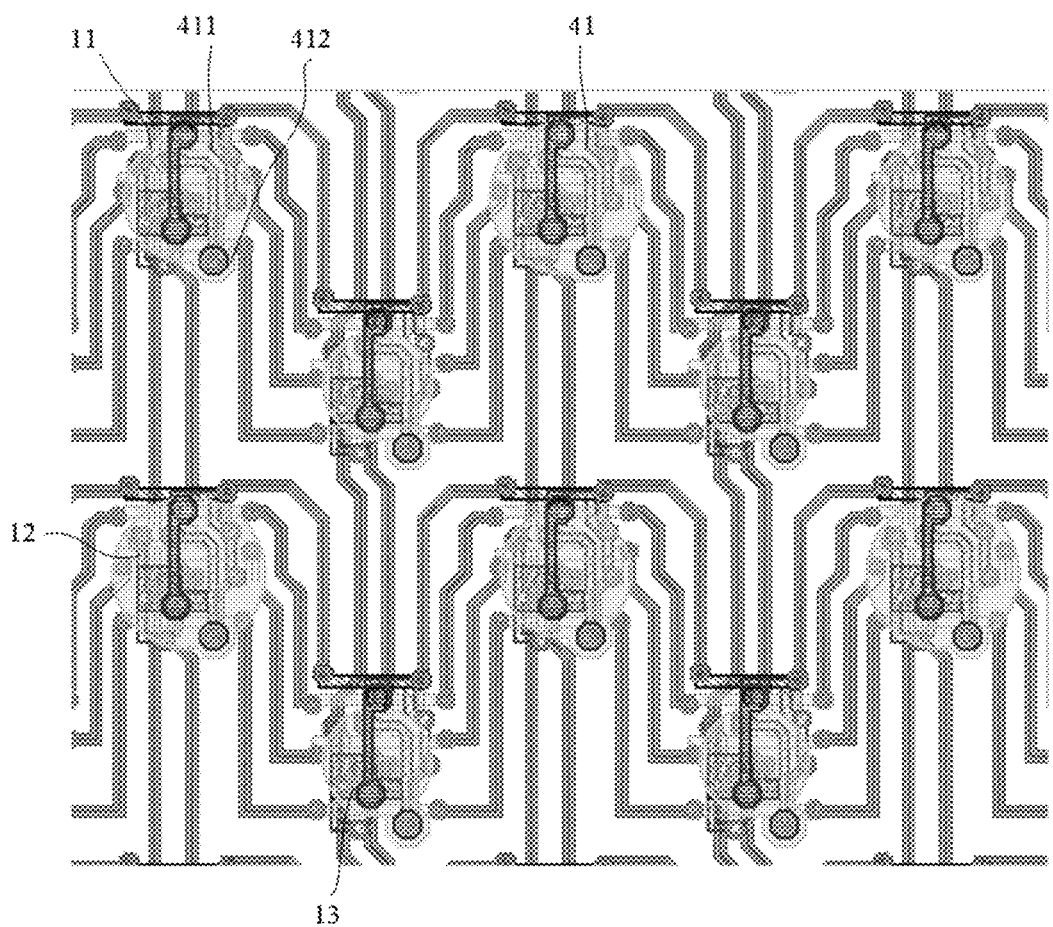
FIG. 15A shows a plan view of an exemplary embodiment of a sub-pixel, in a first display region, of a display substrate according to some exemplary embodiments of the present disclosure, wherein a plan view of a repeating unit in the first display region is schematically shown.
Figure 16:
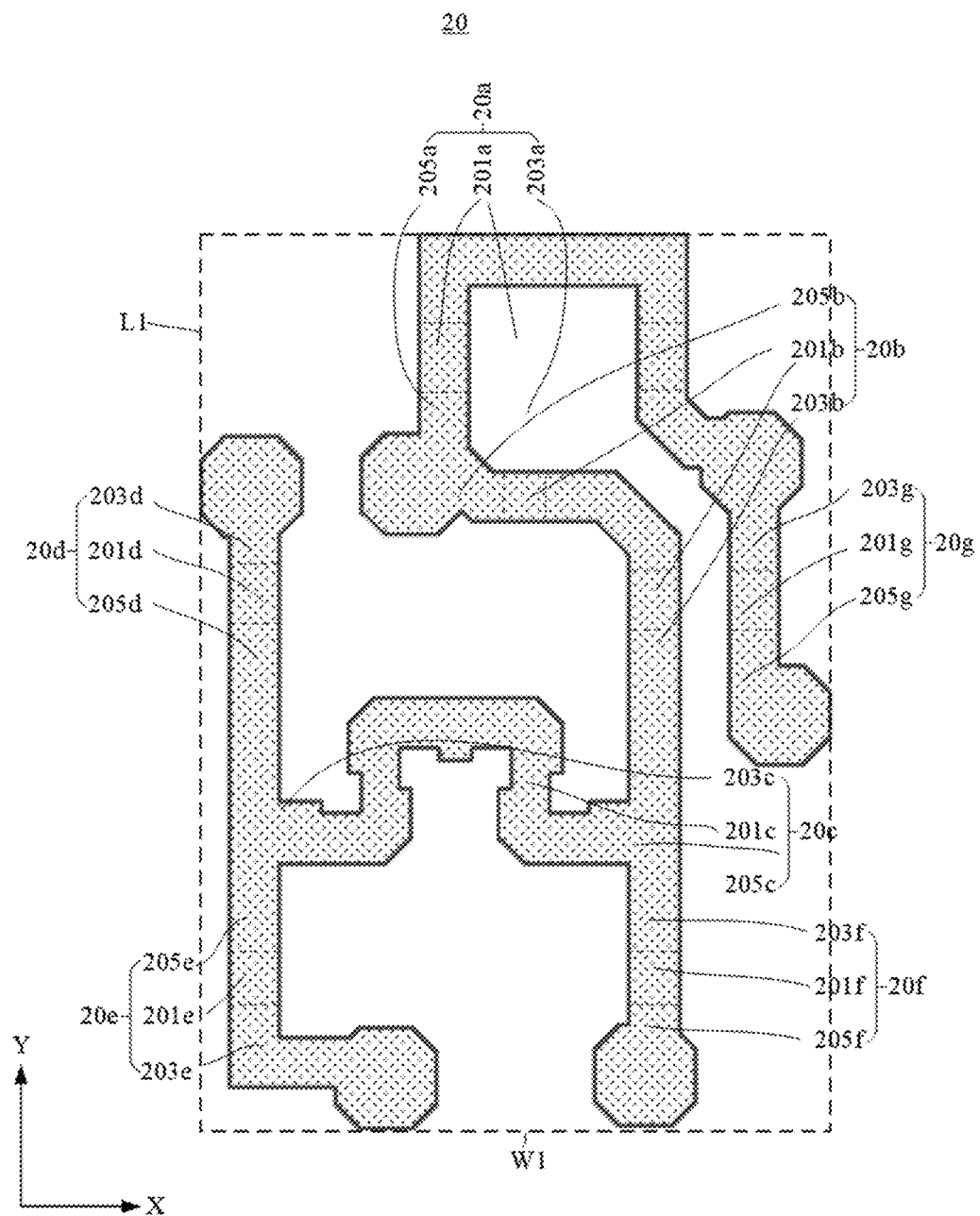
FIG. 16 shows a plan view of a semiconductor layer of an exemplary embodiment of a sub-pixel included in a repeating unit in FIG. 15A.
Figure 17:
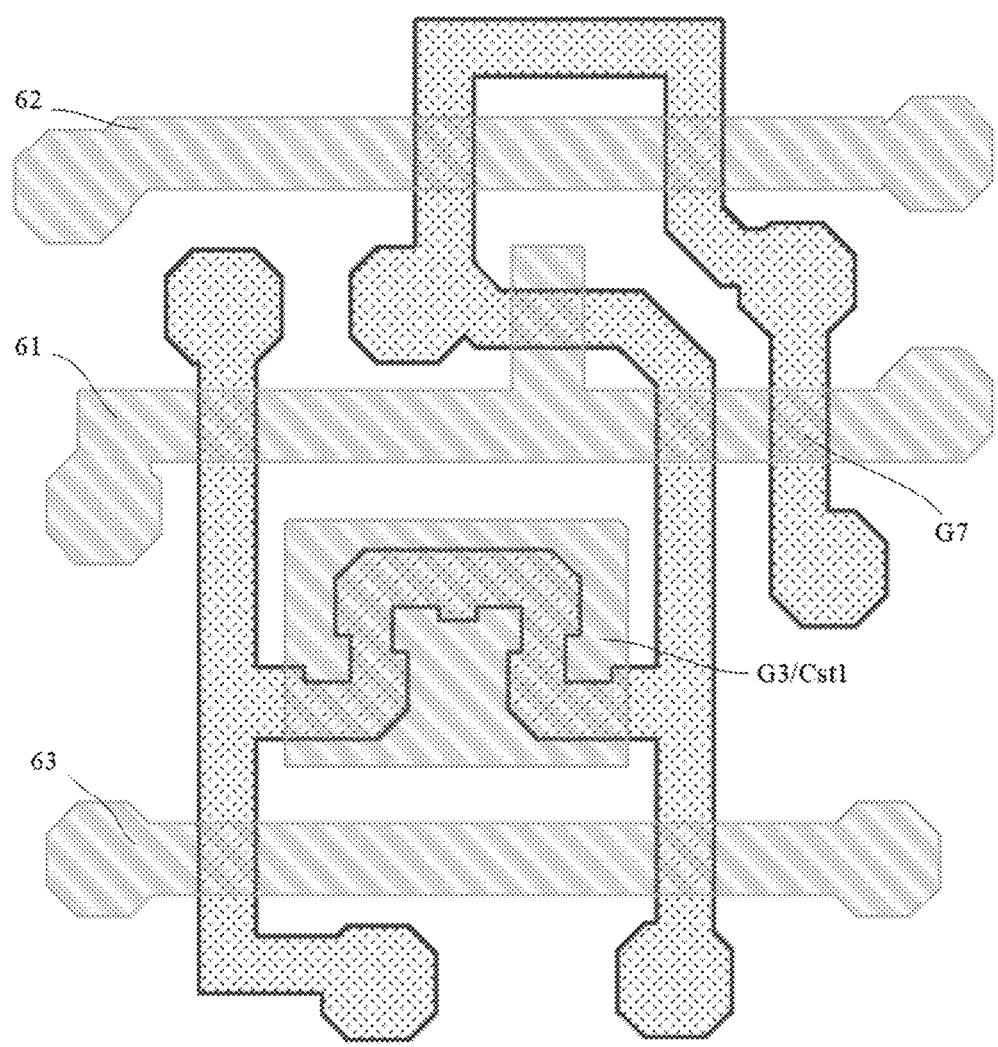
FIG. 17 shows a plan view of a combination of a semiconductor layer and a first conductive layer of an exemplary embodiment of a sub-pixel included in a repeating unit in FIG. 15A.
Figure 18:
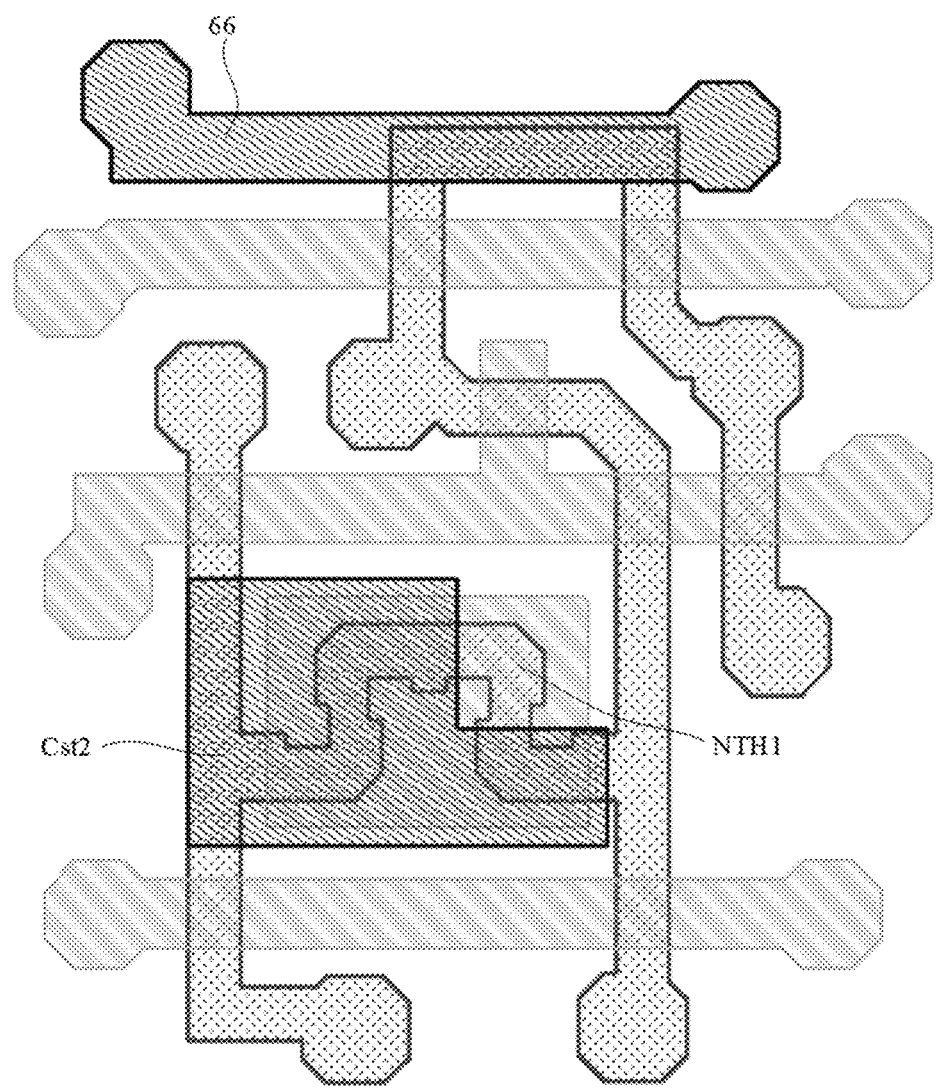
FIG. 18 shows a plan view of a combination of a semiconductor layer, a first conductive layer, and a second conductive layer of an exemplary embodiment of a sub-pixel included in a repeating unit in FIG. 15A.
Figure 19:
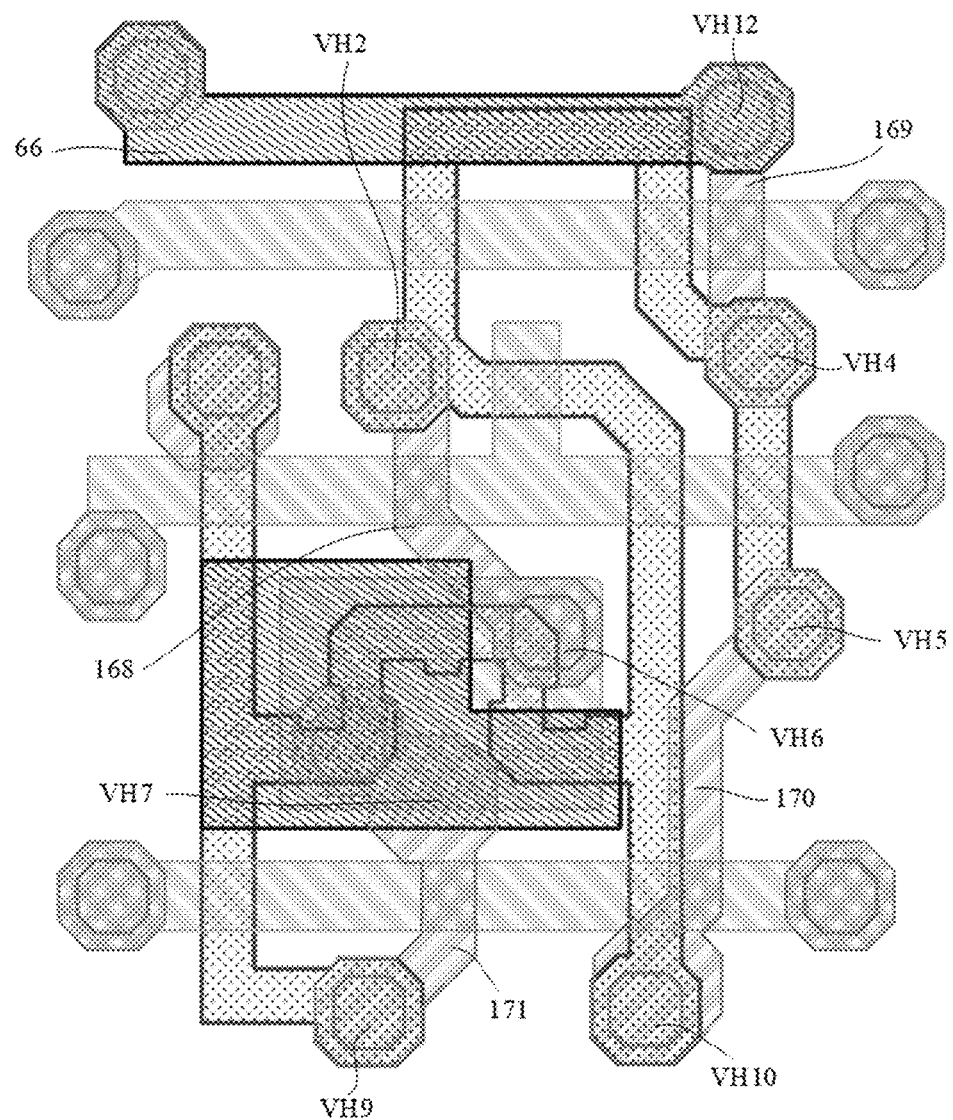
FIG. 19 shows a plan view of a combination of a semiconductor layer, a first conductive layer, a second conductive layer, and a third conductive layer of an exemplary embodiment of a sub-pixel included in a repeating unit in FIG. 15A.
Figure 20A:
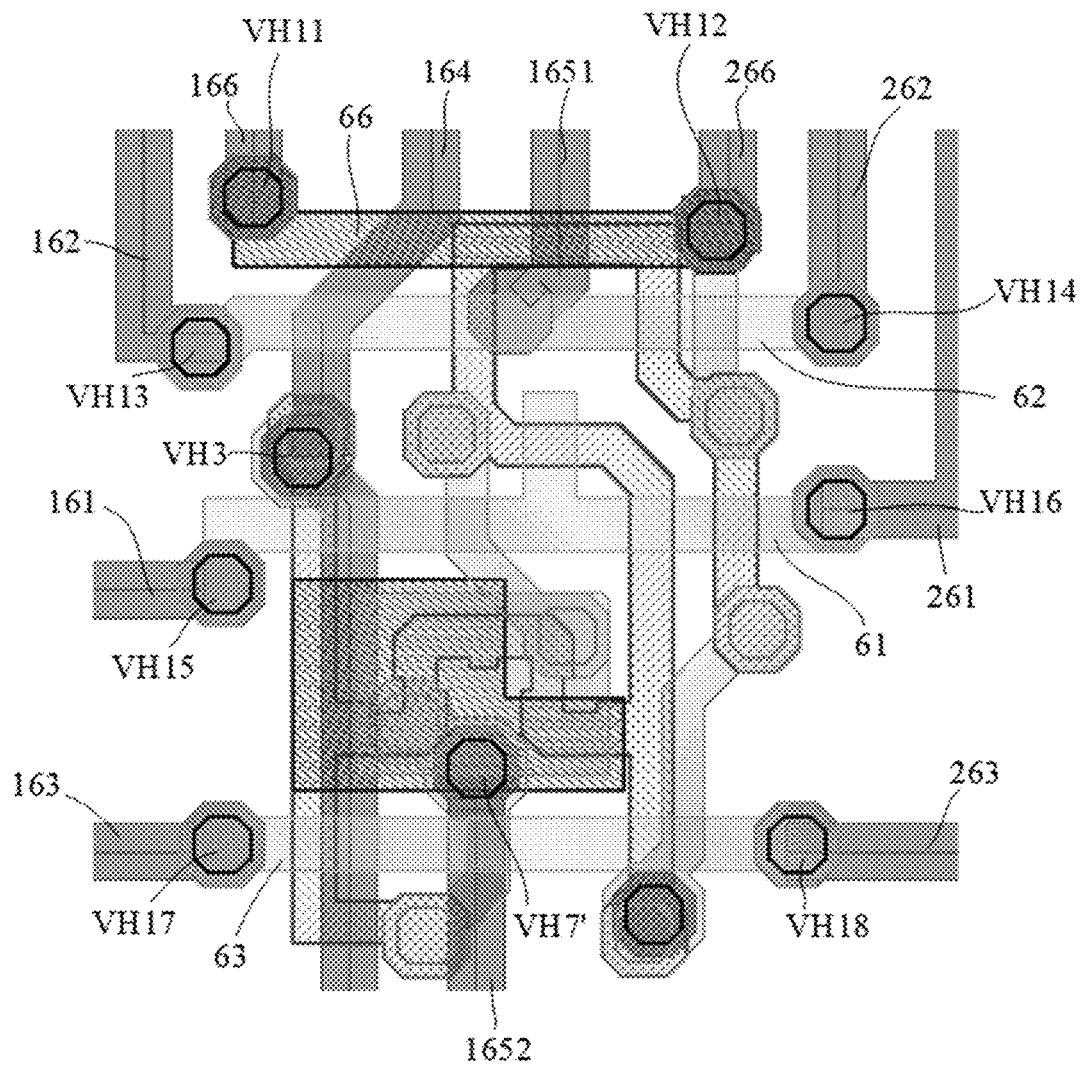
FIG. 20A shows a plan view of a combination of a semiconductor layer, a first conductive layer, a second conductive layer, a third conductive layer, and a transparent conductive layer of an exemplary embodiment of a sub-pixel included in a repeating unit in FIG. 15A.
Figure 20B:
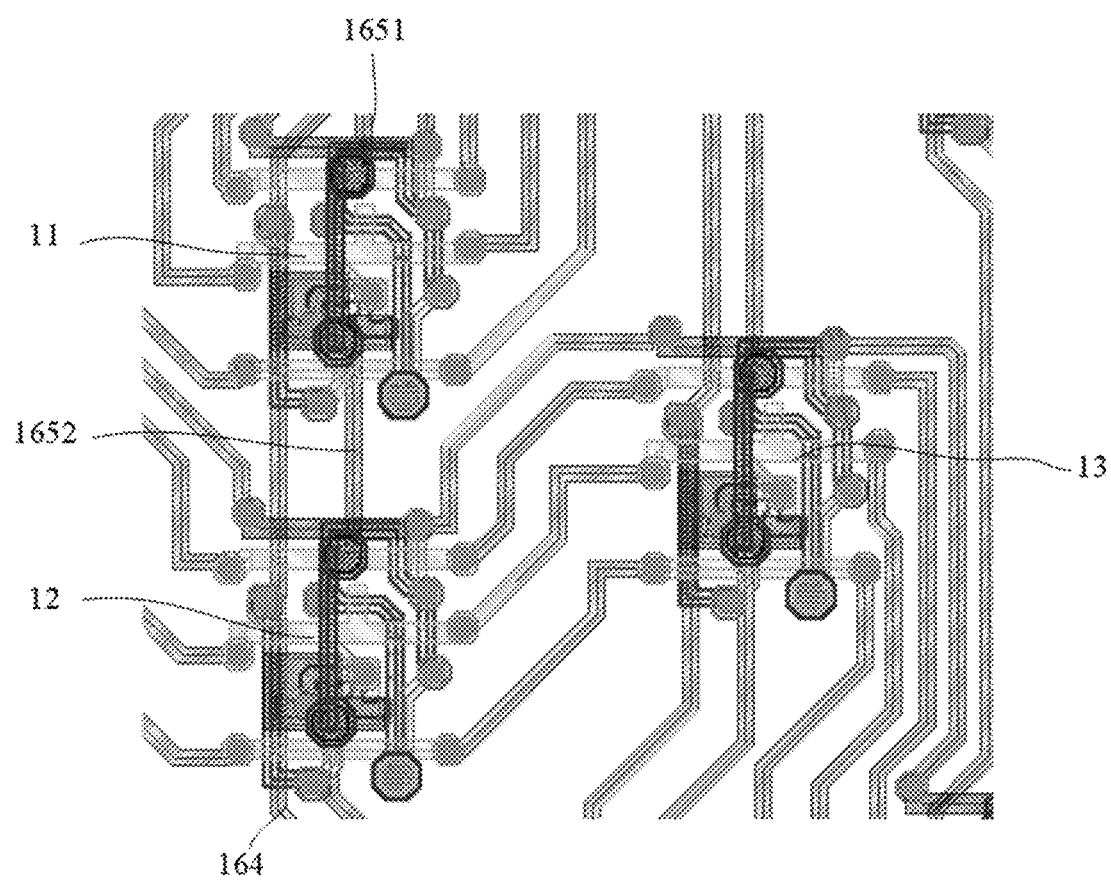
FIG. 20B shows a plan view of a combination of a semiconductor layer, a first conductive layer, a second conductive layer, a third conductive layer, and a transparent conductive layer of an exemplary embodiment of three sub-pixels included in a repeating unit in FIG. 15A.
Figure 21:
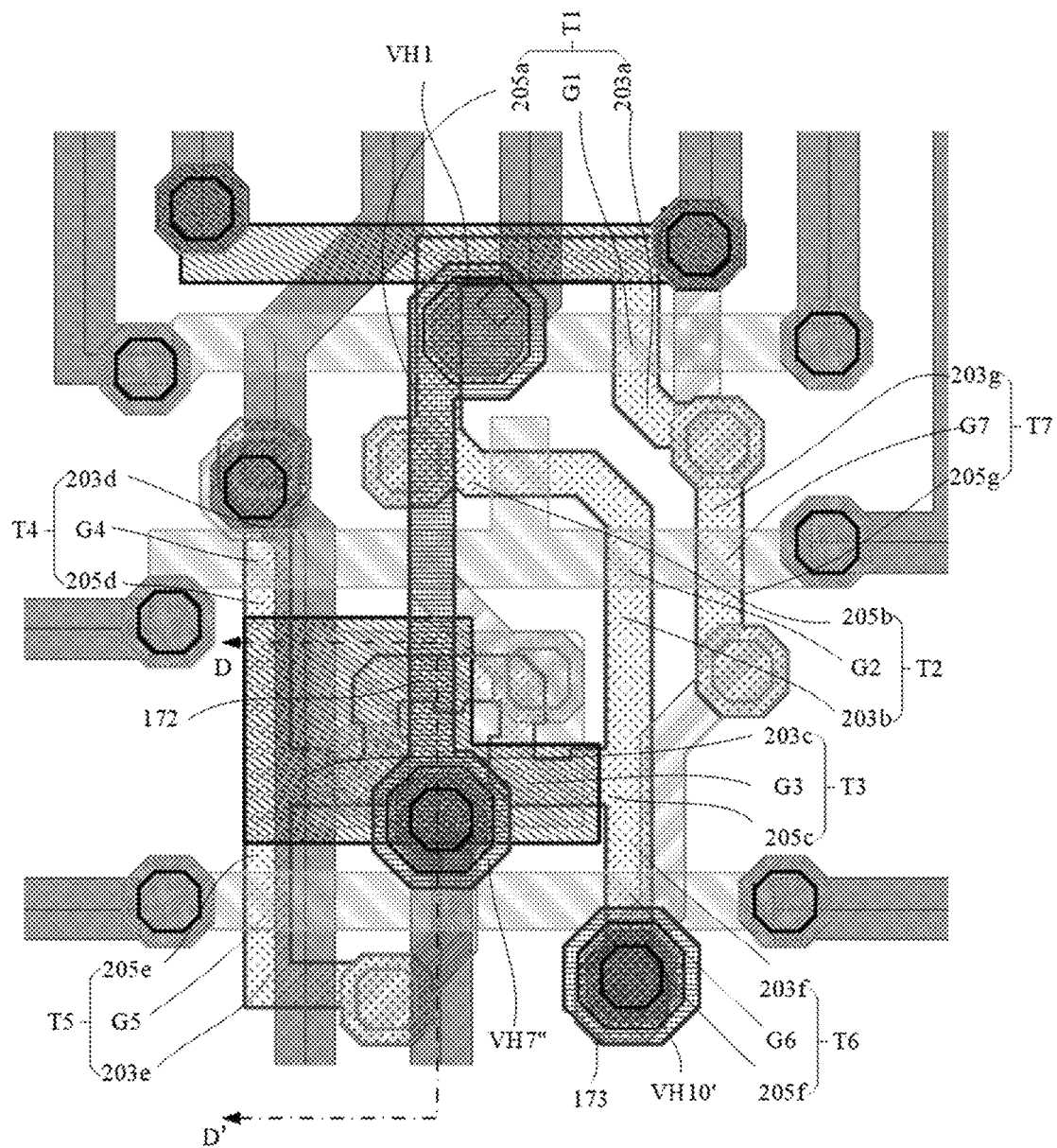
FIG. 21 shows a plan view of a combination of a semiconductor layer, a first conductive layer, a second conductive layer, a third conductive layer, a transparent conductive layer and a fourth conductive layer of an exemplary embodiment of a sub-pixel included in a repeating unit in FIG. 15A.
Figure 22A:
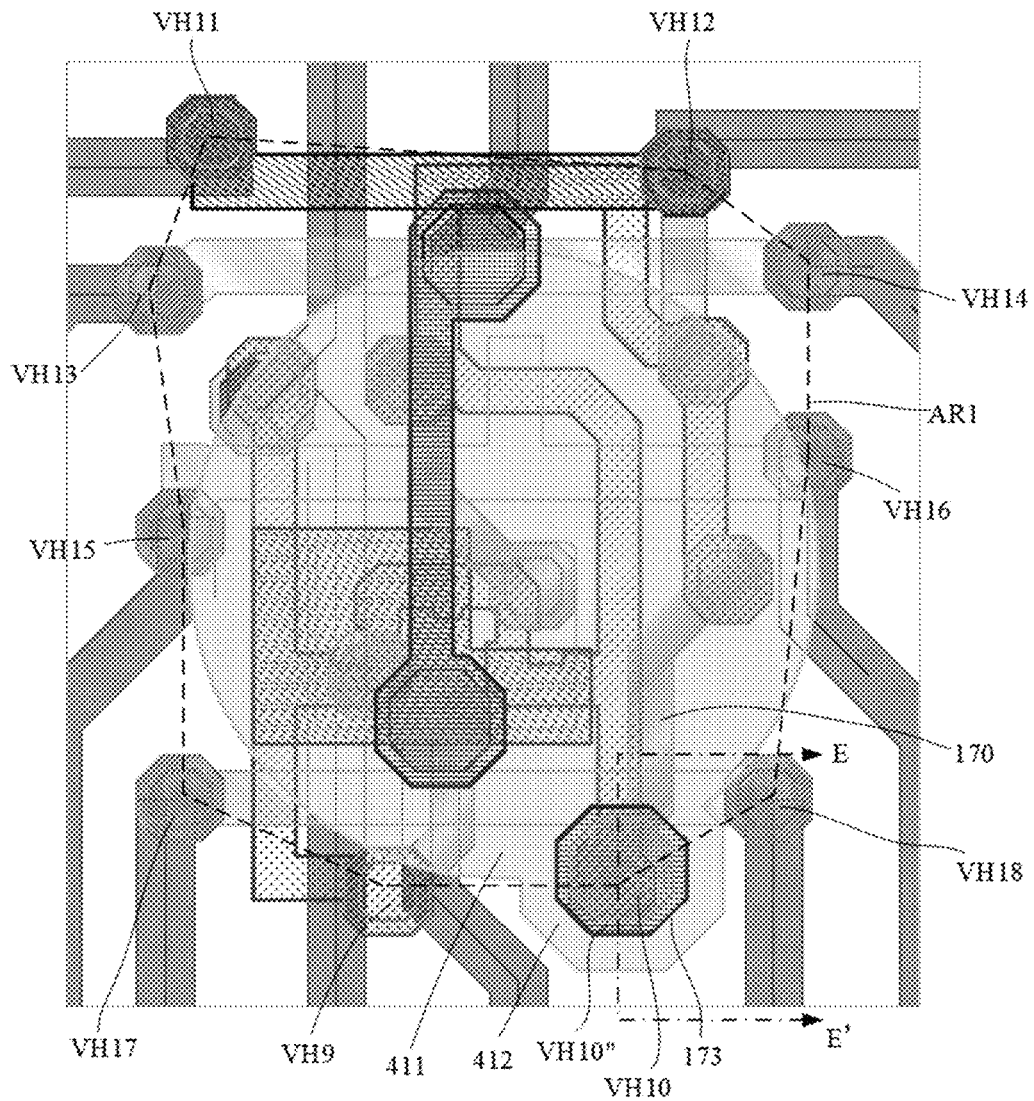
FIGS. 22A, 22B, and 22C respectively show plan views of combinations of a semiconductor layer, a first conductive layer, a second conductive layer, a third conductive layer, a transparent conductive layer, a fourth conductive layer and a fifth conductive layer of exemplary embodiments of three sub-pixels included in a repeating unit in FIG. 15A.
Figure 22B:
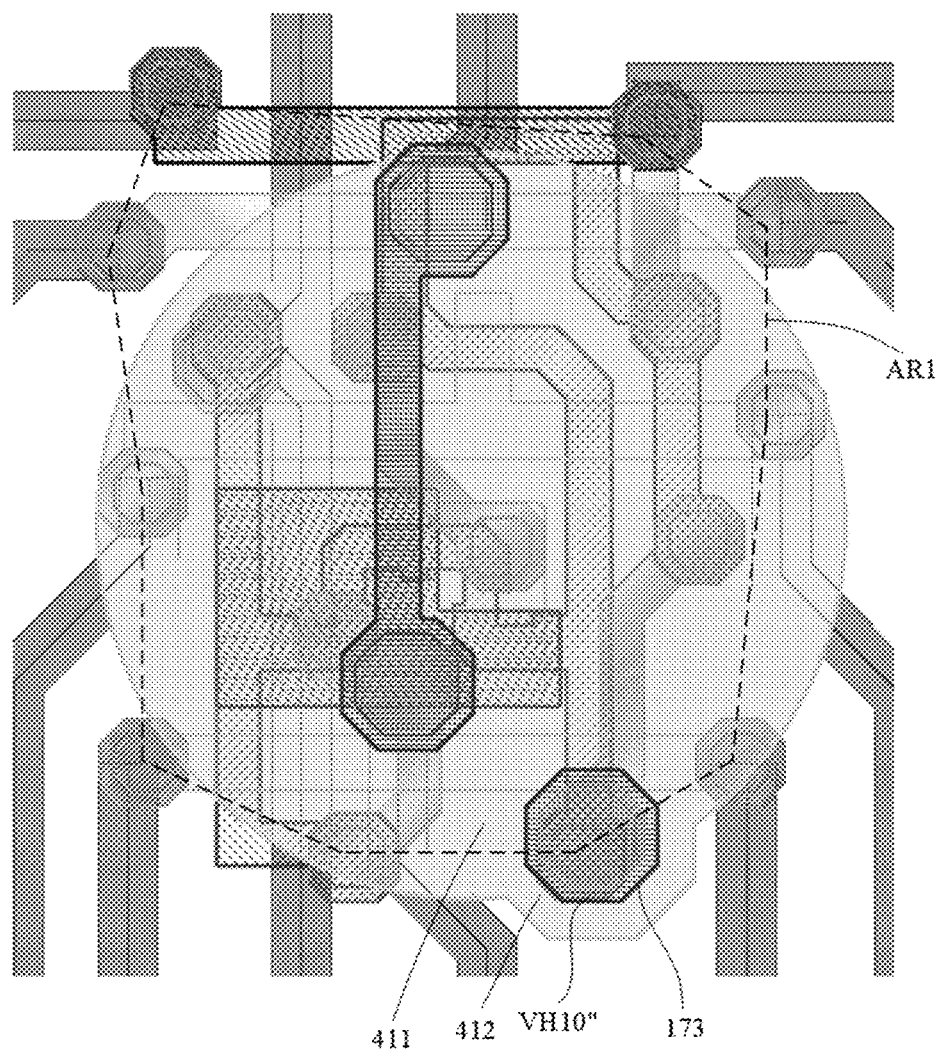
Figure 22C:
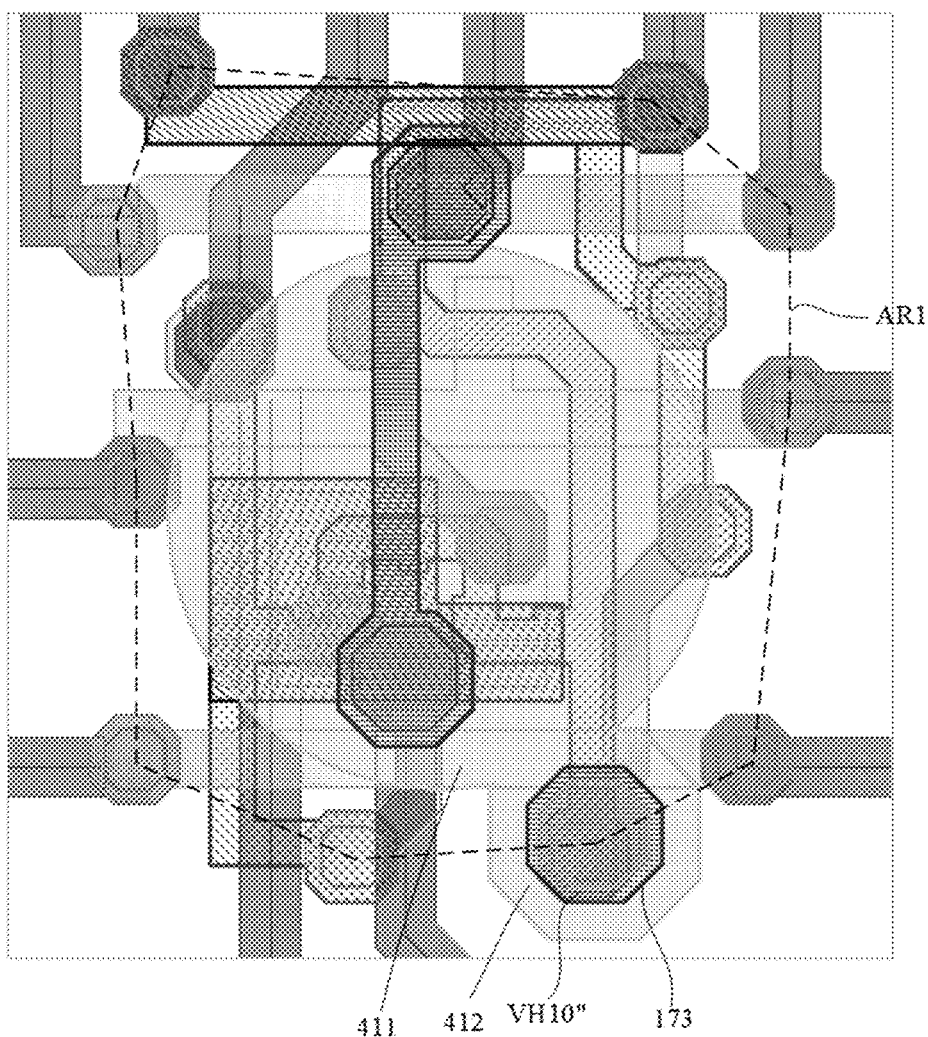
Figure 23:
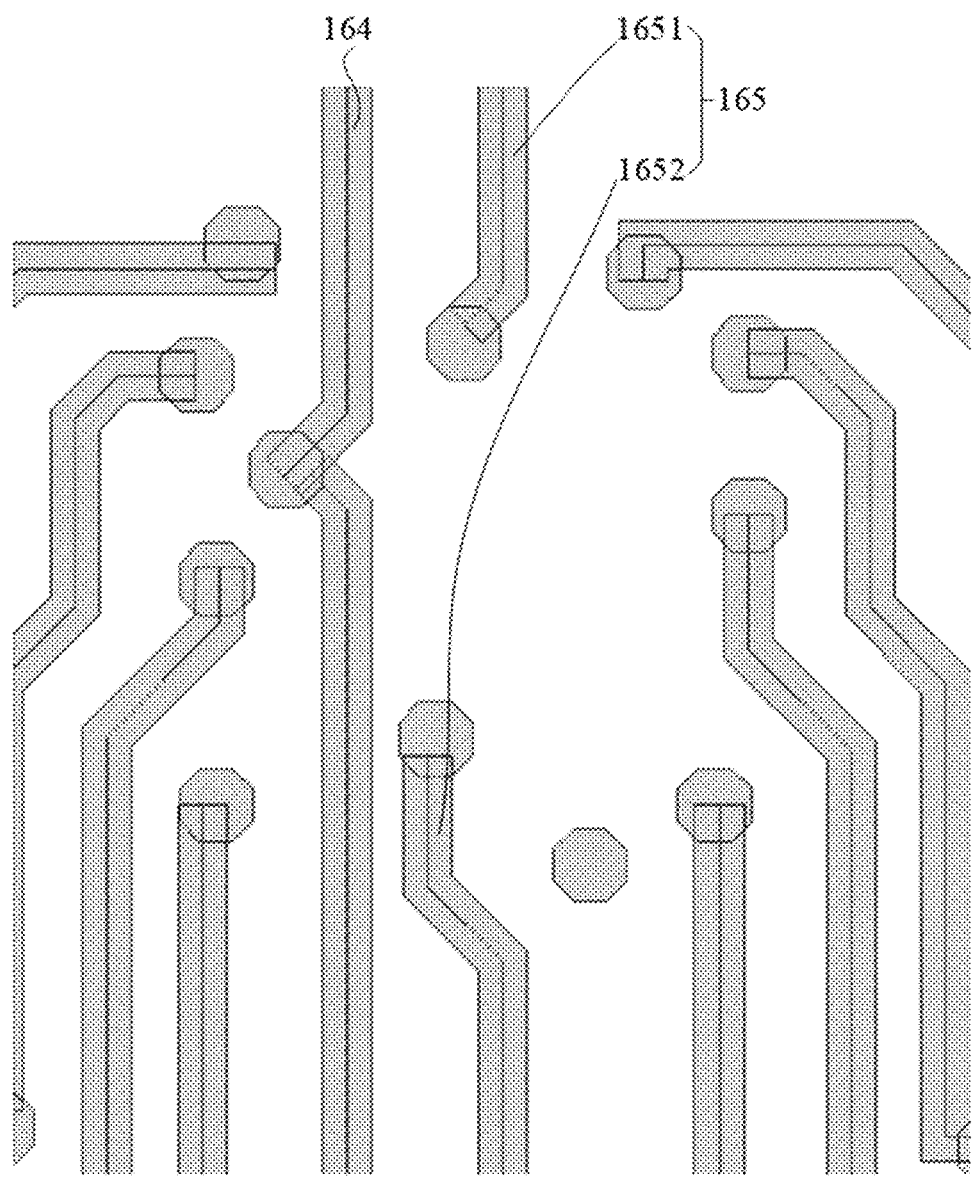
FIG. 23 shows a plan view of a transparent conductive layer of an exemplary embodiment of a sub-pixel included in a repeating unit in FIG. 15A.
Figure 24:
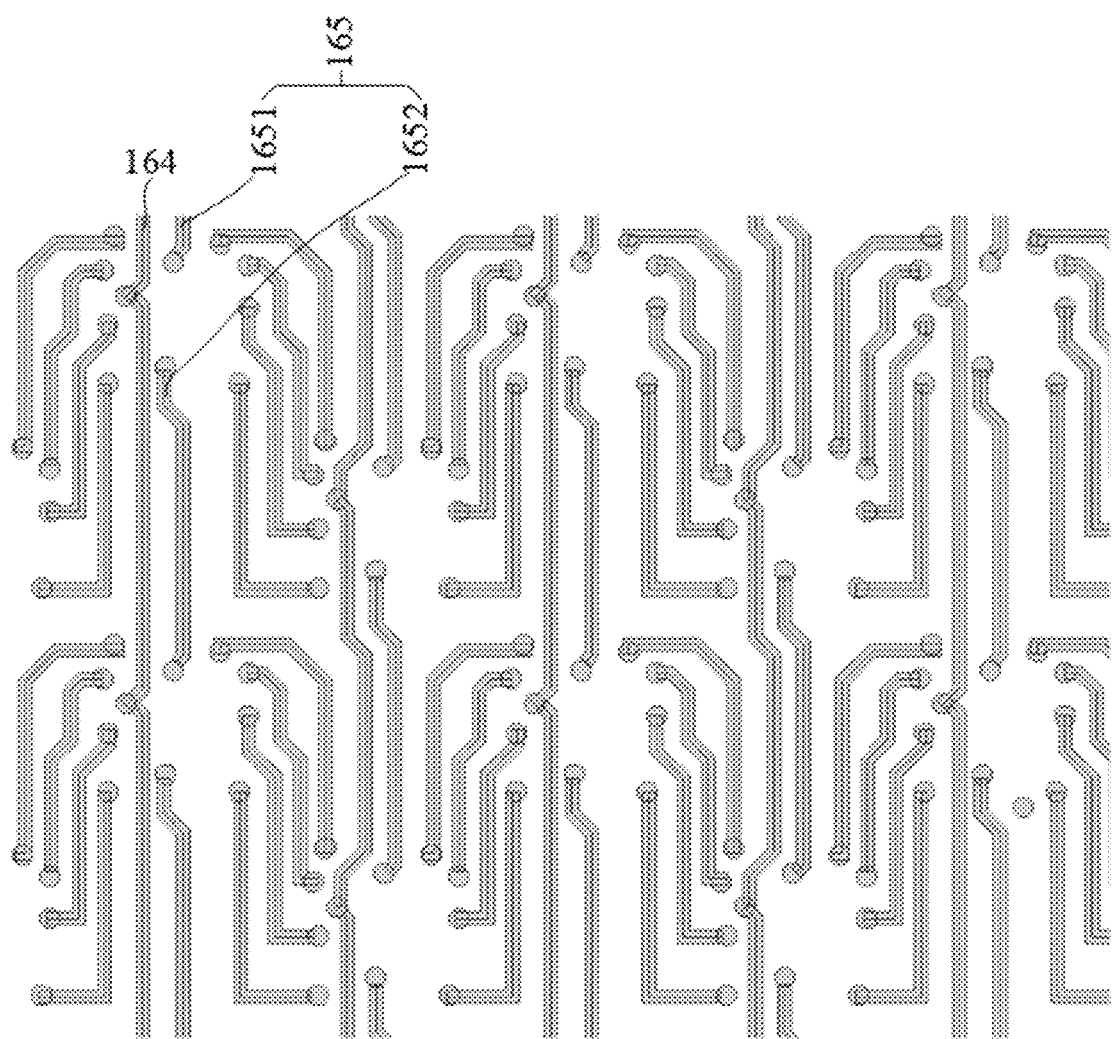
FIG. 24 shows a plan view of a transparent conductive layer of an exemplary embodiment of a repeating unit in FIG. 15A.
Figure 25A:
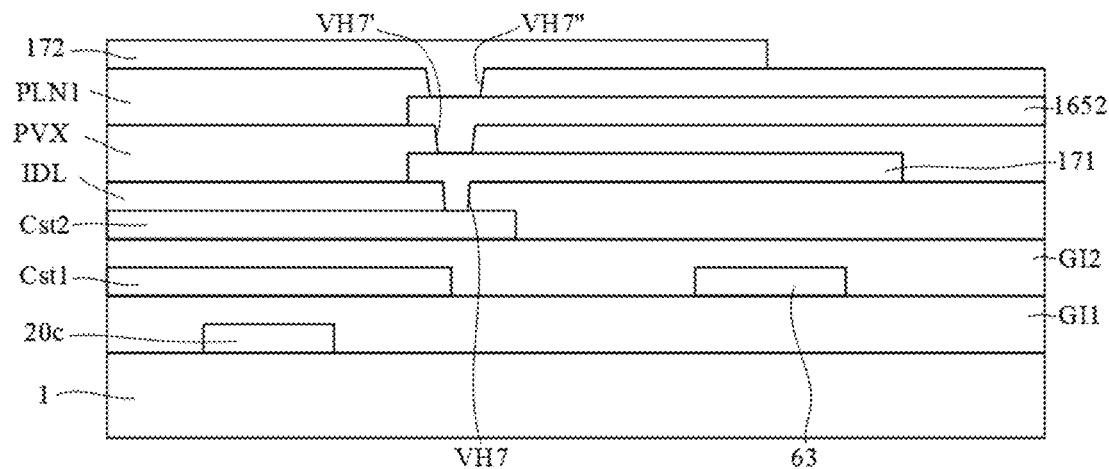
FIG. 25A shows a schematic diagram of a cross-sectional structure of a display substrate taken along a line DD' in FIG. 21, according to some exemplary embodiments of the present disclosure.
Figure 25B:
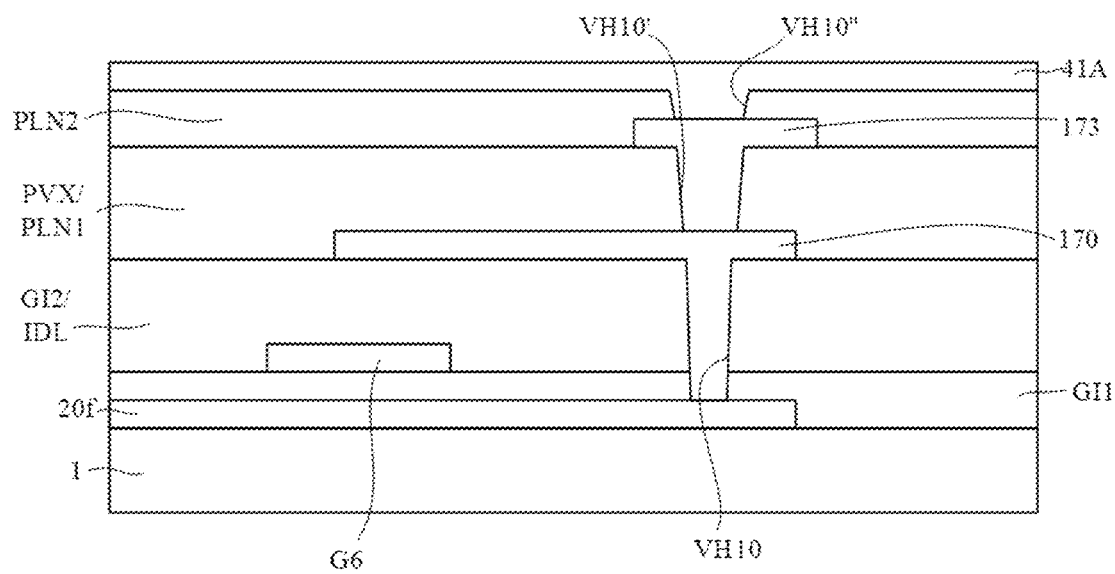
FIG. 25B shows a schematic diagram of a cross-sectional structure of a display substrate taken along a line EE' in FIG. 22A, according to some exemplary embodiments of the present disclosure.

FIG. 6B shows an equivalent circuit diagram of a pixel driving circuit of a sub-pixel in a first display region of a display substrate according to some exemplary embodiments of the present disclosure. FIG. 15A shows a plan view of an exemplary embodiment of a sub-pixel in a first display region AA1 of a display substrate according to some exemplary embodiments of the present disclosure, in which a plan view of a repeating unit in the first display region AA1 is schematically illustrated. FIG. 16 shows a plan view of a semiconductor layer of an exemplary embodiment of a sub-pixel included in a repeating unit in FIG. 15A. FIG. 17 shows a plan view of a combination of a semiconductor layer and a first conductive layer of an exemplary embodiment of a sub-pixel included in a repeating unit in FIG. 15A. FIG. 18 shows a plan view of a combination of a semiconductor layer, a first conductive layer and a second conductive layer of a sub-pixel included in a repeating unit in FIG. 15A. FIG. 19 shows a plan view of a combination of a semiconductor layer, a first conductive layer, a second conductive layer and a third conductive layer of an exemplary embodiment of a sub-pixel included in a repeating unit in FIG. 15A. FIG. 20A shows a plan view of a combination of a semiconductor layer, a first conductive layer, a second conductive layer, a third conductive layer and a transparent conductive layer of an exemplary embodiment of a sub-pixel included in a repeating unit in FIG. 15A. FIG. 20B shows a plan view of a combination of a semiconductor layer, a first conductive layer, a second conductive layer, a third conductive layer and a transparent conductive layer of an exemplary embodiment of 3 sub-pixels included in a repeating unit in FIG. 15A. FIG. 21 shows a plan view of a combination of a semiconductor layer, a first conductive layer, a second conductive layer, a third conductive layer, a transparent conductive layer and a fourth conductive layer of an exemplary embodiment of a sub-pixel included in a repeating unit in FIG. 15A. FIGS. 22A, 22B and 22C respectively show plan views of combinations of a semiconductor layer, a first conductive layer, a second conductive layer, a third conductive layer, a transparent conductive layer, a fourth conductive layer and a fifth conductive layer of exemplary embodiments of three sub-pixels included in a repeating unit in FIG. 15A. FIG. 23 shows a plan view of a transparent conductive layer of an exemplary embodiment of a sub-pixel included in a repeating unit in FIG. 15A. FIG. 24 shows a plan view of a transparent conductive layer of an exemplary embodiment of a repeating unit in FIG. 15A. FIG. 25A shows a schematic diagram of a cross-sectional structure of a display substrate taken along a line CC' in FIG. 21, according to some exemplary embodiments of the present disclosure. FIG. 25B shows a schematic diagram of a cross-sectional structure of a display substrate taken along a line DD' in FIG. 22A, according to some exemplary embodiments of the present disclosure.

It should be noted that, in the following description, a difference between a structure of a sub-pixel located in the first display region AA1 and a structure of a sub-pixel located in the second display region AA2 are mainly described, and for their similarities, the above description may be referred to.

It should also be noted that, in order to make the description of the present disclosure more concise, in the following, elements having the same or similar functions and/or structures in the first display region and the second display region may be indicated by the same reference signs. For example, a transistor, storage capacitor and signal line located in the first display region may be respectively indicated by reference signs indicating a transistor, a storage capacitor and signal line located in the second display region. It should be understood that, in the following description, these elements are located in the first display region AA1.

With reference to FIGS. 6B and 15A to 25B, in the first display region AA1, a pixel driving circuit in the sub-pixels 11, 12, and 13 may include: a plurality of thin film transistors and a storage capacitor Cst. The pixel driving circuit is used to drive an organic light-emitting diode (i.e., OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The plurality of signal lines include: a scan signal line 61 for transmitting a scan signal Sn, and a reset signal line 62 for transmitting a reset control signal RESET (for example, the reset control signal RESET may be a scan signal of a previous row), a light-emitting control line 63 for transmitting a light-emitting control signal En, a data signal line 164 for transmitting a data signal Dm, a driving voltage line 165 for transmitting a driving voltage VDD, an initialization voltage line 66 for transmitting an initialization voltage Vint, and a reference voltage line 67 for transmitting a VSS voltage.

It should be understood that, similar to the above-mentioned second display region AA2, in the embodiments of the present disclosure, in the first display region AA1, the display substrate further includes a pixel defining layer on a side of the first electrode away from the pixel driving circuit. The pixel defining layer includes a plurality of openings, each sub-pixel corresponds to at least one opening (for example, one) in the pixel defining layer, and an actual light-emitting region or a display region of a sub-pixel is substantially equivalent to an opening in the pixel defining layer corresponding to the sub-pixel. In some embodiments, an area of an opening in the pixel defining layer corresponding to each sub-pixel or the actual light-emitting region of each sub-pixel is less than an area of the first electrode (such as an anode), and a projection of the opening in the pixel defining layer or the actual light-emitting region on the base substrate completely falls within a projection of the first electrode on the base substrate.

As shown in FIGS. 15A and 22A to 22C, each sub-pixel located in the first display region AA1 may include a light-emitting device (such as an OLED). For ease of description, a light-emitting device located in the first display region AA1 is referred to as a first light-emitting device 41. For example, the first light-emitting device 41 may include an anode 41A (with reference to FIG. 25B), a light-emitting material layer and a cathode that are stacked. It should be noted that, for clarity, the related drawings schematically show the first light-emitting device 41 using the anode of the first light-emitting device 41, thereby schematically illustrating the sub-pixel located in the first display region AA1. For example, in the first display region AA1, the anode of the first light-emitting device 41 includes an anode body portion 411 and an anode connection portion 412. An orthographic projection of the anode body portion 411 on the base substrate 1 may have a regular shape, such as a circle, an oval, a rectangle, a hexagon, an octagon, and a rounded rectangle. The first display region AA1 is further provided with a pixel driving circuit (to be described below) for driving the first light-emitting device 41, and the anode connection portion 412 is electrically connected to a pixel driving circuit of the first light-emitting device 41.

Figure 27:
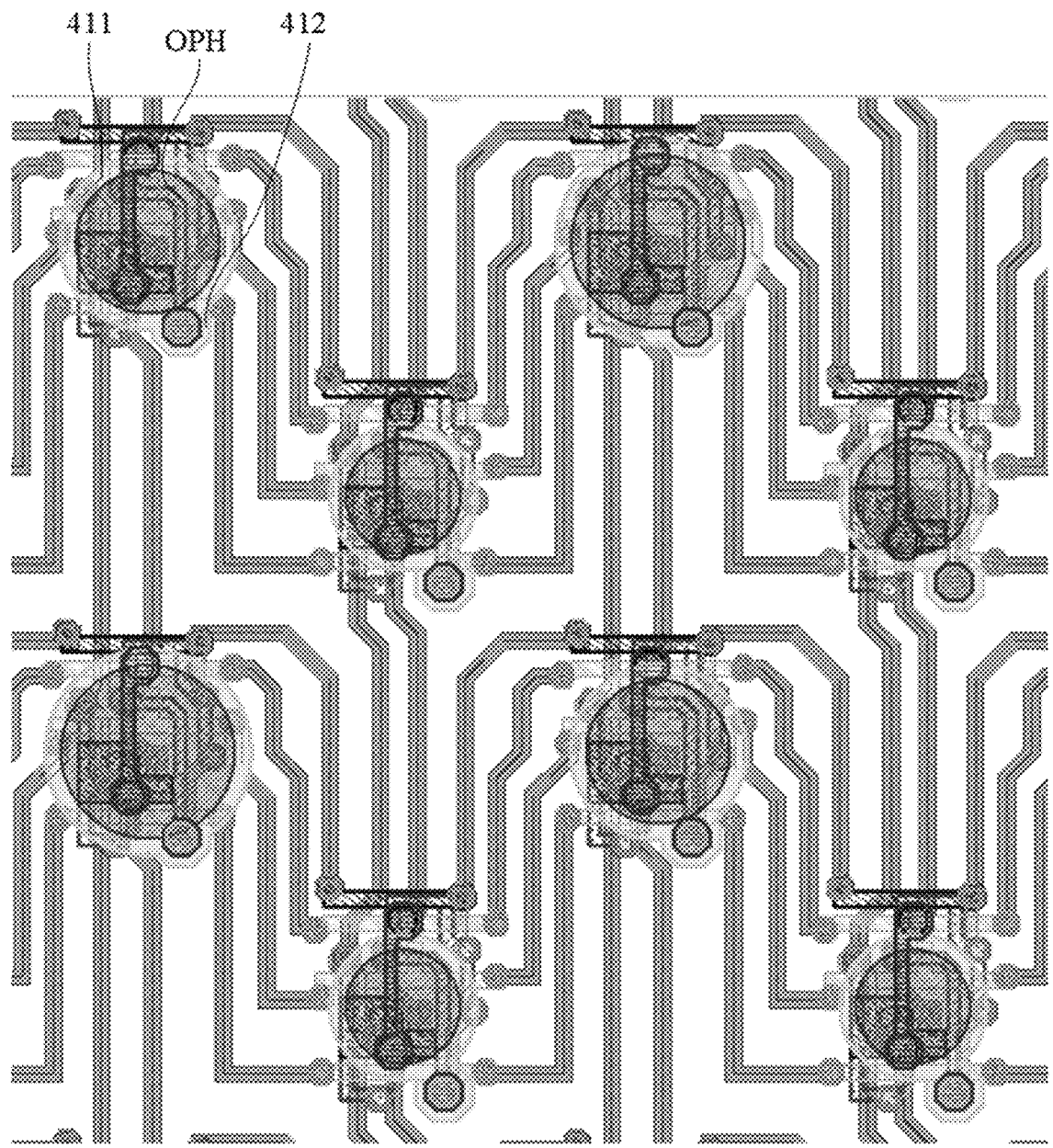
FIG. 27 shows a plan view of an exemplary embodiment of a sub-pixel in a first display region AA1 of a display substrate according to some exemplary embodiments of the present disclosure, and schematically shows a plan view of a repeating unit in the first display region and an opening in a pixel defining layer and an anode.

FIG. 27 shows a plan view of an exemplary embodiment of a sub-pixel in a first display region AA1 of a display substrate, according to some exemplary embodiments of the present disclosure, in which a plan view of a repeating unit in the first display region AA1 is schematically illustrated, and an opening in a pixel defining layer and an anode are schematically illustrated.

Referring to FIGS. 15A and 27, an opening in the pixel defining layer and an anode are schematically illustrated. Similar to the anode body portion, an orthographic projection of an opening OPH on the base substrate 1 may have a regular shape, such as a circle, an oval, a rectangle, a hexagon, an octagon, and a rounded rectangle. A projection of the opening OPH on the base substrate 1 completely falls within a projection of the anode body portion 411 on the base substrate 1.

It should be noted that, for ease of illustration, in the embodiments of the present disclosure, an approximate position and an approximate shape of the first electrode (such as an anode) of the sub-pixel are mainly illustrated to represent a distribution of each sub-pixel.

For example, in some embodiments of the present disclosure, an arrangement of the sub-pixels in each repeating unit may refer to a conventional pixel arrangement, such as GGRB, RGBG, RGB, etc., which is not limited in the embodiments of the present disclosure.

Similar to the second repeating unit P2, referring to FIG. 15A, the first repeating unit P1 may include a plurality of sub-pixels arranged in 4 rows and 4 columns. In a first row, a first sub-pixel 11 and a second sub-pixel 12 are arranged in a first column and a third column, respectively. In a second row, two third sub-pixels 13 are arranged in a second column and a fourth column, respectively. In a third row, a second sub-pixel 12 and a first sub-pixel 11 are arranged in the first column and the third column, respectively. In a fourth row, two third sub-pixels 13 are arranged in the second column and the fourth column, respectively.

It should be noted that, the arrangement of sub-pixels shown in FIG. 15A is only an exemplary arrangement of some embodiments of the present disclosure, rather than a limitation on the embodiments of the present disclosure. In other embodiments, the sub-pixels may be arranged in other ways.

Referring to FIGS. 15A to 25B, the display substrate includes a base substrate 1 and a plurality of film layers arranged on the base substrate 1. In some embodiments, the plurality of film layers include at least a semiconductor layer 20, a first conductive layer 21, a second conductive layer 22, a third conductive layer 23, a transparent conductive layer 26, a fourth conductive layer 24, and a fifth conductive layer 25. The semiconductor layer 20, the first conductive layer 21, the second conductive layer 22, the third conductive layer 23, the transparent conductive layer 26, the fourth conductive layer 24, and the fifth conductive layer 25 are arranged away from the base substrate 1 sequentially. The plurality of film layers further include at least a plurality of insulating film layers. For example, the plurality of insulating film layers may include a first gate insulating layer GI1, a second gate insulating layer GI2, an interlayer insulating layer IDL, a passivation layer PVX and a planarization layer PLN. The first gate insulating layer GI1 may be arranged between the semiconductor layer 20 and the first conductive layer 21, the second gate insulating layer GI2 may be arranged between the first conductive layer 21 and the second conductive layer 22, and the interlayer insulating layer IDL may be arranged between the second conductive layer 22 and the third conductive layer 23, and the passivation layer PVX may be arranged between the third conductive layer 23 and the first transparent conductive layer 26. For example, the planarization layer PLN may include a plurality of film layers, which are respectively referred to as a first planarization layer PLN1, a second planarization layer PLN2 and a third planarization layer PLN3 for ease of description. In some embodiments, the first planarization layer PLN1 may be arranged between the first transparent conductive layer 26 and the fourth conductive layer 24, the second planarization layer PLN2 may be arranged between the fourth conductive layer 24 and the second transparent conductive layer 28, and the third planarization layer PLN3 may be arranged between the second transparent conductive layer 28 and the fifth conductive layer 25.

The first transistor T1, the second transistor T2, the third transistor T3, the fourth transistor T4, the fifth transistor T5, the sixth transistor T6, and the seventh transistor T7 may be formed along an active layer as shown in FIG. 16. The active layer may have a curved or bent shape, and may include the first active layer 20a corresponding to the first transistor T1, the second active layer 20b corresponding to the second transistor T2, and the third active layer 20c corresponding to the third transistor T3, the fourth active layer 20d corresponding to the fourth transistor T4, the fifth active layer 20e corresponding to the fifth transistor T5, the sixth active layer 20f corresponding to the sixth transistor T6, and the seventh active layer 20g corresponding to the seventh transistor T7.

Referring to FIGS. 8 and 16, for a sub-pixel, the active layers of the first transistor T1, the second transistor T2, the third transistor T3, the fourth transistor T4, the fifth transistor T5, the sixth transistor T6 and the seventh transistor T7 are formed as a continuously extending portion in the semiconductor layer 20. Herein, "continuously extending" means that there is no disconnection in this portion.

Referring to FIGS. 8 and 16, the active layer 20g of the seventh transistor T7 is connected to the active layer 20a the first transistor T1, the active layer 20a of the first transistor T1 is connected to the active layer 20b of the second transistor T2, the active layer 20b of the second transistor T2 is connected to the active layer 20c of the third transistor T3 and the active layer 20f of the sixth transistor T6, and the active layer 20c of the third transistor T3 is connected to the active layer 20d of the fourth transistor T4 and the active layer 20e of the fifth transistor T5.

Referring to FIG. 9, for a sub-pixel located in the second display region AA2, the active layer 20g of the seventh transistor T7 extends from the active layer 20a of the first transistor T1 in a direction away from the scan signal line 61 of the sub-pixel, that is, the active layer 20g of the seventh transistor T7 is located at the upper right of the active layer 20a of the first transistor T1. Through such arrangement, the active layer 20g of the seventh transistor T7 may extend toward an active layer of an upper adjacent sub-pixel in the same column, so that the active layers of the sub-pixels located in the same column are formed to be a continuous extending structure.

Referring to FIGS. 16 and 17, for a sub-pixel located in the first display region AA1, the active layer 20g of the seventh transistor T7 extends from the active layer 20a of the first reset transistor T1 in a direction close to the scan signal line 61 of the sub-pixel, that is, the active layer 20g of the seventh transistor T7 is located at the lower right of the active layer 20a of the first transistor T1. Through such arrangement, an occupied region of the active layer of the sub-pixel in the first display region AA1 has an outline of a square or a substantially square.

In the present disclosure, the expression "occupied region" represents a largest region covered by an orthographic projection of a pattern, a layer structure, or the like on the base substrate. Specifically, the orthographic projection of the pattern, the layer structure, or the like on the base substrate has two sides farthest apart in the first direction X and two sides farthest apart in the second direction Y, and extension lines of these four sides will cross to form a region, which is the occupied region of the pattern, the layer structure, or the like.

Specifically, referring to FIGS. 8 and 16, for a sub-pixel located in the second display region AA2, an occupied region of the active layer of the sub-pixel has a rectangular or substantially rectangular shape. As shown in FIG. 8, the occupied region of the active layer of a sub-pixel located in the second display region AA2 is schematically illustrated using a dashed box, and the occupied region has a size (i.e., a width W2) in the first direction X and a size (i.e., a length L2) in the second direction Y, and the length L2 is greater than the width W2, or in other words, the length L2 is greater than 1.2 times the width W2. That is, the occupied region has a rectangular shape.

For a sub-pixel located in the first display region AA1, the occupied region of the active layer of the sub-pixel has a square or substantially square shape. As shown in FIG. 16, the occupied region of the active layer of the sub-pixel in the first display region AA1 is schematically illustrated using a dashed box, and the occupied region has a size (i.e., a width W1) in the first direction X and a size (i.e., a length L1) in the second direction Y, and the length L1 is substantially equal to the width W1.

In the embodiments of the present disclosure, an area of an occupied region of an active layer of a sub-pixel located in the first display region AA1 is less than that of an occupied region of an active layer of a sub-pixel of a same color located in the second display region AA2. In this way, an area of the occupied region of the pixel driving circuit of the sub-pixel located in the first display region AA1 may be reduced, which will be described in further detail below.

Similarly, as shown in FIG. 17, the scan signal line 61, the reset signal line 62, and the light-emitting control line 63 are located in the first conductive layer 21. The gates G1 to G7 of the above-mentioned transistors are also located in the first conductive layer 21. The first storage capacitor electrode Cst1 is also located in the first conductive layer 21.

Referring to FIGS. 6B and 17, parts where the scan signal line 61 overlaps the semiconductor layer 20 respectively form the gate G2 of the second transistor T2 and the gate G4 of the fourth transistor T4, and other part where the scan signal line 61 overlaps the semiconductor layer 20 further forms the gate G7 of the seventh transistor T7. In the embodiments of the present disclosure, in the first display region AA1, the scan signal Sn is provided to each of the gates of the seventh transistor T7, the second transistor T2, and the fourth transistor T4.

As shown in FIG. 18, the initialization voltage line 66 and the second storage capacitor electrode Cst2 are located in the second conductive layer 22.

Referring to FIG. 10, for a sub-pixel located in the second display region AA2, the second storage capacitor electrode Cst2 includes a through hole TH2, and an orthographic projection of a combination of a physical part of the second storage capacitor electrode Cst2 and the through hole TH2 on the base substrate 1 is in a shape of a rectangle or a rounded rectangle.

Referring to FIG. 18, for a sub-pixel located in the first display region AA1, the second storage capacitor electrode Cst2 has a notch NTH1 at a corner, that is, an orthographic projection of the second storage capacitor electrode Cst2 on the base substrate 1 has an "L" shape. In other words, an orthographic projection of a combination of a physical part of the second storage capacitor electrode Cst2 and the notch NTH1 on the base substrate 1 is in a shape of a rectangle or a rounded rectangle.

The notch NTH1 exposes a part of the first storage capacitor electrode Cst1 which is located under the second storage capacitor electrode Cst2, so that the first storage capacitor electrode Cst1 is electrically connected with other parts.

In the embodiments of the present disclosure, an area of an orthographic projection of a second storage capacitor electrode Cst2 of a sub-pixel located in the first display region AA1 on the base substrate 1 is less than an area of an orthographic projection of a second storage capacitor electrode Cst2 of a sub-pixel located in the second display region AA2. On this basis, the second storage capacitor electrode Cst2 of the sub-pixel located in the first display region AA1 is designed into an "L" shape, without forming the through hole in the second storage capacitor electrode Cst2, so that it is ensured that an overlapping area of the first storage capacitor electrode Cst1 and the second storage capacitor electrode Cst2 of the sub-pixel in the first display region AA1 is relatively large, that is, a capacitance value of the storage capacitor Cst is ensured.

As shown in FIG. 19, a connection portion 168, a connection portion 169, a connection portion 170, and a connection portion 171 are located in the third conductive layer 23.

A part of the connection portion 168 is formed in a via hole VH6, and this part extends downward to be electrically connected to a part of the first storage capacitor electrode Cst1 exposed by the notch NTH1. Another part of the connection portion 168 is formed in the via hole VH2, and the another part extends downward to be electrically connected to the drain D2 of the second transistor T2 and the drain D1 of the first transistor T1. Through the connection portion 168, the first storage capacitor electrode Cst1, the drain D2 of the second transistor T2 and the drain D1 of the first transistor T1 may be electrically connected, that is, the node N1 shown in FIG. 6B is formed.

A part of the connection portion 169 is formed in a via hole VH12, and extends downward to be electrically connected with the initialization voltage line 66. Another part of the connection portion 169 is formed in a via hole VH4, and extends downward to be electrically connected to the drain D7 of the seventh transistor T7. Through the connection part 169, the initialization voltage Vint transmitted by the initialization voltage line 66 may be provided to the drain D7 of the seventh transistor T7.

A part of the connection portion 170 is formed in a via hole VH5, and extends downward to be electrically connected to the source S7 of the seventh transistor T7. Another part of the connection portion 170 is formed in a via hole VH10, and extends downward to be electrically connected to the drain D6 of the sixth transistor T6. Through the connection portion 170, the source S7 of the seventh transistor T7 and the drain D6 of the sixth transistor T6 may be electrically connected, that is, the node N4 shown in FIG. 6B is formed.

A part of the connection portion 171 is formed in a via hole VH7, and extends downward to be electrically connected to the second storage capacitor electrode Cst2. Another part of the connection portion 171 is formed in a via hole VH9, and extends downward to be electrically connected to the source S5 of the fifth transistor T5. Through the connection portion 171, the second storage capacitor electrode Cst2 may be electrically connected to the source S5 of the fifth transistor T5.

Referring to FIGS. 20A, 20B, 23, 24 and 25A, in the first display region AA1, a transparent conductive layer 26 is provided. For example, the transparent conductive layer 26 may be made of a transparent conductive material such as indium tin oxide (i.e., ITO).

In the first display region AA1, the data signal line 164 and the driving voltage line 165 are located in the transparent conductive layer 26. That is, the data signal line 164 and the driving voltage line 165 are made of a transparent conductive material such as indium tin oxide (i.e., ITO). The display substrate may further include a plurality of conductive wires located in the transparent conductive layer 26. For example, the plurality of conductive wires may include a first conductive wire 161, a second conductive wire 162, a third conductive wire 163, a fourth conductive wire 266, a fifth conductive wire 163, a sixth conductive wire 263, a seventh conductive wire 166 and an eighth conductive wire

266. That is, these conductive wires are each made of a transparent conductive material such as indium tin oxide (i.e., ITO).

A part of the data signal line 164 is formed in a via hole VH3, and extends downward to be electrically connected to the source S4 of the fourth transistor T4, so that the data signal Dm transmitted by the data signal line 164 is provided to the fourth transistor T4.

The driving voltage line 165 is disconnected at the pixel driving circuit of the sub-pixel in the first display region AA1, and is divided into two parts. For ease of description, the two parts are denoted as a first driving voltage sub-line 1651 and a second driving voltage sub-line 1652, respectively.

For example, an orthographic projection of the first driving voltage sub-line 1651 on the base substrate 1 crosses an orthographic projection of the initialization voltage line 66 on the base substrate 1, and the orthographic projection of the first driving voltage sub-line 1651 on the base substrate 1 at least partially overlaps an orthographic projection of the reset signal line 62 on the base substrate 1.

For another example, an orthographic projection of the second driving voltage sub-line 1652 on the base substrate 1 crosses an orthographic projection of the light-emitting control line 63 on the base substrate 1, and the orthographic projection of the second driving voltage sub-line 1652 on the base substrate 1 at least partially overlaps an orthographic projection of the second storage capacitor electrode Cst2 on the base substrate 1. A part of the second driving voltage sub-line 1652 is formed in a via hole VH7', and extends downward to be electrically connected to a part of the connection portion 171, so as to be electrically connected to the second storage capacitor electrode Cst2. In this way, an electrical connection between the driving voltage line, the second storage capacitor electrode Cst2 and the source S5 of the fifth transistor T5 may be realized.

The first driving voltage sub-line 1651 and the second driving voltage sub-line 1652 are spaced apart from each other by a certain distance in the second direction Y. For example, an orthographic projection of an end of the first driving voltage sub-line 1651 close to the second driving voltage sub-line 1652 on the base substrate 1 partially overlaps the orthographic projection of the reset signal line 62 on the base substrate 1, and an orthographic projection of an end of the second driving voltage sub-line line 1652 close to the first driving voltage sub-line 1651 on the base substrate 1 overlaps an orthographic projection of a part of the second storage capacitor electrode Cst2 close to the light-emitting control line 63 on the base substrate 1. The first driving voltage sub-line 1651 and the second driving voltage sub-line 1652 that are spaced apart from each other are electrically connected together by a connection portion, which will be described in detail below.

In the first display region AA1, in each sub-pixel, the scan signal line 61, the reset signal line 62, the light-emitting control line 63 and the initialization voltage line 66 that extend in the first direction X are electrically connected through the conductive wires in the transparent conductive layer. In this way, in a light-transmitting region of the first display region AA1, only the transparent conductive wires are arranged, and a conductive wire made of an opaque material such as a metal is not arranged. In this way, it may be ensured that the light transmittance of the first display region AA1 is relatively great.

Specifically, the first conductive wire 161 and the second conductive wire 261 are respectively arranged on both sides of the scan signal line 61 of the sub-pixel. A part of the first conductive wire 161 is formed in a via hole VH15, and extends downward to be electrically connected to one end of the scan signal line 61. A part of the second conductive wire 261 is formed in a via hole VH16, and extends downward to be electrically connected to the other end of the scan signal line 61. The scan signal lines 61 of sub-pixels in a same row may be electrically connected through the first conductive wire 161 and the second conductive wire 261, so as to provide the scan signal Sn.

The third conductive wire 162 and the fourth conductive wire 262 are respectively arranged on both sides of the reset signal line 62 of the sub-pixel. A part of the third conductive wire 162 is formed in a via hole VH13, and extends downward to be electrically connected to one end of the reset signal line 62. A part of the fourth conductive wire 262 is formed in a via hole VH14, and extends downward to be electrically connected to the other end of the reset signal line 62. The reset signal lines 62 of the sub-pixels in a same row can be electrically connected through the third conductive wire 162 and the fourth conductive wire 262, so as to provide the reset signal Reset.

The fifth conductive wire 163 and the sixth conductive wire 263 are respectively arranged on both sides of the light-emitting control line 63 of the sub-pixel. A part of the fifth conductive wire 163 is formed in a via hole VH17, and extends downward to be electrically connected to one end of the light-emitting control line 63. A part of the sixth conductive wire 263 is formed in a via hole VH18, and extends downward to be electrically connected to the other end of the light-emitting control line 63. The light-emitting control lines 63 of the sub-pixels in a same row may be electrically connected through the fifth conductive wire 163 and the sixth conductive wire 263, so as to provide the light-emitting control signal Em.

A seventh conductive wire 166 and an eighth conductive wire 266 are respectively arranged on both sides of the initialization voltage line 66 of the sub-pixel. A part of the seventh conductive wire 166 is formed in a via hole VH11, and extends downward to be electrically connected to one end of the initialization voltage line 66. A part of the eighth conductive wire 266 is formed in a via hole VH12, and extends downward to be electrically connected to the other end of the initialization voltage line 66. The initialization voltage lines 66 of the sub-pixels in a same row may be electrically connected through the seventh conductive wire 166 and the eighth conductive wire 266, so as to provide the light-emitting initialization voltage signal Vinit.

It should be noted that, in the above-mentioned embodiment, the conductive wires used for electrically connecting the various signal lines (for example, the scan signal line 61, the reset signal line 62, the light-emitting control line 63, and the initialization voltage line 66) extending in the first direction X, and the various signal lines (for example, the data signal line 164 and the driving voltage line 165) extending in the second direction Y are located in the transparent conductive layer 26, that is, they are located in the same transparent conductive layer 26. However, the embodiments of the present disclosure are not limited thereto. For example, at least one of the conductive wires for electrically connecting the various signal lines (for example, the scan signal line 61, the reset signal line 62, the light-emitting control line 63, and the initialization voltage line 66) extending in the first direction X may be located in the transparent conductive layer 26, at least one of the conductive wires used for electrically connecting the various signal lines (for example, the scan signal line 61, the reset signal line 62, the light-emitting control line 63, and the initialization voltage line 66) extending in the first direction X may also be located in another transparent conductive layer different from the transparent conductive layer 26. For example, in some exemplary embodiments, the display substrate may include at least two transparent conductive layers arranged on the base substrate, and the conductive wires for electrically connecting the various signal lines extending in the first direction X may be arranged in one transparent conductive layer, and the various signal lines extending in the second direction Y may be located in another transparent conductive layer; alternatively, at least some of the conductive wires used for electrically connecting the various signal lines extending in the first direction X and the various signal lines extending in the second direction Y may be arranged in at least one transparent conductive layer, and at least some others of the conductive wires used for electrically connecting the various signal lines extending in the first direction X and the various signal lines extending in the second direction Y may be located in other transparent conductive layer(s). For example, the other transparent conductive layer(s) here may include a conductive layer in which the anode of the light-emitting device is located.

It should also be noted that in the above-mentioned embodiment, the various signal lines (for example, the scan signal line 61, the reset signal line 62, the light-emitting control line 63 and the initialization voltage line 66) extending in the first direction X are electrically connected through the conductive wires located in the transparent conductive layer. However, the embodiments of the present disclosure are not limited thereto. For example, at least one of the various signal lines extending in the first direction X may be electrically connected through a conductive wire located in a transparent conductive layer. For example, at least another signal line of the various signal lines extending in the first direction X may be electrically connected through a conductive wire located in another transparent conductive layer different from the transparent conductive layer 26. For example, the plurality of conductive wires may be located in different transparent conductive layers, for example, the first conductive wire 161 and the second conductive wire 261 may be located in the first transparent conductive layer; the third conductive wire 162 and the fourth conductive wire 262 may be located in the second transparent conductive layer; the fifth conductive wire 163 and the sixth conductive wire 263 may be located in the third transparent conductive layer; and the seventh conductive wire 166 and the eighth conductive wire 266 may be located in the fourth transparent conductive layer.

It should also be noted that in the above-mentioned embodiment, the transparent conductive layer 26 is located between the third conductive layer 23 and the fourth conductive layer 24. However, the embodiments of the present disclosure are not limited thereto. For example, the transparent conductive layer 26 may be located between the first conductive layer 21 and the base substrate, or between the first conductive layer 21 and the second conductive layer 22, or between the second conductive layer 22 and the third conductive layer 23. As described above, the display substrate may include at least two transparent conductive layers arranged on the base substrate, for example, one transparent conductive layer may be located between the first conductive layer 21 and the second conductive layer 22, and another transparent conductive layer may be located between the third conductive layer 23 and the fourth conductive layer 24.

In the embodiments of the present disclosure, at least one of the scan signal line, the reset signal line, the light-emitting control line, the initialization voltage line, the data signal line, or the driving voltage line in the first display region AA1 may have a line width less than or equal to a line width of a signal line used for transmitting the same type of signal in the second display region AA2.

For example, a line width of a data signal line 164 in the first display region AA1 may be less than or substantially equal to a line width of a data signal line 64 in the second display region AA2. For example, a line width of a data signal line 164 in the first display region AA1 may be within a range of 1.5 micrometers to 3 micrometers, and a line width of a data signal line 64 in the second display region AA2 may be within a range of 2.5 micrometers to 4 micrometers.

For example, a line width of a driving voltage line 165 in the first display region AA1 may be less than or substantially equal to a line width of a driving voltage line 65 in the second display region AA2. For example, a line width of a driving voltage line 165 in the first display region AA1 may be within a range of 2 micrometers to 5 micrometers, and a line width of a driving voltage line 65 in the second display region AA2 may be within a range of 4 micrometers to 7 micrometers.

For example, a line width of a scan signal line 61 in the first display region AA1 may be less than or substantially equal to a line width of a scan signal line 61 in the second display region AA2. For example, a line width of a scan signal line 61 located in the first display region AA1 may be within a range of 2 micrometers to 3 micrometers, and a line width of a scan signal line 61 in the second display region AA2 may be within a range of 3 micrometers to 4 micrometers.

For example, a line width of an initialization voltage line 66 in the first display region AA1 may be less than or substantially equal to a line width of an initialization voltage line 66 in the second display region AA2. For example, a line width of an initialization voltage line 66 in the first display region AA1 may be within a range of 2 micrometers to 3 micrometers, and a line width of an initialization voltage line 66 in the second display region AA2 may be within a range of 3 micrometers to 6 micrometers.

In the embodiments of the present disclosure, a width-to-length ratio of each of transistors T1~T7 of a pixel driving circuit in the first display region AA1 may be substantially equal to a width-to-length ratio of a same type of transistor in transistors T1~T7 of a pixel driving circuit in the second display region AA2. The embodiments of the present disclosure are not limited thereto. For example, a width-to-length ratio of each of transistors T1 to T7 of a pixel driving circuit in the first display region AA1 may be less than a width-to-length ratio of a same type of transistor in transistors T1~T7 of a pixel driving circuit in the second display region AA2.

For example, a width-to-length ratio of a transistor T3 of a pixel driving circuit in the first display region AA1 may be substantially equal to a width-to-length ratio of a transistor T3 of a pixel driving circuit in the second display region AA2. For example, a width-to-length ratio of a transistor T3 of a pixel driving circuit in the first display region AA1 and a width-to-length ratio of a transistor T3 of a pixel driving circuit in the second display region AA2 may be within a range of (2 to 4)/(20 to 26).

For example, a width-to-length ratio of a transistor T4 of a pixel driving circuit in the first display region AA1 may be substantially equal to a width-to-length ratio of a transistor T4 of a pixel driving circuit in the second display region AA2. For example, a width-to-length ratio of a transistor T4 of a pixel driving circuit in the first display region AA1 and a width-to-length ratio of a transistor T4 of a pixel driving circuit in the second display region AA2 may be within a range of (2 to 3)/(2 to 4).

As shown in FIG. 21, a connection portion 172 and a conductive connection portion 173 are located in the fourth conductive layer 24.

A part of the connection portion 172 is formed in a via hole VH1, and extends downward to be electrically connected to the first driving voltage sub-line 1651. Another part of the connection portion 172 is formed in a via hole VH7", and extends downward to be electrically connected to the second driving voltage sub-line 1652. That is, the first driving voltage sub-line 1651 and the second driving voltage sub-line 1652 may be electrically connected through the connection portion 172, in this way, the driving voltage lines of the sub-pixels in a same column may be connected, so as to provide the driving voltage signal VDD to each sub-pixel.

A part of the conductive connection portion 173 is formed in a via hole VH10' and the via hole VH10' exposes a part of the connection portion 170, and the conductive connection portion 173 may be electrically connected to the connection portion 170.

As shown in FIGS. 22A, 22B and 22C, the first electrode (such as an anode) of the first light-emitting device 41 may be located in the fifth conductive layer 25. As described above, the anode of the first light-emitting device 41 includes the anode body portion 411 and the anode connection portion 412.

A part of the anode connection portion 412 may be formed in a via hole VH10", and the via hole VH10" exposes a part of the conductive connection portion 173, so that the anode connection portion 412 is electrically connected to the conductive connection portion 173 and then connected to the connection portion 170. That is, through the conductive connection portion 173 and the connection portion 170, the anode of the first light-emitting device 41, the source S7 of the seventh transistor T7, and the drain D6 of the sixth transistor T6 may be electrically connected, that is, the node N4 shown in FIG. 6B is formed.

For example, FIGS. 22A, 22B, and 22C respectively show plan views of the first sub-pixel 11, the second sub-pixel 12, and the third sub-pixel 13. As shown in FIGS. 22A, 22B and 22C, in the first display region AA1, a pixel driving circuit of each of the first sub-pixel 11, the second sub-pixel 12, and the third sub-pixel 13 may be substantially reduced to a size of the first light-emitting device 41, and may be arranged under the light-emitting device 41. In the first display region AA1 (i.e., the under-screen imaging region), the pixel driving circuit of each sub-pixel may be built into a corresponding sub-pixel, and there is no need to externally arrange the pixel driving circuit in the spacing region SR, which may avoid the above-mentioned various problems caused by the external pixel driving circuit. Moreover, in the embodiments of the present disclosure, the pixel driving circuit of each sub-pixel is built in the corresponding sub-pixel and hidden under the light-emitting device of the corresponding sub-pixel, which may ensure that the light transmittance of the first display region is relatively great, and which is beneficial to achieve the high light transmittance of the first display region. Referring to FIG. 4, in the first display region AA1, there is a light-transmitting region TRA between adjacent sub-pixels. As the pixel driving circuit of each sub-pixel may be substantially reduced to the size of the first light-emitting device 41 and arranged under the light-emitting device 41, it is beneficial to achieve a relatively large area of the light-transmitting region TRA, thereby ensuring the light transmittance of the first display region is relatively great. In addition, in the light-transmitting region TRA, only transparent conductive wires are provided, and there is no opaque wire, therefore, it may be further ensured that the light transmittance of the first display region is relatively great.

In the embodiments of the present disclosure, in a light-transmitting region TRA, an opaque conductive wire may also be used to electrically connect pixel driving circuits of sub-pixels in a same row among the plurality of sub-pixels in the first display region, and/or, be used to electrically connect pixel driving circuits of sub-pixels in a same column among the plurality of sub-pixels in the first display region. Referring to FIGS. 7 and 13, in the second display region AA2, an area of the occupied region of the pixel driving circuit in each of the sub-pixels 21, 22 and 23 is relatively large, and an area of the occupied region of the light-emitting device is relatively small.

In the present disclosure, for the second display region AA2, an occupied region of a pixel driving circuit in each of the sub-pixels 21, 22 and 23 may be represented by the following region. Referring to FIGS. 12A and 12B, for the pixel driving circuit of each of the sub-pixels 21, 22 and 23, in the first direction X, the data signal line 64 and the sixth active layer 20f of the sixth transistor T6 are respectively located on the leftmost side and the rightmost side, that is, a distance between the data signal line 64 and the sixth active layer 20f of the sixth transistor T6 in the first direction X is the largest; in the second direction Y, the initialization voltage line 66 and the light-emitting control line 63 are respectively located at the uppermost side and the lowermost side, that is, a distance between the initialization voltage line 66 and the light-emitting control line 63 in the second direction Y is the largest. For an orthographic projection of a pixel driving circuit of a sub-pixel on the base substrate, the data signal line 64 has a first side away from the sixth active layer 20f of the sixth transistor T6, and the sixth active layer 20f of the sixth transistor T6 has a second side away from the data signal line 64, the initialization voltage line 66 has a third side away from the light-emitting control line 63, and the light-emitting control line 63 has a fourth side away from the initialization voltage line 66. The first side and the second side extend in the second direction Y, and the third side and the fourth side extend in the first direction X. Extension lines of these four sides will cross to enclose and form a region, which is an occupied region of a pixel driving circuit of a sub-pixel in the second display region AA2, referring to the region AR2 enclosed by a dashed box shown in FIG. 12A.

In the present disclosure, for the first display region AA1, an occupied region of a pixel driving circuit in each of the sub-pixels 11, 12 and 13 may be represented by the following region. Referring to FIGS. 22A, 22B and 22C, for a pixel driving circuit of each of the sub-pixels 11, 12 and 13, in the first direction X, the active layer 20e of the fifth transistor T5 and the active layer 20g of the seventh transistor T7 are respectively located at the leftmost side and the rightmost side, that is, a distance between the active layer 20e of the fifth transistor T5 and the active layer 20g of the seventh transistor T7 in the first direction X is the largest; in the second direction Y, the initialization voltage line 66 and the light-emitting control line 63 are respectively located at the uppermost side and the lowermost side, that is, a distance between the initialization voltage line 66 and the light-emitting control line 63 in the second direction Y is the largest. For an orthographic projection of a pixel driving circuit of a sub-pixel on the base substrate, the active layer 20e of the fifth transistor T5 has a first side away from the active layer 20g of the seventh transistor T7, the active layer 20g of the seventh transistor T7 has a second side away from the active layer 20e of the fifth transistor T5, the initialization voltage line 66 has a third side away from the light-emitting control line 63, and the light-emitting control line 63 has a fourth side away from the initialization voltage line 66, and the first side and the second side extend in the second direction Y, and the third side and the fourth side extend in the first direction X. Extension lines of these four sides will cross to enclose and form a region, which is an occupied region of a pixel driving circuit of a sub-pixel in the first display region AA1. In other words, an occupied region of a pixel driving circuit of each of sub-pixels 11, 12 and 13 in the first display region AA1 may be represented by the following region. Referring to FIGS. 20A, 22A, 22B, and 22C, the via holes VH11, VH12, VH13, VH14, VH15, VH16, VH17 and VH18 are respectively located at the outermost side of the pixel driving circuit, and the via holes VH9 and VH10 are located at the outermost side of the pixel driving circuit. By connecting centers of every two adjacent via holes in the ten via holes sequentially, a region may be enclosed and formed. Referring to a region AR1 enclosed by a dashed box shown in FIGS. 22A, 22B and 22C, the region AR1 may be an occupied region of a pixel driving circuit of a sub-pixel in the first display region AA1.

In the present disclosure, unless otherwise specified, the occupied region of the light-emitting device of the sub-pixel in the second display region AA2 may be represented by a region covered by the orthographic projection of the anode of the light-emitting device on the base substrate. Similarly, the occupied region of the light-emitting device of the sub-pixel in the first display region AA1 may be represented by a region covered by the orthographic projection of the anode of the light-emitting device on the base substrate.

In the embodiments of the present disclosure, the PPI in the first display region AA1 is substantially equal to the PPI in the second display region. In other words, within a same area, a number of the first repeating units P1 arranged in the first display region AA1 is substantially equal to a number of the second repeating units P2 arranged in the second display region AA2. In other words, a number of sub-pixels arranged in the first display region AA1 is substantially equal to a number of sub-pixels of a same color arranged in the second display region AA2. In this way, both the first display region and the second display region may have relatively high PPI and display quality, and the display uniformity is relatively good.

In the present disclosure, unless otherwise specified, the expressions "substantially equal to", "substantially the same as", etc. may indicate that a ratio of two values to be compared is approximately equal to 1, for example, the ratio of the two values to be compared may range from 0.8 to 1.2.

In some embodiments, an area of an occupied region of a light-emitting device of each sub-pixel in the first display region AA1 is substantially the same as an area of an occupied region of a light-emitting device of a sub-pixel of a same color in the second display region AA2. For example, an area of an orthographic projection of an anode of a first light-emitting device 41 in a first sub-pixel 11 on the base substrate 1 is substantially equal to an area of an orthographic projection of an anode of a second light-emitting device 42 in a fourth sub-pixel 21 on the base substrate 1; an area of an orthographic projection of an anode of a first light-emitting device 41 in a second sub-pixel 12 on the base substrate 1 is substantially equal to an area of an orthographic projection of an anode of a second light-emitting device 42 in a fifth sub-pixel 22 on the base substrate 1; an area of an orthographic projection of an anode of a first light-emitting device 41 in a third sub-pixel 13 on the base substrate 1 is substantially equal to an area of an orthographic projection of an anode of a second light-emitting device 42 in a sixth sub-pixel 23 on the base substrate 1. Such arrangement is conducive to realize that the PPI in the first display region AA1 is substantial equal to the PPI in the second display region. In addition, the display uniformity between the first display region and the second display region is also relatively good, and the lifetime uniformity between a light-emitting material in the first display region and a light-emitting material in the second display region is also relatively good.

It should be noted that, the embodiments of the present disclosure are not limited to the above-mentioned embodiments. In other embodiments, the area of the occupied region of the light-emitting device in each sub-pixel in the first display region AA1 may also be different from the area of the occupied region of the light-emitting device in the sub-pixel of a same color in the second display region AA2, as long as the PPI in the first display region AA1 is substantially equal to the PPI in the second display region.

In the embodiments of the present disclosure, an occupied region of a pixel driving circuit of each of the sub-pixels 11, 12 and 13 in the first display region AA1 is reduced, which is conducive to hiding a pixel driving circuit of a sub-pixel in the first display region AA1 under a light-emitting device of the sub-pixel.

As described above, referring to FIG. 17, for a sub-pixel in the first display region AA1, the active layer 20g of the seventh transistor T7 extends in a direction close to the scan signal line 61 of the sub-pixel from the active layer 20a of the first transistor T1. That is, the active layer 20g of the seventh transistor T7 is located at the lower right of the active layer 20a of the first transistor T1. Through this arrangement, an outline of an occupied region of an active layer of a sub-pixel located in the first display region AA1 has a square or a substantially square shape. Referring to FIGS. 22A and 22C, an orthographic projection of an anode body portion of a first light-emitting device 41 in each of the sub-pixels 11, 12 and 13 on the base substrate is in a shape of a circle. Such arrangement is conducive to realizing that the anode of each sub-pixel covers the pixel driving circuit of the sub-pixel.

Specifically, referring to FIG. 22A, the orthographic projection of the anode of the first light-emitting device 41 in the first sub-pixel 11 on the base substrate 1 and an orthographic projection of an occupied region AR1 of the pixel driving circuit in the first sub-pixel 11 on the base substrate 1 at least partially overlap. For example, the orthographic projection of the anode of the first light-emitting device 41 in the first sub-pixel 11 on the base substrate 1 covers most of the orthographic projection of the occupied region AR1 of the pixel driving circuit in the first sub-pixel 11 on the base substrate 1. For example, the orthographic projection of the anode of the first light-emitting device 41 of the first sub-pixel 11 on the base substrate 1 covers more than 70%, even more than 80%, of the orthographic projection of the occupied region AR1 of the pixel driving circuit in the first sub-pixel 11 on the base substrate 1.

In the present disclosure, unless otherwise specified, the expression "most of the orthographic projection" means a part of a certain pattern whose orthographic projection on the base substrate is greater than 50% of a total area of the pattern.

Referring to FIG. 22B, the orthographic projection of the anode of the first light-emitting device 41 in the second sub-pixel 12 on the base substrate 1 and an orthographic projection of an occupied region AR1 of the pixel driving circuit in the second sub-pixel 12 on the base substrate 1 at least partially overlaps. For example, the orthographic projection of the anode of the first light-emitting device 41 in the second sub-pixel 12 on the base substrate 1 substantially completely covers the orthographic projection of the occupied region AR1 of the pixel driving circuit in the second sub-pixel 12 on the base substrate 1. For example, the orthographic projection of the anode of the first light-emitting device 41 in the second sub-pixel 12 on the base substrate 1 covers more than 90% of the orthographic projection of the occupied region AR1 of the pixel driving circuit in the second sub-pixel 121 on the base substrate 1.

In the present disclosure, unless otherwise specified, the expression "substantially completely cover" means to cover more than 90% of a total area of a certain orthographic projection.

Referring to FIG. 22C, the orthographic projection of the anode of the first light-emitting device 41 in the third sub-pixel 13 on the base substrate 1 and an orthographic projection of an occupied region AR1 of the pixel driving circuit in the third sub-pixel 13 on the base substrate 1 at least partially overlap. For example, the orthographic projection of the anode of the first light-emitting device 41 in the third sub-pixel 13 on the base substrate 1 covers most of the orthographic projection of the occupied region AR1 of the pixel driving circuit in the third sub-pixel 13 on the base substrate 1. For example, the orthographic projection of the anode of the first light-emitting device 41 in the third sub-pixel 13 on the base substrate 1 covers more than 60% of the orthographic projection of the occupied region AR1 of the pixel driving circuit in the third sub-pixel 13 on the base substrate 1.

In the embodiments of the present disclosure, an area of the orthographic projection of the occupied region AR1 of the pixel driving circuit in the first sub-pixel 11 on the base substrate 1, an area of the orthographic projection of the occupied region AR1 of the pixel driving circuit in the second sub-pixel 12 on the base substrate 1, and an area of the orthographic projection of the occupied region AR1 of the pixel driving circuit in the third sub-pixel 13 on the base substrate 1 may be substantially equal to each other.

In the embodiments of the present disclosure, the area of the orthographic projection of the anode of the first light-emitting device 41 in the third sub-pixel 13 on the base substrate 1 is less than the area of the orthographic projection of the anode of the first light-emitting device 41 in the first sub-pixel 11 on the base substrate 1, and the area of the orthographic projection of the anode of the first light-emitting device 41 in the first sub-pixel 11 on the base substrate 1 is less than the area of the orthographic projection of the anode of the first light-emitting device 41 in the second sub-pixel 12 on the base substrate 1.

For example, the area of the orthographic projection of the anode of the first light-emitting device 41 in the third sub-pixel 13 on the base substrate 1 may be more than 60% the area of the orthographic projection of the occupied region AR1 of the pixel driving circuit in the third sub-pixel 13 on the base substrate 1, the area of the orthographic projection of the anode of the first light-emitting device 41 in the first sub-pixel 11 on the base substrate 1 may be more than 80% of the area of the orthographic projection of the occupied region AR1 of the pixel driving circuit in the first sub-pixel 11 on the base substrate 1, and the area of the orthographic projection of the anode of the first light-emitting device 41 in the second sub-pixel 12 on the base substrate 1 may be more than 90% of the area of the orthographic projection of the occupied region AR1 of the pixel driving circuit in the second sub-pixel 12 on the base substrate 1.

For example, in the first display region AA1, an orthographic projection of an anode of a first light-emitting device 41 in each sub-pixel on the base substrate 1 at least covers an orthographic projection of a storage capacitor Cst (including a first storage capacitor electrode Cst1 and a second storage capacitor electrode Cst2) of a pixel driving circuit in the sub-pixel on the base substrate 1. The orthographic projection of the anode of the first light-emitting device 41 in each sub-pixel on the base substrate 1 at least covers an orthographic projection of a third transistor T3 (including an active layer, a source, a drain and a gate of the third transistor T3) of the pixel driving circuit in the sub-pixel on the base substrate 1.

In the present disclosure, unless otherwise specified, the expression "an orthographic projection of a transistor on a base substrate" includes a combination of orthographic projections of an active layer, a gate, a source and a drain of the transistor on the base substrate.

For example, referring to FIG. 22B, the orthographic projection of the anode of the first light-emitting device 41 in the third sub-pixel 13 on the base substrate 1 covers orthographic projections of the second transistor T2, the third transistor T3, the fourth transistor T4, the fifth transistor T5, the sixth transistor T6, the seventh transistor T7 and the storage capacitor Cst of the pixel driving circuit in the third sub-pixel 13 on the base substrate 1. The orthographic projection of the anode of the first light-emitting device 41 in the third sub-pixel 13 on the base substrate 1 and an orthographic projection of each of the first transistor T1 and the fifth transistor T5 of the pixel driving circuit in the third sub-pixel 13 on the base substrate 1 at least partially overlap.

For example, referring to FIG. 22A, the orthographic projection of the anode of the first light-emitting device 41 in the first sub-pixel 11 on the base substrate 1 covers orthographic projections of the second transistor T2 and the third transistor T3, the fourth transistor T4, the sixth transistor T6, the seventh transistor T7, and the storage capacitor Cst of the pixel driving circuit in the first sub-pixel 11 on the base substrate 1. The orthographic projection of the anode of the first light-emitting device 41 in the first sub-pixel 11 on the base substrate 1 and an orthographic projection of each of the first transistor T1 and the fifth transistor T5 of the pixel driving circuit in the first sub-pixel 11 on the base substrate 1 at least partially overlap.

For example, referring to FIG. 22C, the orthographic projection of the anode of the first light-emitting device 41 in the second sub-pixel 12 on the base substrate 1 covers orthographic projections of the second transistor T2, the third transistor T3, the fourth transistor T4, the sixth transistor T6, and the storage capacitor Cst of the pixel driving circuit in the second sub-pixel 12 on the base substrate 1. The orthographic projection of the anode of the first light-emitting device 41 in the second sub-pixel 12 on the base substrate 1 and an orthographic projection of each of the first transistor T1, the fifth transistor T5, and the seventh transistor T7 of the pixel driving circuit in the second sub-pixel 12 on the base substrate 1 at least partially overlap.

In the embodiments of the present disclosure, through such arrangement, the pixel driving circuit in each sub-pixel may be arranged under each light-emitting device (e.g., the anode), so that the pixel driving circuit may not occupy a light-transmitting region between the sub-pixels, which is conducive to the high light transmittance of first display region, and the high PPI of the first display region may be realized at the same time, that is, it is conducive to the high display quality of the under-screen imaging region.

Figure 26A:
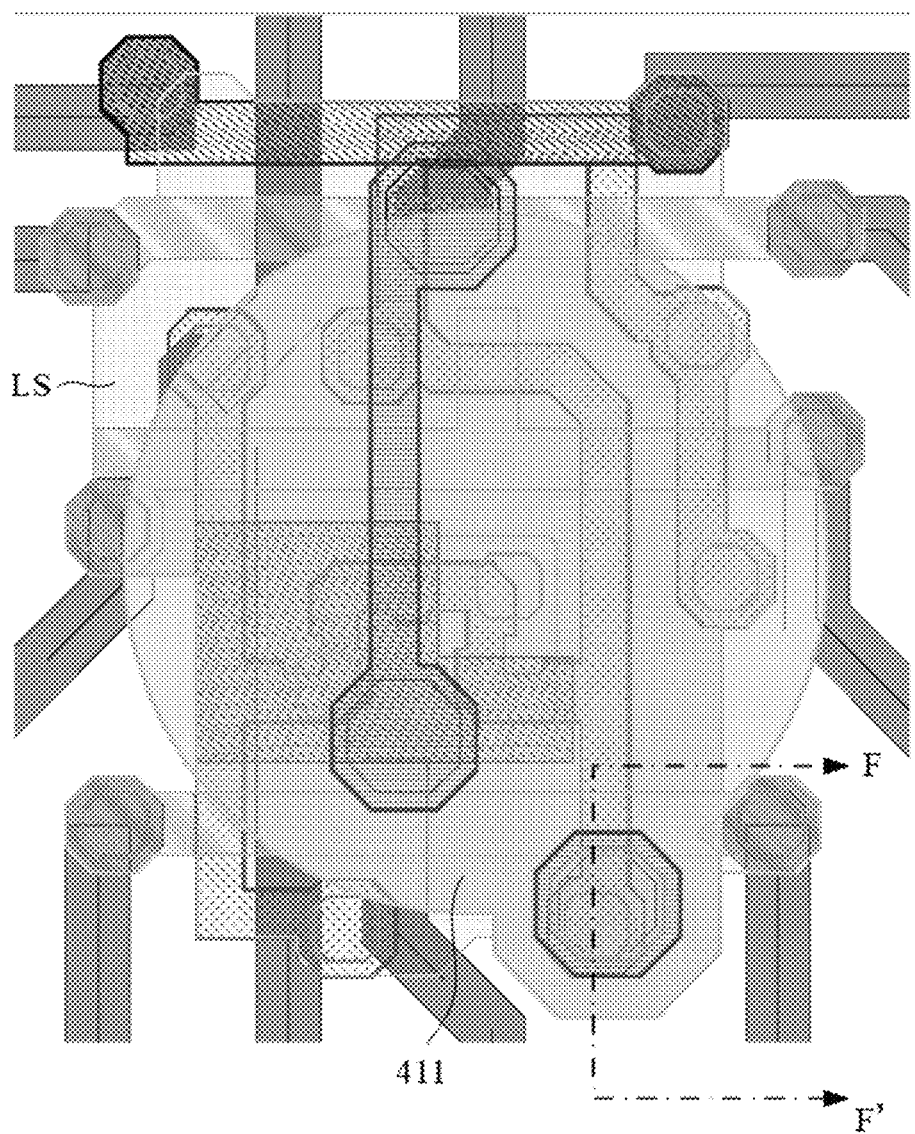
FIGS. 26A, 26B, and 26C respectively show plan views of combinations of a light shielding layer, a semiconductor layer, a first conductive layer, a second conductive layer, a third conductive layer, a first transparent conductive layer, a fourth conductive layer, and a fifth conductive layer of exemplary embodiments of three sub-pixels included in a repeating unit in FIG. 15A, according to some exemplary embodiments of the present disclosure.
Figure 26B:
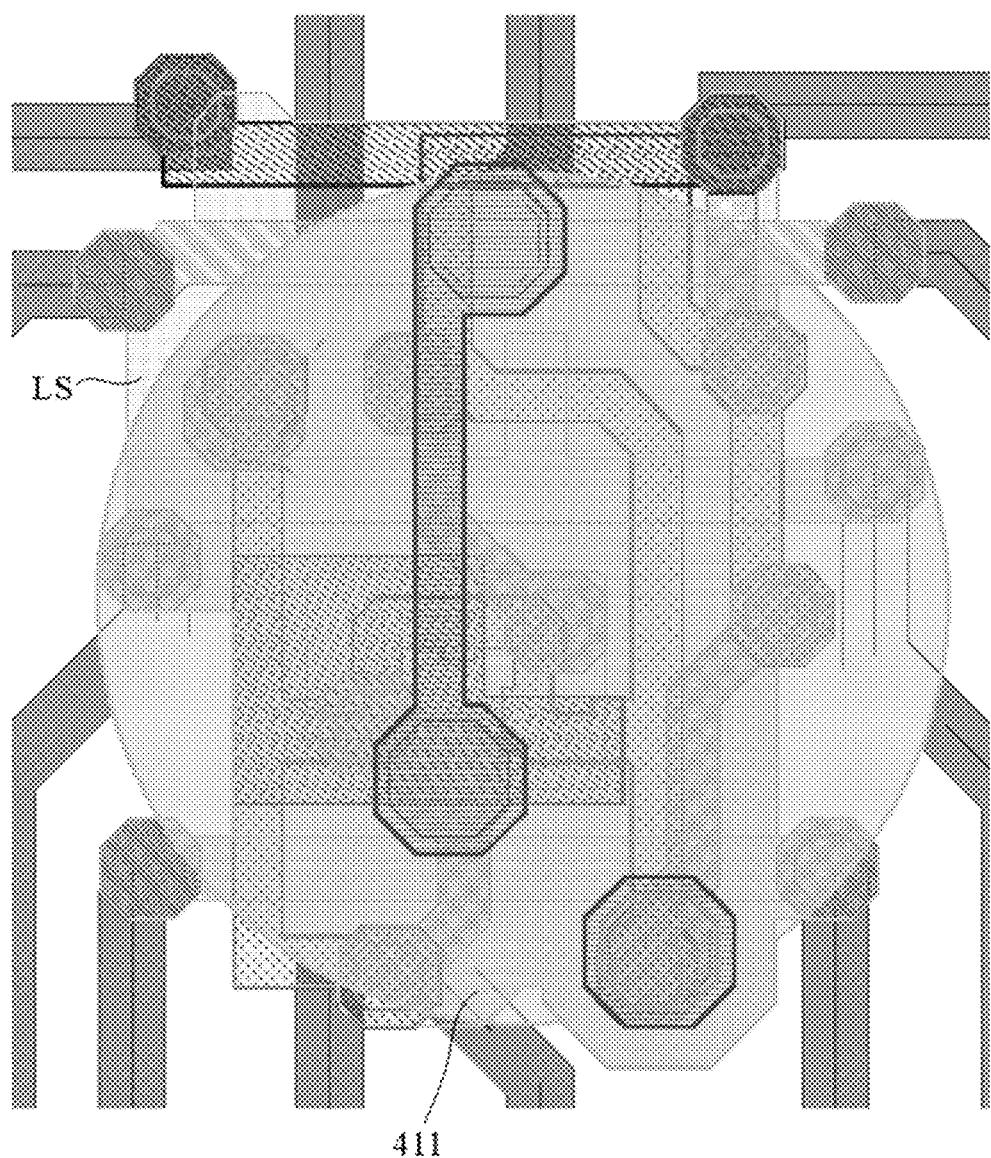
Figure 26C:
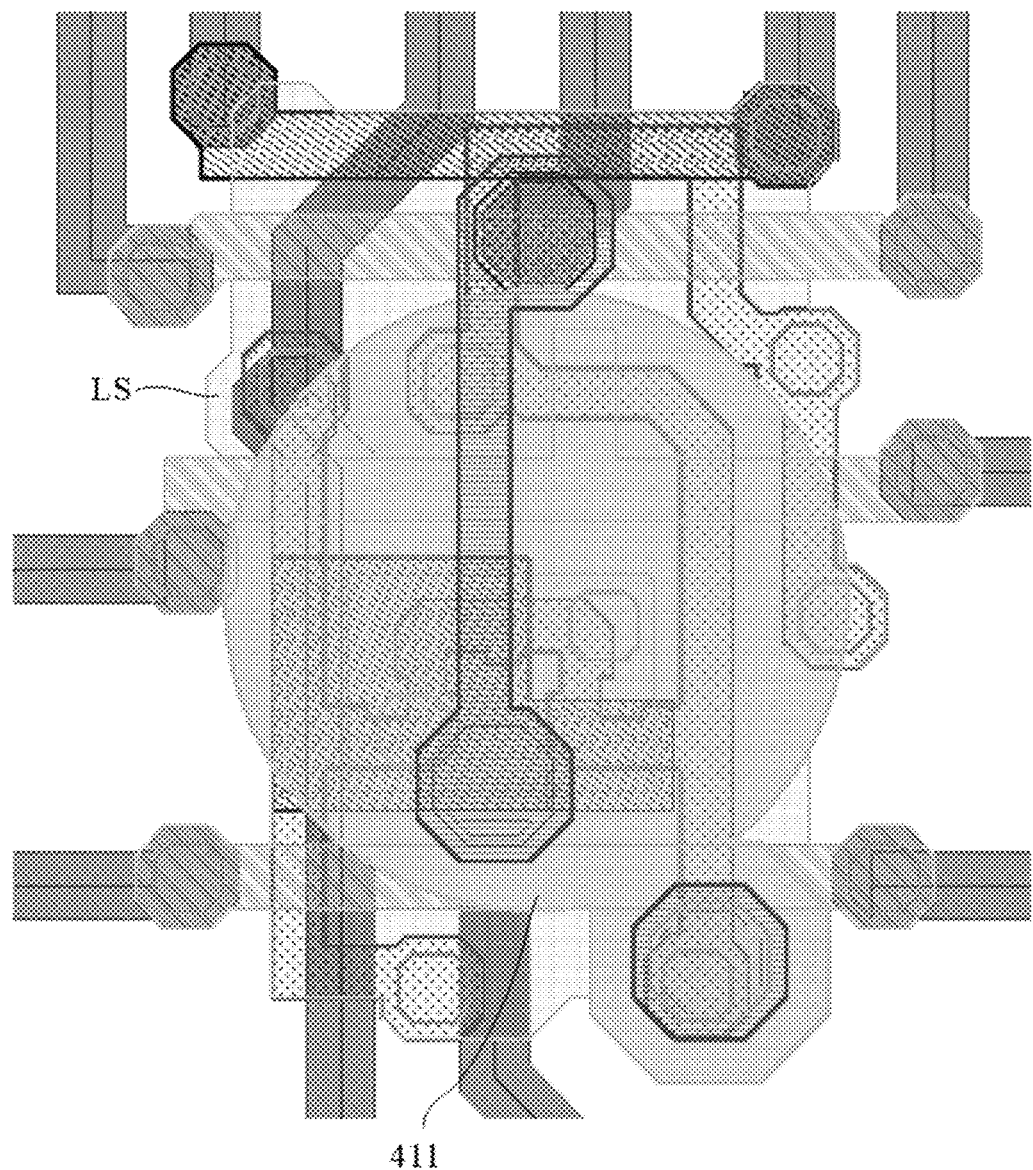
Figure 28:
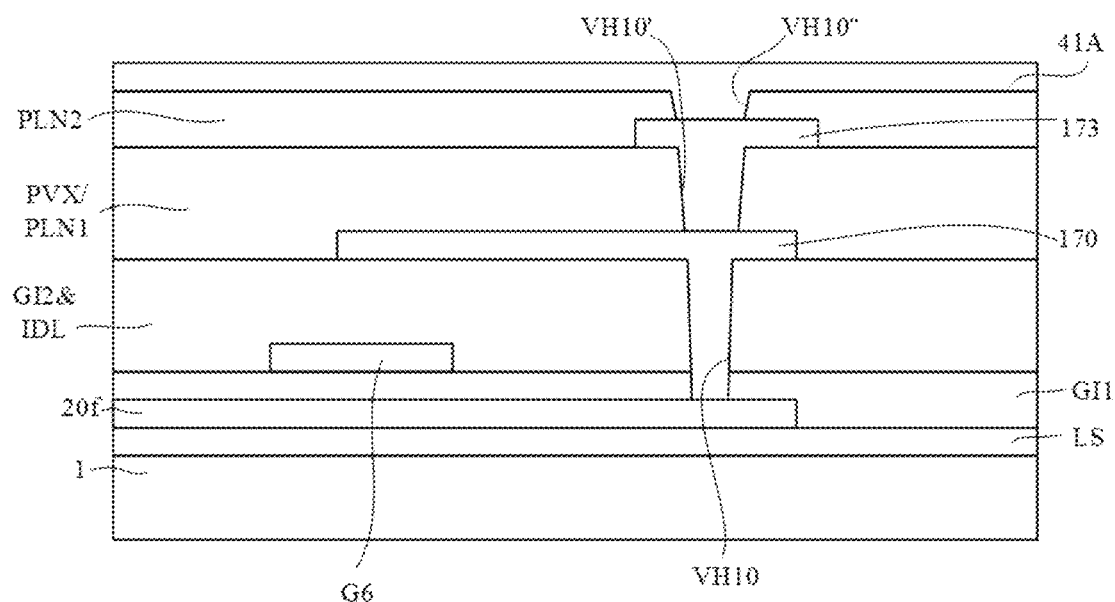
FIG. 28 shows a schematic diagram of a cross-sectional structure of a display substrate taken along a line FF' in FIG. 26A, according to some exemplary embodiments of the present disclosure.

FIGS. 26A, 26B, and 26C respectively show plan views of combinations of a light shielding layer, a semiconductor layer, a first conductive layer, a second conductive layer, a third conductive layer, a transparent conductive layer, a fourth conductive layer, and a fifth conductive layer of exemplary embodiments of three sub-pixels included in a repeating unit in FIG. 15A. FIG. 28 shows a schematic diagram of a cross-sectional structure of a display substrate taken along a line FF' in FIG. 26A, according to some exemplary embodiments of the present disclosure.

Referring to FIGS. 26A to 28, in the embodiments of the present disclosure, the display substrate may further include a light shielding layer LS. The light shielding layer LS may be arranged between the base substrate 1 and the semiconductor layer 20, and for protecting the semiconductor layer 20, so as to prevent the active layer of each transistor of the pixel driving circuit in each sub-pixel from being affected by external light.

For example, the light shielding layer LS may be made of an opaque metal material.

An orthographic projection of the light shielding layer LS for each sub-pixel on the base substrate 1 may cover the orthographic projection of the occupied region AR1 of pixel driving circuit in the sub-pixel on the base substrate 1, that is, the orthographic projection of the light shielding layer LS for each sub-pixel on the base substrate 1 may cover orthographic projections of the first transistor T1, the second transistor T2, the third transistor T3, the fourth transistor T4, the fifth transistor T5, the sixth transistor T6, the seventh transistor T7, and the storage capacitor Cst of the pixel driving circuit in the sub-pixel on the base substrate 1. Through such arrangement, the pixel driving circuit in each sub-pixel may be prevented from being affected by external light.

For example, the light shielding layer LS may access to a fixed voltage to prevent the light shielding layer LS from being in a floating state.

For example, the light shielding layer LS may access to one of the VDD voltage, the initialization voltage Vint, and the VSS voltage. In this case, the light shielding layer LS may be connected in parallel to one of the driving voltage line 65 for transmitting the VDD voltage, the initialization voltage line 66 for transmitting the initialization voltage Vint, and the reference voltage line 67 for transmitting the VSS voltage through at least one via hole. In this way, a resistance of one of the driving voltage line 65, the initialization voltage line 66, and the reference voltage line 67 may be reduced.

In some embodiments, the light shielding layer LS may be in a shape of an isolated island or a grid. For example, a plurality of light shielding layers LS arranged in the first direction X may be electrically connected through a conductive wire extending in the first direction X; and/or, a plurality of shielding layers LS arranged in the second direction Y may be electrically connected through a conductive wire extending in the second direction Y. For example, the conductive wire may be located in the transparent conductive layer, that is, the conductive wire may also include a transparent conductive material such as ITO.

Figure 29:
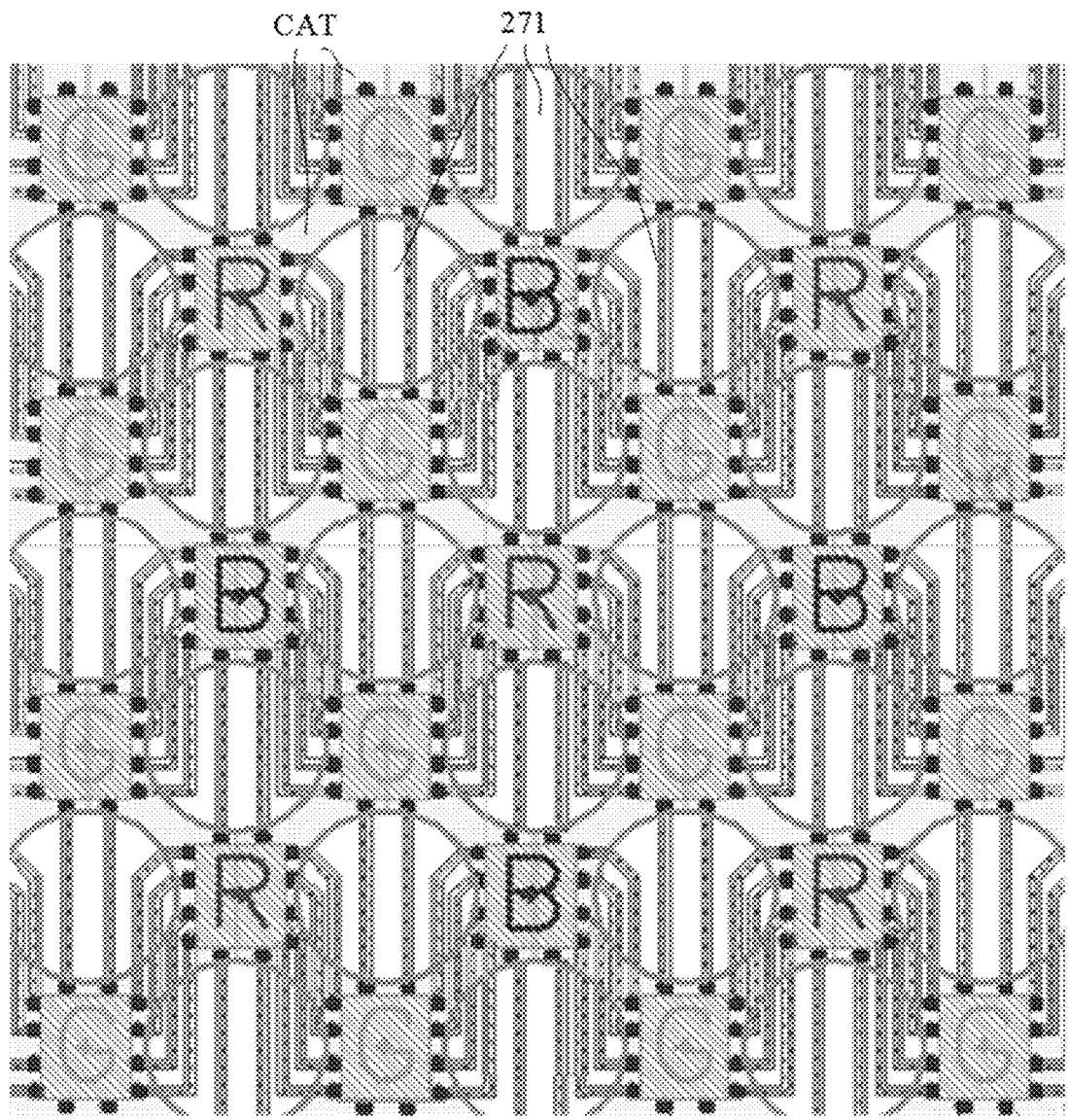
FIG. 29 shows a plan view of a combination of a transparent conductive layer and a sixth conductive layer of an exemplary embodiment of three sub-pixels included in a repeating unit in FIG. 15A.

FIG. 29 shows a plan view of a combination of a transparent conductive layer and a sixth conductive layer of an exemplary embodiment of three sub-pixels included in a repeating unit in FIG. 15A.

As described above, the first light-emitting device 41 may include an anode, a light-emitting material layer, and a cathode that are stacked. The display substrate may include a sixth conductive layer 27, and the cathode CAT is located in the sixth conductive layer 27.

In some embodiments, in the first display region AA1, the sixth conductive layer 27 may be patterned. That is, the sixth conductive layer 27 may include a plurality of cathodes CAT and a plurality of cathode openings 271. A cathode opening 271 may be located between adjacent cathodes CAT.

For example, in the first display region AA1, an orthographic projection of the cathode CAT of the first light-emitting device 41 in each sub-pixel on the base substrate 1 may cover the orthographic projection of the anode of the first light-emitting device 41 in the sub-pixel on the base substrate 1. An orthographic projection of each cathode opening 271 on the base substrate 1 may overlap the orthographic projection of the light-transmitting region TRA between the sub-pixels on the base substrate 1. Through such arrangement, it may be ensured that the light transmittance of the light-transmitting region in the first display region AA1 is relatively high.

Figure 15B:
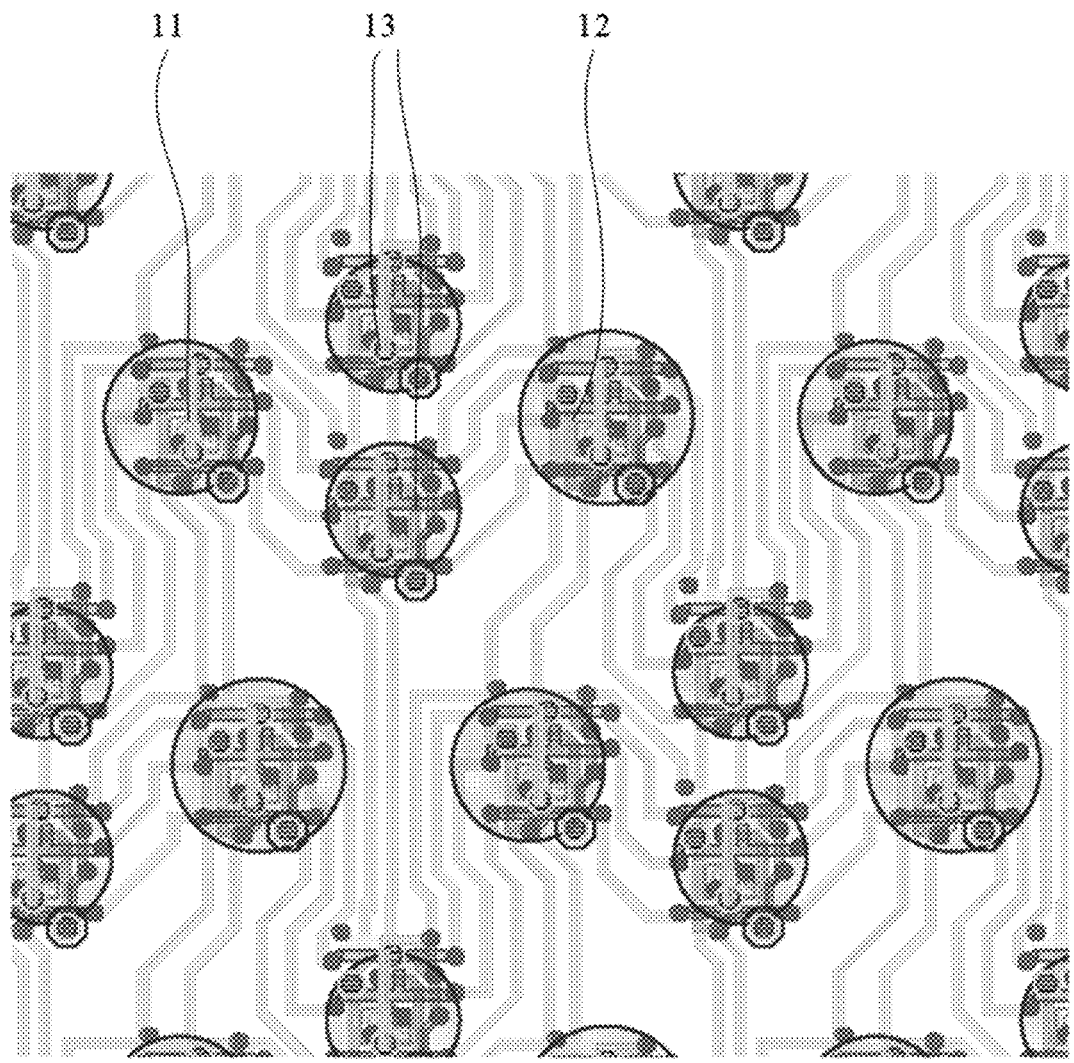
FIG. 15B shows a plan view of an exemplary embodiment of a sub-pixel, in a first display region, of a display substrate according to some other exemplary embodiments of the present disclosure, wherein a plan view of a plurality of repeating units in the first display region is schematically shown.

FIG. 15B shows a plan view of an exemplary embodiment of a sub-pixel in the first display region AA1 of the display substrate, according to some other exemplary embodiments of the present disclosure, in which a plan view of a plurality of repeating units in the first display region AA1 is schematically illustrated. As described above, the embodiments of the present disclosure are not limited to the pixel arrangement shown in FIG. 15A. For example, FIG. 15B shows another pixel arrangement. In the embodiment shown in FIG. 15B, except a different pixel arrangement, other structures may be referred to the above description, which will not be repeated here.

At least some embodiments of the present disclosure further provide a display panel including the display substrate as described above. For example, the display panel may be an OLED display panel.

Referring to FIG. 1, at least some embodiments of the present disclosure further provide a display apparatus. The display apparatus may include the display substrate as described above.

The display apparatus may include any device or product with a display function. For example, the display apparatus may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, an electronic clothing, an electronic bracelet, an electronic necklace, an electronic accessory, an electronic tattoo, or a smart watch), a television, etc.

It should be understood that, the display panel and the display apparatus according to the embodiments of the present disclosure have all the characteristics and advantages of the above-mentioned display substrate. For details, please refer to the above description, which is not repeated here.

Although some embodiments according to a general inventive concept of the present disclosure have been illustrated and described, those skilled in the art will understand that changes may be made to these embodiments without departing from the principle and spirit of the present general inventive concept. The scope of the present disclosure shall be defined by the claims and their equivalents.

What is claimed is:

1. A display substrate, comprising:
a base substrate; and
a plurality of sub-pixels disposed on the base substrate, wherein each sub-pixel comprises a pixel driving circuit, and the pixel driving circuit comprises a writing transistor, a compensation transistor, a first reset transistor, and a storage capacitor,
wherein the display substrate comprises a semiconductor layer, a first conductive layer and a second conductive layer disposed in sequence on the base substrate, wherein a gate of the writing transistor, a gate of the compensation transistor, and a gate of the first reset transistor are located in the first conductive layer and are implemented as a continuous integral structure; an active layer of the writing transistor, an active layer of the compensation transistor and an active layer of the first reset transistor are located in the semiconductor layer; a first storage capacitor electrode of the storage capacitor is located in the first conductive layer, and a second storage capacitor electrode of the storage capacitor is located in the second conductive layer.

2. The display substrate according to claim 1,
wherein the pixel driving circuit further comprises a scanning signal line disposed in the first conductive layer and extending in a first direction, and the scanning signal line is configured to provide a scanning signal; and
wherein the active layer of each of the writing transistor, the compensation transistor, and the first reset transistor comprises a channel region, and a first electrode region and a second electrode region located on two sides of the channel region; the channel region of the writing transistor, the channel region of the compensation transistor and the channel region of the first reset transistor are arranged in sequence along the first direction, and are partially overlap with the scanning signal line respectively, wherein a portion of the scanning signal line overlapping with the channel region of the writing transistor acts as the gate of the writing transistor, a portion of the scanning signal line overlapping with the channel region of the compensation transistor acts as the gate of the compensation transistor, and a portion of the scanning signal line overlapping with the channel region of the first reset transistor acts as the gate of the first reset transistor.

3. The display substrate according to claim 2, wherein the pixel driving circuit further comprises a second reset transistor, the second reset transistor comprises a gate located in the first conductive layer and an active layer located in the semiconductor layer, and an orthographic projection of the active layer of the second reset transistor on the base substrate is located on a side of an orthographic projection of the scanning signal line on the base substrate away from an orthographic projection of the first storage capacitor electrode on the base substrate; and
wherein the active layer of the first reset transistor extends from the active layer of the second reset transistor in a second direction, and the second direction is a direction located in a plane parallel to the base substrate and pointing from the scanning signal line to the first storage capacitor electrode.

4. The display substrate according to claim 3, wherein the second direction is substantially perpendicular to the first direction.

5. The display substrate according to claim 2, wherein the second storage capacitor electrode has a notch such that an orthographic projection of the second storage capacitor electrode on the base substrate is in an "L" shape, and an orthographic projection of a portion of the first storage capacitor electrode on the base substrate is within an orthographic projection of the notch of the second storage capacitor electrode on the base substrate.

6. The display substrate according to claim 5, further comprising a third conductive layer disposed on a side of the second conductive layer away from the base substrate,
wherein the pixel driving circuit further comprises a first connection portion disposed in the third conductive layer; the first storage capacitor electrode is connected to a first end of the first connection portion through a first via hole, and a second end of the first connection portion is connected to the second electrode region of the writing transistor through a second via hole; and
wherein an orthographic projection of the first via hole on the base substrate is located within the orthographic projection of the notch of the second storage capacitor electrode on the base substrate.

7. The display substrate according to claim 5, wherein the second storage capacitor electrode has a first edge, a second edge, a third edge, a fourth edge and a fifth edge connected in sequence, wherein the first edge is substantially parallel to the third edge, the second edge is substantially parallel to the fourth edge, the fifth edge is a folded line, and the first edge and the fourth edge are connected through the fifth edge; the orthographic projection of the notch on the base substrate is defined by an orthographic projection of the fifth edge on the base substrate, an orthographic projection of an extension line of the first edge in a direction away from the second edge on the base substrate, and an orthographic projection of an extension line of the fourth edge in a direction away from the third edge on the base substrate.

8. The display substrate according to claim 7, wherein the fifth edge comprises a first sub-edge and a second sub-edge, the first sub-edge is substantially parallel to the second edge, and the second sub-edge is substantially parallel to the first edge.

9. The display substrate according to claim 1, further comprising a third conductive layer and a fourth conductive layer, wherein the third conductive layer is disposed on a side of the second conductive layer away from the base substrate, and the fourth conductive layer is disposed on a side of the third conductive layer away from the base substrate,
wherein the pixel driving circuit further comprises an initialization voltage line and a first light-emitting control transistor, wherein the initialization voltage line is located in the second conductive layer and extends in a first direction, a gate of the first light-emitting control transistor is located in the first conductive layer, and an active layer of the first light-emitting control transistor is located in the semiconductor layer;
wherein the sub-pixel further comprises a light-emitting device connected with the pixel driving circuit, and the light-emitting device comprises an anode arranged in the fourth conductive layer; and
wherein the anode of the light-emitting device is connected with the active layer of the first light-emitting control transistor through an anode via hole; an orthographic projection of the anode via hole on the base substrate is located on a side of an orthographic projection of the gate of the first reset transistor on the base substrate away from an orthographic projection of the initialization voltage line on the base substrate.

10. The display substrate according to claim 9, further comprising a fifth conductive layer disposed between the third conductive layer and the fourth conductive layer,
wherein the pixel driving circuit further comprises a second connection portion disposed in the third conductive layer; and a conductive connection portion disposed in the fifth conductive layer;
wherein the anode via hole comprises a first sub via hole, a second sub via hole and a third sub via hole, and an orthographic projection of the first sub via hole on the base substrate, an orthographic projection of the second sub via hole on the base substrate, and an orthographic projection of the third sub via hole on the base substrate at least partially overlap; and
wherein the active layer of the first light-emitting control transistor is connected to the second connection portion through the first sub via hole, the second connection portion is connected to the conductive connection portion through the second sub via hole, and the conductive connection portion is connected to the anode through the third sub via hole.

11. The display substrate according to claim 10, wherein the active layer of the first light-emitting control transistor comprises a channel region, and a first electrode region and a second electrode region located on two sides of the channel region of the first light-emitting control transistor;
wherein the second connection portion comprises a main body, a first end, and a second end, the main body of the second connection portion extends in a second direction, and the second direction is substantially perpendicular to the first direction; and
wherein the first end of the second connection portion is connected to the second electrode region of the first light-emitting control transistor through the first sub via hole, and the second end of the second connection portion is connected to the first electrode region of the first reset transistor through a fourth via hole, wherein an orthographic projection of the fourth via hole on the base substrate is between the orthographic projection of the first sub via hole on the base substrate and the orthographic projection of the gate of the first reset transistor on the base substrate.

12. The display substrate according to claim 3, wherein the pixel driving circuit further comprises a reset signal line located in the first conductive layer, wherein the reset signal line is disposed on a side of the scanning signal line away from the first storage capacitor electrode and extends in the first direction; and
wherein the active layer of the second reset transistor comprises a channel region, and a first electrode region and a second electrode region located on two sides of the channel region of the second reset transistor; the channel region of the second reset transistor partially overlaps with the reset signal line, and a portion of the reset signal line overlapping with the channel region of the second reset transistor acts as the gate of the second reset transistor.

13. The display substrate according to claim 9, wherein the pixel driving circuit further comprises a light-emitting control line located in the first conductive layer, and the light-emitting control line is disposed on a side of the first storage capacitor electrode away from the scanning signal line and extends in the first direction; and
wherein the active layer of the first light-emitting control transistor comprises a channel region, and a first electrode region and a second electrode region located on two sides of the channel region of the first light-emitting control transistor; wherein the channel region of the first light-emitting control transistor partially overlaps with the light-emitting control line, and a portion of the light-emitting control line overlapping with the channel region of the first light-emitting control transistor acts as the gate of the first light-emitting control transistor.

14. The display substrate according to claim 1, wherein the pixel driving circuit further comprises a driving transistor, a gate of the driving transistor is located in the first conductive layer, an active layer of the driving transistor is located in the semiconductor layer, and the active layer of the driving transistor comprises a channel region, and a first electrode region and a second electrode region located on two sides of the channel region of the driving transistor; and
wherein the first storage capacitor electrode partially overlaps with the channel region of the driving transistor, and a portion of the first storage capacitor electrode overlapping with the channel region of the driving transistor acts as the gate of the driving transistor.

15. A display panel, comprising the display substrate according to claim 1.

16. A display apparatus, comprising:
the display substrate according to claim 1; and
at least one image sensor,
wherein an orthographic projection of the at least one image sensor on the base substrate falls within an orthographic projection of the plurality of sub-pixels on the base substrate.

* * * * *